United States Patent
Iwamuro

(10) Patent No.: US 9,252,266 B2
(45) Date of Patent: *Feb. 2, 2016

(54) WIDE BAND GAP SEMICONDUCTOR DEVICE AND METHOD FOR PRODUCING THE SAME

(71) Applicant: FUJI ELECTRIC CO., LTD., Kawasaki-ku, Kawasaki-shi (JP)

(72) Inventor: Noriyuki Iwamuro, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 120 days.

This patent is subject to a terminal disclaimer.

(21) Appl. No.: 13/922,740

(22) Filed: Jun. 20, 2013

(65) Prior Publication Data
US 2013/0285072 A1     Oct. 31, 2013

Related U.S. Application Data

(62) Division of application No. 12/426,169, filed on Apr. 17, 2009, now Pat. No. 8,564,028.

(30) Foreign Application Priority Data

Apr. 17, 2008  (JP) .................. 2008-107405

(51) Int. Cl.
*H01L 29/78* (2006.01)
*H01L 29/16* (2006.01)
(Continued)

(52) U.S. Cl.
CPC ........ *H01L 29/7827* (2013.01); *H01L 29/1608* (2013.01); *H01L 29/2003* (2013.01);
(Continued)

(58) Field of Classification Search
CPC ............ H01L 29/7827; H01L 29/1608; H01L 29/7806; H01L 29/7811; H01L 29/7813; H01L 29/7839
See application file for complete search history.

(56) References Cited

U.S. PATENT DOCUMENTS 5,614,749 A   3/1997   Ueno
5,693,569 A   12/1997  Ueno
(Continued)

FOREIGN PATENT DOCUMENTS

JP   63-253720 A   10/1988
JP   08-204179 A   8/1996
(Continued)

OTHER PUBLICATIONS

Partial English translation of Japanese Office Action cited in Japanese counterpart application No. JP2009-045267, dated Aug. 20, 2013.

(Continued)

*Primary Examiner* — Laura Menz
*Assistant Examiner* — Candice Y Chan
(74) *Attorney, Agent, or Firm* — Rossi, Kimms & McDowell LLP

(57) ABSTRACT

A wide band gap semiconductor device is disclosed. A first trench in a gate electrode part and second trench in a source electrode part (Schottky diode) are disposed close to each other, and the second trench is deeper than the first trench. A metal electrode is formed in the second trench to form a Schottky junction on a surface of an n-type drift layer in the bottom of the second trench. Further, a p+-type region is provided in part of the built-in Schottky diode part being in contact with the surface of the n-type drift layer, preferably in the bottom of the second trench. The result is a small wide band gap semiconductor device which is low in on-resistance and loss. Electric field concentration applied on a gate insulating film is relaxed to suppress lowering of withstand voltage and increase avalanche breakdown tolerance at turning-off time.

4 Claims, 41 Drawing Sheets

(51) Int. Cl.
*H01L 29/20* (2006.01)
*H01L 29/66* (2006.01)
*H01L 29/40* (2006.01)
*H01L 29/06* (2006.01)
*H01L 29/417* (2006.01)
*H01L 29/45* (2006.01)
*H01L 29/47* (2006.01)

(52) U.S. Cl.
CPC ........ *H01L29/401* (2013.01); *H01L 29/66068* (2013.01); *H01L 29/66734* (2013.01); *H01L 29/7806* (2013.01); *H01L 29/7811* (2013.01); *H01L 29/7813* (2013.01); *H01L 29/7839* (2013.01); *H01L 29/0623* (2013.01); *H01L 29/0653* (2013.01); *H01L 29/0657* (2013.01); *H01L 29/0661* (2013.01); *H01L 29/0696* (2013.01); *H01L 29/41766* (2013.01); *H01L 29/45* (2013.01); *H01L 29/452* (2013.01); *H01L 29/47* (2013.01); *H01L 29/475* (2013.01)

(56) References Cited

U.S. PATENT DOCUMENTS

| | | | |
|---|---|---|---|
| 5,831,288 | A | 11/1998 | Singh et al. |
| 6,621,107 | B2 | 9/2003 | Blanchard et al. |
| 6,987,103 | B2 | 1/2006 | Blanchard et al. |
| 8,198,676 | B2 * | 6/2012 | Iwamuro ................. 257/330 |
| 2003/0040144 | A1 | 2/2003 | Blanchard et al. |
| 2005/0029585 | A1 | 2/2005 | He et al. |
| 2007/0114602 | A1 | 5/2007 | Saito et al. |
| 2009/0283776 | A1 | 11/2009 | Iwamuro |

FOREIGN PATENT DOCUMENTS

| | | |
|---|---|---|
| JP | 8-204179 A | 8/1996 |
| JP | 9-102602 A | 4/1997 |
| JP | 2001-85612 A | 3/2001 |
| JP | 2005-501408 A | 1/2005 |
| JP | 2005-57291 A | 3/2005 |
| WO | 03/019623 A2 | 3/2003 |

OTHER PUBLICATIONS

Krishna Shenai, et al., "Optimum Semiconductors for High-Power Electronics", IEEE Transactions on Electron Devices, vol. 36, No. 9, Sep. 1989, pp. 1811-1823.

Noriyuki Iwamuro, et al., "Numerical Analysis of Short-Circuit Safe Operating Area for p-Channel and n-Channel IGBT's", IEEE Transactions on Elecgtron Devices, vol. 38, No. 2, Feb. 1991, pp. 303-309.

Arrigo Addamiano, et al., "Ion Implantation Effects of Nitrogen, Boron, and Aluminum in Hexagonal Silicon Carbide", Journal of the Electrochemical Society, Solid-State Science and Technology, vol. 119, No. 10, Oct. 1972, pp. 1355-1362.

V.M. Gusev, et al., "Investigation of the Electroluminescence of α-SiC Crystals Implantation-doped with Boron, Aluminum, and Gallium", Sov. Phys. Semicond., vol. 9, No. 7, Submitted Jul. 14, 1974, pp. 820-822.

Japanese Office Action for corresponding JP2009-045267, mail dated May 27, 2014. Partial English translation provided.

* cited by examiner

WIDE BAND GAP SEMICONDUCTOR DEVICE AND METHOD FOR PRODUCING THE SAME

BACKGROUND OF THE INVENTION

A. Field of the Invention

The present invention relates to a high withstand voltage semiconductor device using a wide band gap semiconductor such as silicon carbide semiconductor (hereinafter abbreviated to as SiC) or gallium nitride semiconductor (hereinafter abbreviated to as GaN) with a wider band gap than the band gap of silicon semiconductor (hereinafter abbreviated to Si), and a method for producing the same.

B. Description of the Related Art

In many cases, Si has been heretofore used as a semiconductor substrate material of a power semiconductor device for controlling a large current while withstanding a high voltage. There are several kinds of Si power semiconductor devices. At present, the several kinds of Si power semiconductor devices are used for various purposes. Bipolar transistors or IGBTs (insulated gate bipolar transistors) are capable of gaining high current density, but unsuited to high-speed switching. For example, the frequency used in bipolar transistors is limited to the order of kHz and the frequency used in IGBTs is limited to the order of tens of kHz. On the other hand, power MOSFETs cannot be subjected to a large current but can be used for high-speed switching up to the order of MHz. There is, however, an increasing market demand for power semiconductor devices satisfying both large current characteristic and high-speed switching characteristic. Efforts have been made to improve IGBTs and power MOSFETs, so that the improvement substantially approaches the physical limit of Si material at present.

On the other hand, there is a discussion about semiconductor substrate materials other than Si because the improvement of Si power semiconductor devices approaches a physical limit of Si as described above. For example, SiC has attracted attention as a substrate material for next-generation power semiconductor devices because SiC has excellent physical properties such as low on-voltage and high-speed and high-temperature characteristic (Shenai, *IEEE Transaction on Electron Devices*, Vol. 36, p. 1811, 1989). SiC is a chemically highly stable material having characteristics such that SiC can be used extremely stably as a semiconductor even at a high temperature because the band gap of SiC is as wide as 3 eV. Moreover, SiC has such characteristics that the maximum electric field intensity of SiC to cause an avalanche breakdown in a semiconductor substrate is larger by at least one digit than that of Si. This characteristic can apply to GaN which is another wide band gap semiconductor material.

As described above, power MOSFETs excellent in high-speed characteristic among representative power semiconductor devices are roughly classified into two groups in terms of structure. That is, there are a planar gate structure MOSFET and a trench gate structure MOSFET.

FIG. 40 is a sectional view showing important part of a general trench gate type MOSFET. N base layer 102 and p base layer 103 are provided on high impurity concentration $n^+$ Si substrate 101 (referred to as "$n^+$ sub." in FIG. 40). Each $n^+$ source region 105 is selectively formed on a front surface of p base layer 103. Trenches 108 are provided to have a depth extending from surfaces of $n^+$ source regions 105 to reach n base layer 102. Each trench 108 is filled with gate electrode 107 through gate insulating film 106-1. Source electrode 109 is provided as a common layer in contact with the surfaces of $n^+$ source regions 105 and with surfaces of $p^+$ contact regions 104 adjacent to $n^+$ source regions 105. Drain electrode 110 having a Ni/Ti/Au laminated film is further provided on the other surface of high impurity concentration $n^+$ Si substrate 101.

FIGS. 37 to 40 are sectional views of important part showing well-ordered illustration of a process for production of the trench gate type MOSFET. As shown in FIG. 37, n base layer 102 and p base layer 103 are formed successively on high impurity concentration $n^+$ Si substrate 101 (referred to as "$n^+$ sub." in FIGS. 37, 38 and 39) by epitaxial growth or impurity diffusion. As shown in FIG. 38, n+ source region 105 and $p^+$ contact region 104 are further formed on a front surface of p base layer 103 by selective ion implantation or the like. As shown in FIG. 39, trenches 108 each having a depth extending from a surface portion of $n^+$ source region 105 to reach n base layer 102 through $n^+$ source region 105 and p base layer 103 are then formed by etching.

Then, gate insulating film 106-1 and a gate electrode film are formed successively on the whole surface of each trench 108. As shown in FIG. 40, the formed gate electrode film is etched and each trench 108 is filled with a gate electrode 107 through the gate insulating film 106-1. Each gate electrode 107 is covered with interlayer insulating film 106-2 so that gate electrodes 107 can be electrically insulated from a source electrode which will be put over gate electrodes 107. Then, a Ni/Ti film provided as a common layer in contact with a surface of $n^+$ source region 105 selectively formed on the front surface of p base layer 103 and with a surface of $p^+$ contact layer 104 formed so as to be adjacent to $n^+$ source region 105 and source electrode 109 made of an Al film laminated on the Ni/Ti film are formed successively by sputtering or the like. Drain electrode 110 having a Ni/Ti/Au film is further formed successively on the other surface of high impurity concentration $n^+$ Si substrate 101 by sputtering etc. In this manner, a process of producing a wafer for the trench gate type MOSFET is completed.

If a wide band gap semiconductor is used in place of Si for forming the trench gate type MOSFET shown in FIG. 40, a high electric field causes a dielectric breakdown of $SiO_2$ film 106-1 on the bottom of each trench 108 before the semiconductor substrate reaches an avalanche breakdown electric field when a high voltage is applied between source 109 and drain 110 of the MOSFET because the maximum electric field intensity of the wide band gap semiconductor material is higher than that of Si. For example, in the case of an SiC trench gate type MOSFET, a production method in which a p-type region (not shown) is provided on the bottom of each trench in the trench gate structure to prevent the gate oxide film from being subjected to an electric field larger than the allowable electric field is known as a method to avoid the dielectric breakdown (*IEEE Transaction on Electron Devices*, Vol. 38, p. 303, 1991).

FIG. 41 is a circuit diagram showing a three-phase inverter IGBT module which is a typical power semiconductor module. In the IGBT module made of this circuit, Si IGBT chips, Si free-wheeling diodes (FWDs), etc. are placed between main current-applied terminals P, N, U, V and W on a common metal substrate so as to be arranged and wired as illustrated in the circuit of FIG. 41. In such an IGBT module, an upper arm device gate drive circuit and a lower arm device gate drive circuit are connected to each IGBT. These drive circuits are connected to a control circuit while electrically insulated by photo couplers respectively. Generally, each gate drive circuit includes a forward bias source and a backward bias source. That is, one lower arm power source and three upper arm power sources, i.e., four power sources in total, are required for driving the IGBT module forming the three-phase inverter circuit shown in FIG. 41. Consequently, the circuit configuration is complicated and the apparatus size is enlarged, so that the cost increases. This is caused by the fact that n-channel IGBTs all equal in polarity are used as IGBTs mounted in the IGBT module. A complementary IGBT module having n-channel IGBTs and p-channel IGBTs reverse in polarity to the n-channel IGBTs is known as the structure of an IGBT module to reduce the cost of the expensive IGBT module structure (JP-A-63-253720 and 2001-85612).

FIG. 42 is a circuit diagram showing a three-phase inverter IGBT module using the complementary IGBT module. In FIG. 42, p-channel IGBTs are disposed in lower arms and n-channel IGBTs are disposed in upper arms while FWDs are disposed in reverse parallel with the IGBTs respectively in the same manner as in FIG. 41. In the circuit configuration of the complementary IGBT module, the number of gate drive power sources can be reduced from four to three, so that reduction in apparatus size and reduction in cost can be expected. Although it is necessary to set a dead time of the order of μsec at turning-on/off timing in the circuit shown in FIG. 41 to avoid short-circuiting caused by simultaneous on-states of the upper and lower arms, the dead time can be reduced in the case of the complementary IGBT module. Consequently, there is a merit that distortion in output waveform can be reduced. However, the complementary IGBT module has not been put into practice currently. The reason is that the complementary IGBT module is so low in avalanche breakdown tolerance that there arises a problem that the bipolar operation of the p-channel IGBTs leads to device breakdown theoretically soon (*IEEE Transaction on Electron Devices*, Vol. 38, p. 303, 1991).

Therefore, if unipolar power MOSFETs are used as switching devices in place of the IGBTs, the problem that device breakdown occurs theoretically easily can be solved. However, such a complementary MOSFET module has not been available on the market yet because MOSFETs have a disadvantage of being apt to be very high in on-resistance compared with the IGBTs so that the loss produced in the MOSFETs is large.

If SiC trench gate type MOSFETs (hereinafter abbreviated as trench MOSFETs) are used to form the aforementioned inverter circuit, it is further necessary to connect diodes (FWDs) in reverse parallel with the SiC trench MOSFETs. Therefore, for example, in the case of a general Si MOSFET, for reduction in size a built-in PIN diode including p base layer 103, n base layer 102 and n⁺ substrate 101 as shown in FIG. 40 may be used as an FWD. In this case, there is, however, a problem that switching loss still increases because the reverse recovery time of the built-in PIN diode is delayed by implantation of minority carriers even when the built-in PIN diode is electrically connected as the FWD. It has been known that the problem of increase in loss at the reverse recovery time can be avoided when a Schottky barrier diode of a unipolar operation is formed as the built-in diode in place of the PIN diode. See, for example, FIG. 1 of JP-A-2005-57291 (Corresponding to US 2005029585), JP-A-8-204179 (Corresponding to U.S. Pat. No. 5,614,749), U.S. Pat. No. 5,693,569, U.S. Pat. No. 5,614,749, and JP-A-9-102602.

It is, however, very difficult to produce a low-resistance low-defect-density p-type semiconductor substrate from a wide band gap semiconductor, especially from SiC or GaN. For example, in the existing situation, the resistivity of the p-type semiconductor substrate produced from SiC is more than ten times as high as that of the n-type semiconductor substrate and the defect density of the p-type semiconductor substrate produced from SiC is higher by at least one digit than that of the n-type semiconductor substrate. For this reason, there arises a problem that on-resistance cannot be reduced sufficiently because the potential drop in the p-type semiconductor substrate is large even when the p-type semiconductor substrate is used for forming a p-channel MOSFET.

Because it is highly likely that SiC or GaN will overcome the physical limit of Si, the extension of SiC or GaN for power semiconductor purposes, especially, MOSFET purposes, is expected to increase greatly in the future. If a p-channel MOSFET can be produced from SiC or GaN, a high withstand voltage complementary module which could not be achieved when Si IGBTs were used can be expected because a complementary MOSFET module can be formed when p-channel MOSFETs are used in combination with n-channel MOSFETs produced from SiC or GaN.

On the other hand, the SiC trench MOSFET has a problem that a very difficult and time-consuming process is required for accurately forming an electric field relaxing p-type region described in *IEEE Transaction on Electron Devices*, 38:303, (1991), in the bottom of the trench of the trench gate having a fine pattern structure (Addamiano et al., *Journal of the Electrochemical Society,* 11 (9):1355 (1972) or Gusev et al., *Sov. Phys. Semicond.,* 9:820 (1976)).

Further, when the electric field relaxing p-type region is formed, a storage layer for turning the MOSFET on is lost. Consequently, there is a problem that increase of on-resistance cannot be avoided. Accordingly, there is a demand for an MOSFET having a structure in which dielectric breakdown of the gate oxide film can be prevented from being caused by the high electric field intensity and long-term reliability can be kept without provision of the p-type region in the bottom of the trench of the trench gate.

There is another problem that loss increases at the time of current conduction and reverse recovery of current conduction of the PIN diode built in the trench MOSFET made of a wide band gap semiconductor as described above even when the breakdown of the gate insulating film can be prevented from being caused by the high electric field intensity. It is therefore necessary to improve this aspect.

That is, in the SiC trench MOSFET, the diffusion potential difference between p base layer 103 and n base layer 102 in FIG. 40 is large. For example, when the MOSFET is made of SiC, the diffusion potential difference is about 2.7 V. For this reason, the on-voltage of the built-in PIN diode (p base layer 103/n base layer 102/n⁺ substrate 101) in the SiC MOSFET is very high compared with the typical on-voltage 1.6-2.0 V of the built-in PIN diode of the Si MOSFET. The loss incurred in the SiC MOSFET in an on-state is large. There arises a further problem that switching loss increases because the reverse recovery time of the built-in PIN diode is delayed by implantation of minority carriers even when a current flows in the built-in PIN diode. It already has been known that the problem about increase of loss at the time of reverse recovery can be avoided when a Schottky barrier diode having a unipolar operation is formed as the built-in diode as described above. That is, the Schottky barrier diode can reduce power loss because on-resistance in the wide band gap semiconductor such as SiC or GaN can be reduced and a low reverse recovery loss and a sufficient peak inverse voltage can be kept due to the unipolar device. There is further known a structure in which the formation of the Schottky barrier diode is optimized to give an effect to the aforementioned trench gate structure in reducing the electric field intensity applied on the oxide film in the bottom of the trench. It is, however, impossible to form a selective p-type region or the like by ion implantation as controllably as in Si in the case of the wide band gap semiconductor MOSFET such as SiC or GaN. For this reason, it is very difficult to arrange an n base layer which is selectively arranged on the device surface in the active region and which needs to form Schottky barrier contact in its surface. Consequently, it cannot be said practically that it is easy to build a Schottky barrier diode in the active region of the wide band gap semiconductor MOSFET, differently from Si.

The present invention is directed to overcoming or at least reducing the effects of one or more of the problems set forth above.

SUMMARY OF THE INVENTION

The invention provides a wide band gap semiconductor device which is small in size and low in on-resistance and loss and in which electric field concentration applied on a gate insulating film is relaxed to suppress lowering of withstand voltage to thereby increase avalanche breakdown tolerance at turning-off time.

According to a first aspect of the invention, there is provided a wide band gap semiconductor device including: a first conductivity type semiconductor substrate having a high impurity concentration; a first conductivity type drift layer having a lower impurity concentration than the semiconductor substrate and formed on one principal surface of the semiconductor substrate; a second conductivity type base layer having a higher impurity concentration than the drift layer and formed on the drift layer; and a first conductivity type source region selectively disposed on a principal surface of the base layer; a first trench having a depth extending from a principal surface of the source region to reach the drift layer; a control electrode which is filled through a gate insulating film, in the first trench so as to be located in positions facing the source region, the base layer and the drift layer; a second trench provided near the first trench and having a depth extending from the principal surface of the base layer to reach the drift layer so as to be deeper than the first trench; a first main electrode which is disposed in the second trench to form a Schottky junction between the first main electrode and a surface of the drift layer located in the second trench so that the first main electrode covers the principal surface of the source region and the principal surface of the base layer in common; and a second main electrode which is disposed on the other principal surface of the first conductivity type semiconductor substrate.

According to a second aspect of the invention, there is provided a wide band gap semiconductor device according to the first aspect, further including a second conductivity type region being in contact with a bottom of the second trench.

According to a third aspect of the invention, there is provided a wide band gap semiconductor device according to the first or second aspect, wherein the distance between central lines of the first and second trenches is not longer than 10 μm.

According to a fourth aspect of the invention, there is provided a wide band gap semiconductor device according to the first or second aspect, wherein the second trench has a circular pattern so that a surface pattern of the first trench is surrounded by a surface of the second trench.

According to a fifth aspect of the invention, there is provided a wide band gap semiconductor device according to the first or second aspect, further including: an active region at least having the first trench; a peripheral voltage withstanding structure portion which surrounds the active region and which has circular third trenches each of which is filled with an insulating film; and metal electrodes which are disposed on a surface of the second conductivity type base layer so as to be located between the third trenches.

According to a sixth aspect of the invention, there is provided a wide band gap semiconductor device according to the third aspect, wherein the wide band gap semiconductor device uses SiC as a main semiconductor material.

According to a seventh aspect of the invention, there is provided a wide band gap semiconductor device according to the third aspect, wherein the wide band gap semiconductor device uses GaN as a main semiconductor material.

To achieve the foregoing object, according to an eighth aspect of the invention, there is provided a wide band gap semiconductor device including: an Si substrate; a first conductivity type GaN layer having a high impurity concentration and disposed through a crystal structure conversion buffer layer, on one principal surface of the Si substrate; a first conductivity type GaN drift layer having a low impurity concentration and disposed on the first conductivity type GaN layer; a second conductivity type GaN base layer disposed on the drift layer; a first conductivity type GaN source region selectively disposed on a principal surface of the base layer; a first trench having a depth extending from a principal surface of the source region to reach the drift layer; a control electrode which is filled through a gate insulating film, in the first trench so as to be located in positions facing the source region, the base layer and the drift layer; a second trench provided near the first trench and having a depth extending from the principal surface of the base layer to reach the drift layer so as to be deeper than the first trench; a first main electrode which is disposed in the second trench to form a Schottky junction between the first main electrode and a surface of the drift layer located in the second trench so that the first main electrode covers the principal surface of the source region and the principal surface of the base layer in common; third trenches each of which has a depth extending from the other principal surface of the Si substrate to pierce the Si substrate and the buffer layer and reach the first conductivity type GaN layer having the high impurity concentration; and a second main electrode which is electrically connected to inner surfaces of the third trenches and the other principal surface of the Si substrate.

According to a ninth aspect of the invention, there is provided a wide band gap semiconductor device according to the eighth aspect, further including a second conductivity type region being in contact with a bottom of the second trench.

According to a tenth aspect of the invention, there is provided a wide band gap semiconductor device according to the eighth or ninth aspect, wherein the distance between central lines of the first and second trenches is not longer than 10 μm.

To achieve the foregoing object, according to an eleventh aspect of the invention, there is provided a wide band gap semiconductor device including: an SiC substrate; a second conductivity type SiC layer having a high impurity concentration and disposed on one principal surface of the semiconductor substrate; a second conductivity type SiC drift layer having a low impurity concentration and disposed on the second conductivity type SiC layer; a first conductivity type SiC base layer disposed on the drift layer; a second conductivity type SiC source region selectively disposed on a principal surface of the base layer; a first trench having a depth extending from a principal surface of the source region to reach the drift layer; a control electrode which is filled through a gate insulating film, in the first trench so as to be located in positions facing the source region, the base layer and the drift layer; a second trench provided near the first trench and having a depth extending from the principal surface of the base layer to reach the drift layer so as to be deeper than the first trench; a first main electrode which is disposed in the second trench to form a Schottky junction between the first main electrode and a surface of the drift layer located in the second trench so that the first main electrode covers the principal surface of the source region and the principal surface of the base layer in common; and a second main electrode which is disposed on the other principal surface of the SiC substrate.

According to a twelfth aspect of the invention, there is provided a wide band gap semiconductor device according to the eleventh aspect, further including a first conductivity type region being in contact with a bottom of the second trench.

According to a thirteenth aspect of the invention, there is provided a wide band gap semiconductor device according to the eleventh or twelfth aspect, wherein the distance between central lines of the first and second trenches is not longer than 10 µm.

According to a fourteenth aspect of the invention, there is provided a wide band gap semiconductor device including: an SiC substrate; a second conductivity type SiC layer having a high impurity concentration and disposed on one principal surface of the semiconductor substrate; a second conductivity type SiC drift layer having a low impurity concentration and disposed on the second conductivity type SiC layer; a first conductivity type SiC base layer disposed on the drift layer; a second conductivity type SiC source region selectively disposed on a principal surface of the base layer; a first trench having a depth extending from a principal surface of the source region to reach the drift layer; a control electrode which is filled through a gate insulating film, in the first trench so as to be located in positions facing the source region, the base layer and the drift layer; a second trench provided near the first trench and having a depth extending from the principal surface of the base layer to reach the drift layer so as to be deeper than the first trench; a first main electrode which is disposed in the second trench to form a Schottky junction between the first main electrode and a surface of the drift layer located in the second trench so that the first main electrode covers the principal surface of the source region and the principal surface of the base layer in common; third trenches each of which has a depth extending from the other principal surface of the SiC substrate to reach the second conductivity type SiC layer having the high impurity concentration; and a second main electrode which is electrically connected to inner surfaces of the third trenches and the other principal surface of the SiC substrate.

According to a fifteenth aspect of the invention, there is provided a wide band gap semiconductor device according to the fourteenth aspect, further including a first conductivity type region being in contact with a bottom of the second trench.

According to a sixteenth aspect of the invention, there is provided a wide band gap semiconductor device according to the fourteenth or fifteenth aspect, wherein the distance between central lines of the first and second trenches is not longer than 10 µm.

According to a seventeenth aspect of the invention, there is provided a method of producing a wide band gap semiconductor device as defined in any one of the eighth to tenth aspects and the fourteenth to sixteenth aspects, including the steps of: grinding the other principal surface of the semiconductor substrate to provide the semiconductor substrate as a thin layer before forming the second main electrode; forming the third trenches on the other principal surface of the ground semiconductor substrate; and forming the second main electrode.

According to the invention, trenches are formed both in a Schottky barrier diode part and in a gate electrode part so that the trenches are close to each other, and the trench (second trench) in the Schottky barrier diode part is formed so as to be deeper than the trench (first trench) in the gate electrode part. Moreover, a metal electrode is formed in the second trench in the Schottky barrier diode part so that the metal electrode comes into Schottky contact with the surface of the n base layer exposed in the bottom of the second trench. In this manner, in a trench MOSFET using a wide band gap semiconductor, a low on-resistance can be provided and a built-in Schottky barrier diode having a short reverse recovery time can be formed easily. Moreover, a p-type region is formed in part of the second trench of the built-in Schottky barrier diode part being in contact with the surface of the n base layer, preferably in the bottom of the second trench so that avalanche breakdown tolerance at turning-off time can be improved greatly. According to these configurations, the size of the wide band gap semiconductor device can be reduced and low loss and high breakdown tolerance can be achieved. In addition, electric field intensity on the bottom of the first trench in the gate electrode part is relaxed remarkably, so that the load on the gate oxide film can be reduced to provide a trench MOSFET excellent in long-term reliability.

According to the invention, it is possible to provide a wide band gap semiconductor device in which: dielectric breakdown of a gate insulating film is prevented; high long-term reliability is obtained; it is easy to form a built-in Schottky barrier diode; the size of the semiconductor device is reduced; low on-resistance and low loss are obtained; electric field concentration applied on the gate insulating film is relaxed to suppress lowering of withstand voltage to thereby increase avalanche breakdown tolerance at turning-off time; and a peripheral high voltage withstanding structure is provided.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

A vertical/trench type insulated gate MOS semiconductor device according to the invention and a method for producing the semiconductor device will be described below in detail with reference to the drawings. The invention is not limited to the following description of embodiments without departing from the gist of the invention.

Embodiment 1

Figure 1:
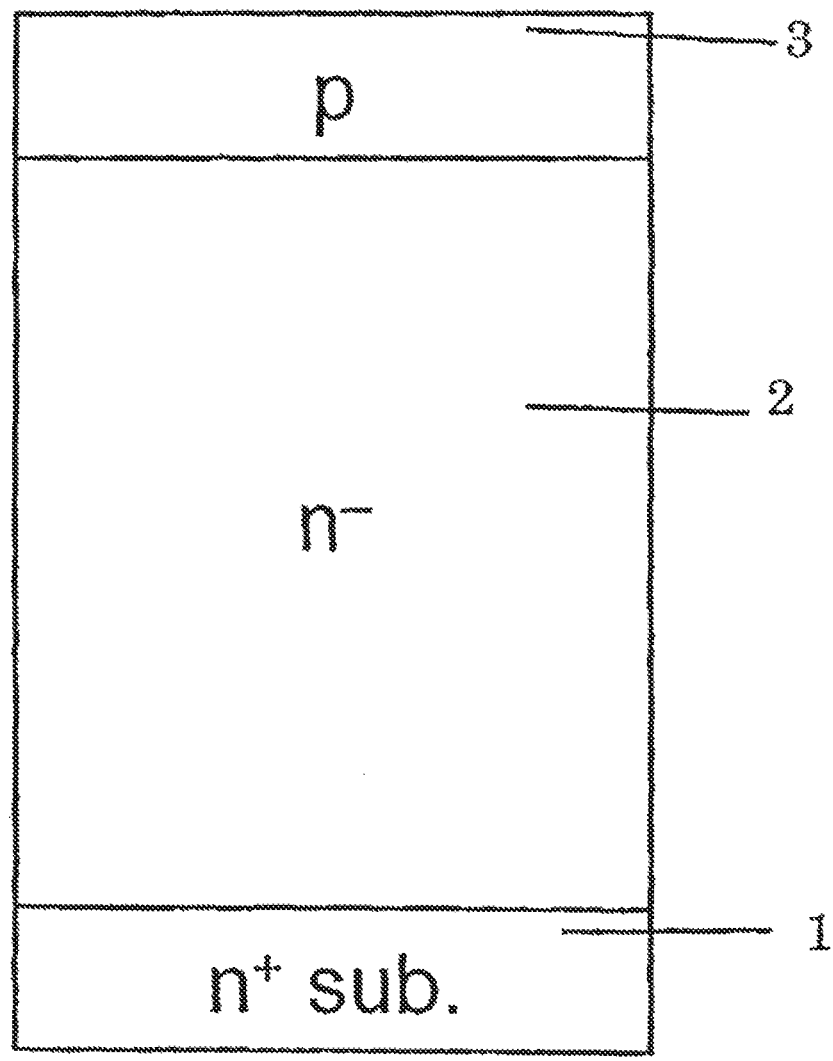
FIG. 1 is a sectional view (Part 1) showing a process of producing an SiC trench MOSFET according to Embodiment 1 of the invention.

Embodiment 1 of the invention will be described below with reference to FIGS. 1 to 5. In Embodiment 1, a trench MOSFET which exhibits a withstand voltage of 1200 V and which has an active region located in the center so that a main current flows in the active region, and a peripheral voltage withstanding structure region disposed to surround the active region is provided as a vertical trench gate MOS power semiconductor device. First, n-type SiC substrate 1 (referred to as "n$^+$ sub." in FIGS. 1 to 5) with a sufficiently high impurity concentration is prepared. In this embodiment, the SiC substrate contains about $2\times10^{18}$ cm$^{-3}$ of nitrogen as an impurity. N-type SiC drift layer 2 containing about $1.0\times10^{16}$ cm$^{-3}$ of nitrogen and p-type SiC base layer 3 containing about $2.1\times10^{17}$ cm$^{-3}$ of aluminum are epitaxially grown on SiC substrate 1 so that the thicknesses of layers 2 and 3 are about 10 µm and 2.5 µm respectively (FIG. 1). Incidentally, FIG. 1 shows neither the actual thicknesses of the layers nor the ratio of the layer thicknesses accurately, that is, particularly FIG. 1 shows the case where the thickness of SiC substrate 1 is smaller than the actual thickness thereof. This rule applies to the other drawings. The SiC substrate on which a semiconductor functional layer or functional region has been provided will be hereinafter referred to as "wafer" for the sake of convenience.

Figure 2:
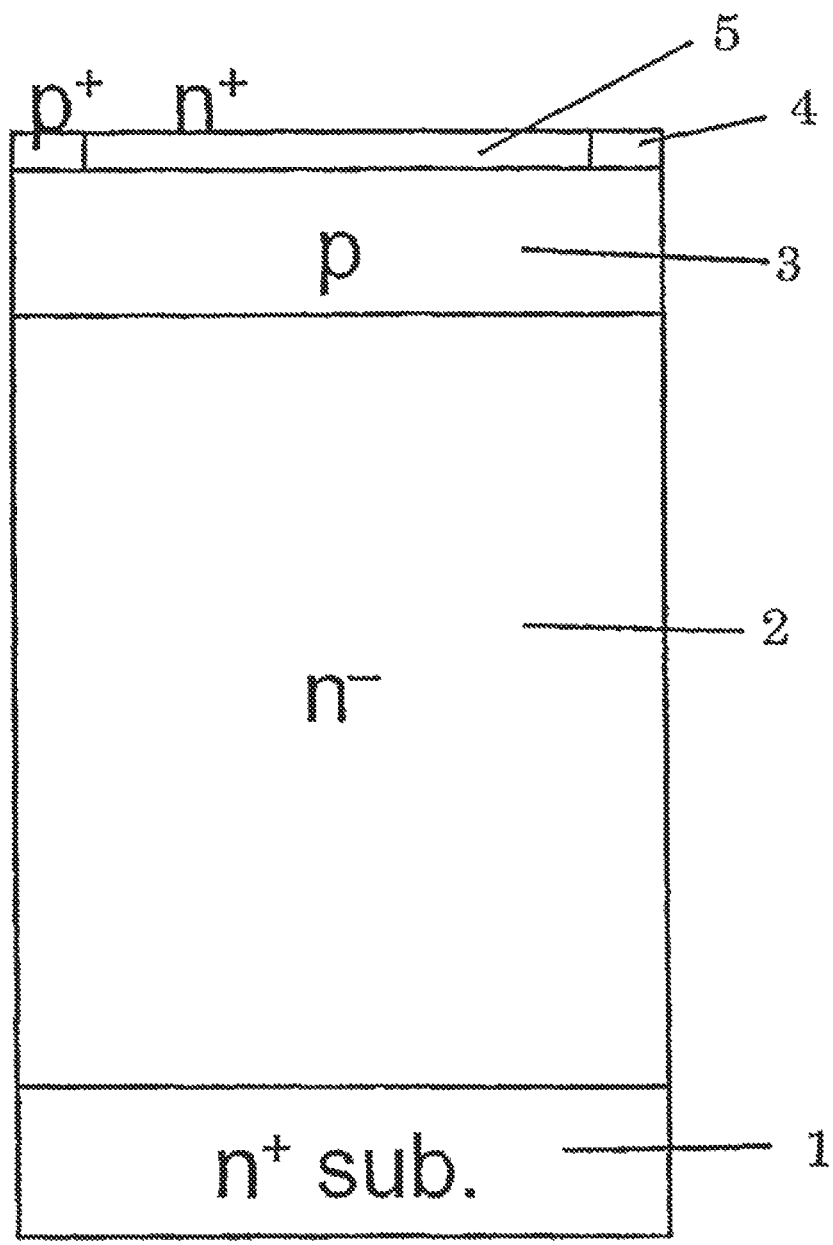
FIG. 2 is a sectional view (Part 2) showing a process of producing an SiC trench MOSFET according to Embodiment 1 of the invention.

P$^+$ contact region 4 and n$^+$ source region 5 are formed by ion implantation and activation heat treatment, respectively, on a wafer surface in the active region in which a main current will flow. P$^+$ contact region 4 uses aluminum as a doping element whereas n+ source region 5 uses phosphorus as a doping element. The temperature and time for the activation heat treatment are 1700° C. and 1 minute (FIG. 2).

Figure 3:
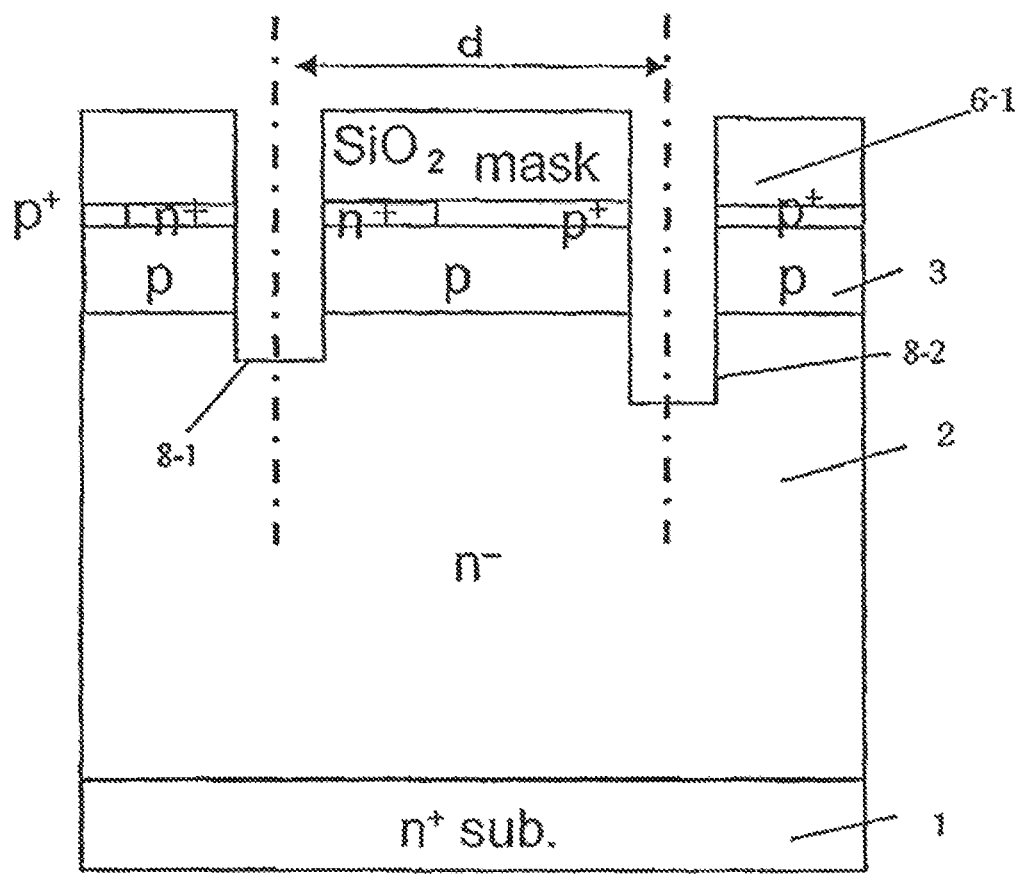
FIG. 3 is a sectional view (Part 3) showing a process of producing an SiC trench MOSFET according to Embodiment 1 of the invention.
Figure 5:
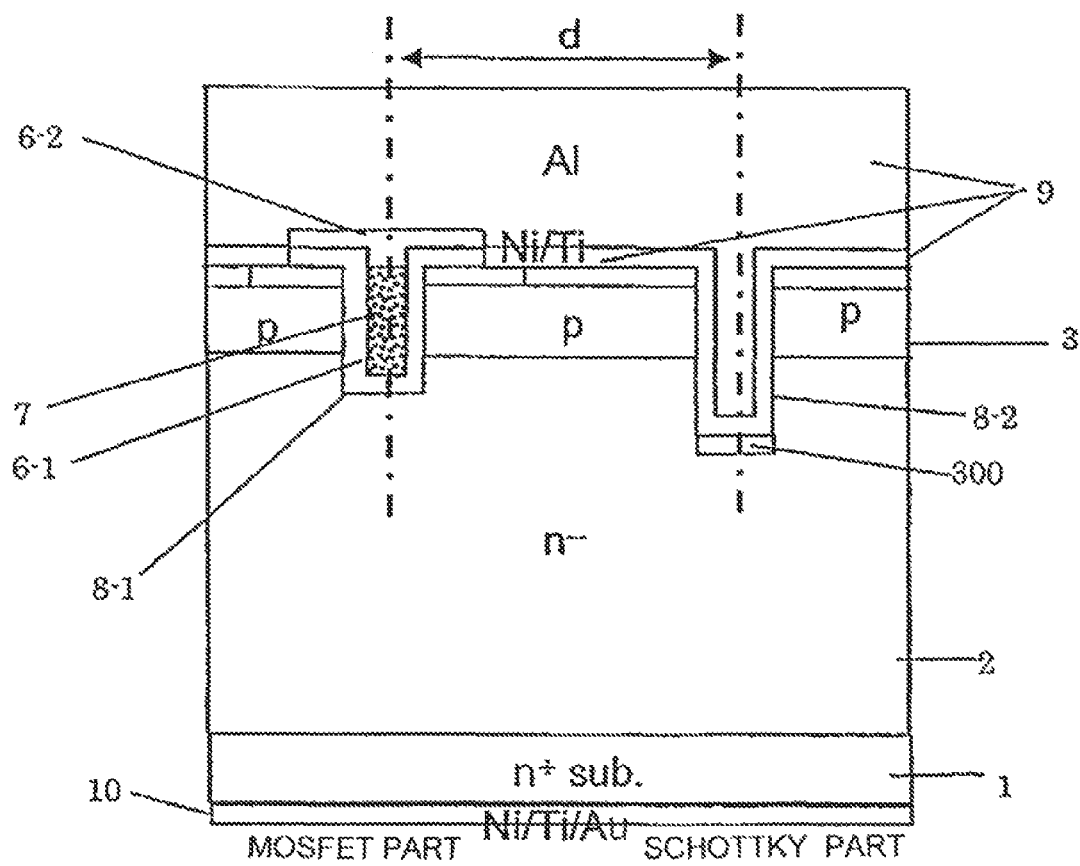
FIG. 5 is a sectional view of the SiC trench MOSFET according to Embodiment 1 of the invention.

Then, as shown in FIG. 3, a 1.6 μm-thick silicon oxide film (hereinafter referred to as "oxide film") 6-1 is grown on the surface of the wafer and subjected to photolithography and etching to form an oxide film mask having 1.0 μm-wide opening portions disposed at intervals of d=7.6 μm. After the formation of the oxide film mask, trench 8-1 having depth piercing p-type SiC base layer 3 (2.5 μm thick) to reach n-type SiC drift layer 2 is formed by trench etching such as an RIE method. On this occasion, the thickness of trench 8-1 is set at 3 μm. Because two kinds of different trenches are formed on the front surface side of the wafer in Embodiment 1, the trench provided on a gate electrode side and the trench provided on a Schottky barrier diode part side will be referred to as "gate trench 8-1" and "Schottky trench 8-2," respectively, for the sake of convenience to discriminate between the two kinds of different trenches. Then, a sacrificial oxide film is formed in the inside of gate trench 8-1 and then removed to thereby flatten the inner surface of the trench. Then, as shown in FIG. 5, in the gate electrode part, after the growth of a 100 nm-thick gate oxide film 6-1, gate electrode 7 made of polysilicon or the like is embedded in gate trench 8-1 and interlayer insulating film 6-2 is further formed so that a surface of gate electrode 7 is covered with interlayer insulating film 6-2 to electrically insulate gate electrode 7 from source electrode 9.

Figure 4:
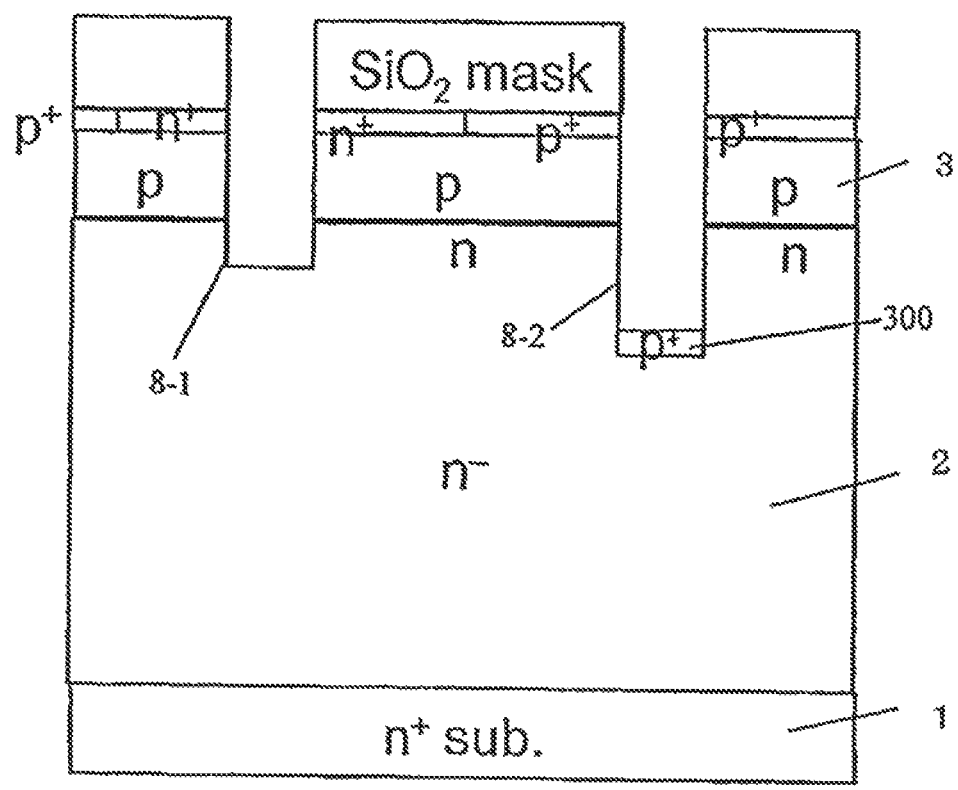
FIG. 4 is a sectional view (Part 4) showing a process of producing an SiC trench MOSFET according to Embodiment 1 of the invention.

Referring back to FIG. 3, in the Schottky barrier diode part, trench 8-2 is formed by the same process as described above. As described above, the trench on the Schottky barrier diode part side is referred to as "Schottky trench 8-2." On this occasion, the width of the Schottky trench 8-2 is set at 1.0 μm and the depth of the Schottky trench 8-2 is set at 5 μm so that the Schottky trench 8-2 is 2 μm deeper than gate trench 8-1. The distance between gate trench 8-1 and Schottky trench 8-2 is set at d=3.8 μm in terms of distance between respective central lines of the trenches (FIGS. 3 and 5). After the formation of the 5 μm-deep Schottky trench 8-2, an oxide film is formed again. After patterning, aluminum ions are implanted in each opening portion of the oxide film on the bottom of the Schottky trench 8-2 and subjected to heat treatment at 1700° C. for 1 minute to thereby form p+-type region 300 on the bottom of Schottky trench 8-2 to improve avalanche breakdown tolerance (FIG. 4).

After removal of the oxide film, nickel and titanium are laminated successively on the inside of Schottky trench 8-2 and the device surface by sputtering and aluminum is successively laminated thereon by sputtering to thereby form source electrode 9 and an anode electrode of a Schottky barrier diode. Source electrode 9 and the anode electrode of the Schottky barrier diode are formed of a common electrode film. Then, drain electrode 10 made of titanium, nickel and gold is formed on the rear surface of SiC substrate 1 (FIG. 5). Source electrode 9 is brought into Schottky contact with a surface of n base layer 2 on the bottom of Schottky trench 8-2 so that source electrode 9 serves also as an anode electrode of a built-in Schottky barrier diode. Thus, the trench MOSFET is completed.

Figure 6:
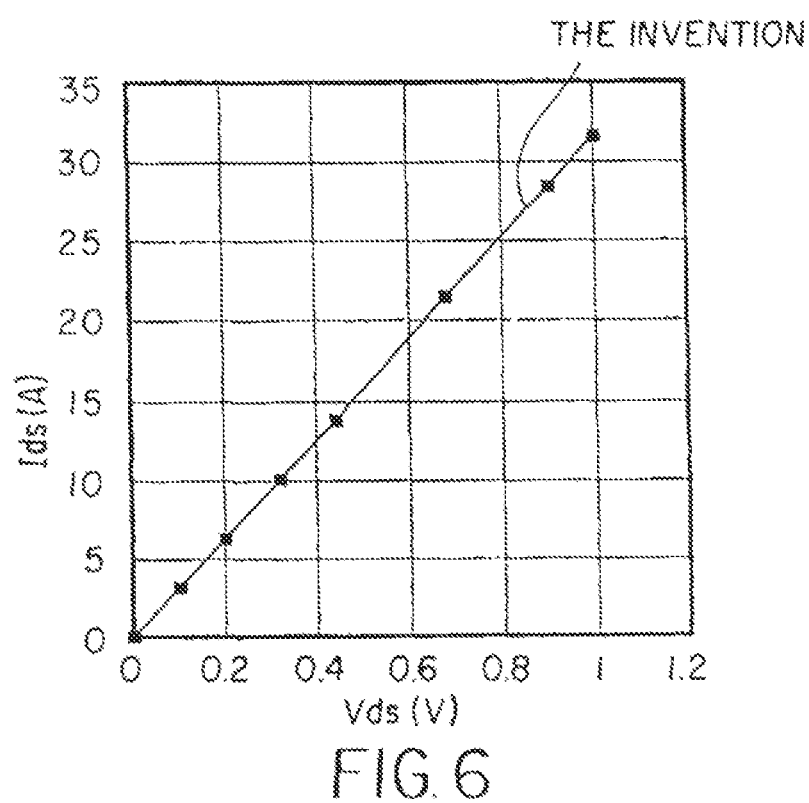
FIG. 6 is a characteristic graph of on-resistance of the SiC trench MOSFET according to Embodiment 1 of the invention.

FIG. 6 is a current-voltage characteristic graph showing a measured result of electric characteristic of the SiC trench MOSFET in an on-state. The chip size is 3 mm square, the active area is 7.85 mm$^2$ and the rating current is 10 A. On-resistance (RonA) is 2.50 mΩcm$^2$ which is a sufficiently low value. Though not shown, the initial withstand voltage of the device is 1250 V which is sufficiently good characteristic for the 1200 V device. When a conventional art-type trench MOSFET having no deep Schottky trench 8-2 but a shallower Schottky trench than the gate trench in source electrode 9 was formed for the sake of comparison and the withstand voltage of the conventional art-type trench MOSFET was measured, the device withstand voltage was 610 V. When a point of breakdown of the background art-type trench MOSFET was observed, it was confirmed that the breakdown point was in the bottom of the gate trench. It is conceived from this viewpoint that voltage withstanding characteristic can be kept stably because the electric field concentration in the bottom of gate trench 8-1 can be relaxed when Schottky trench 8-2 is formed so as to be deeper than gate trench 8-1.

When forward and backward current-voltage (I-V) characteristics of the built-in Schottky barrier diode were measured, good characteristics almost equal to those of an Si PIN diode were obtained. For example, the on-voltage of the built-in Schottky barrier diode at 10 A current conduction was 1.65 V (room temperature), which was a low value almost equal to 1.62 V (room temperature) of the Si PIN diode (not shown). When the reverse recovery characteristic of the built-in Schottky barrier diode was measured to be compared with the reverse recovery characteristic of the Si PIN diode with the same rating voltage and current, the reverse recovery time of the built-in Schottky barrier diode was very much shorter than the reverse recovery time of the Si PIN diode. Low loss characteristic was obtained so that the loss incurred in the built-in Schottky barrier diode according to the invention was about one tenth as large as the loss in the Si PIN diode.

Then, electric characteristics were evaluated while the depth of Schottky trench 8-2 was changed under a common condition that the depth of Schottky trench 8-2 was larger than the thickness of p-type SiC base layer 3. Specifically, SiC trench MOSFETs of the six types having Schottky trench depths of 2.7 μm, 2.85 μm, 3 μm, 4 μm, 5 μm and 5.5 μm relative to the depth 2.5 μm of p-type SiC base layer 3 were formed and characteristics of the SiC trench MOSFETs were examined. Incidentally, the distance d (μm) between respective central lines of the trenches in the gate electrode part and the Schottky barrier diode part was kept at a constant value of 3.8 μm. Consequently, as shown in Table 1, it was found that the device withstand voltage exhibited 1200 V or higher under the condition that the depth of the Schottky trench was not smaller than 3 μm, inclusive of the case where no trench was formed in the Schottky barrier diode part (as represented by trench depth 0).

TABLE 1

| Trench Depth (μm) | Withstand Voltage (V) |
| --- | --- |
| 0 | 610 |
| 2.70 | 1088 |
| 2.85 | 1105 |
| 3.00 | 1210 |
| 4.00 | 1233 |
| 5.00 | 1250 |
| 5.50 | 1259 |

That is, it is found that the Schottky trench needs to have a trench depth not smaller than the depth (3 μm) of the gate trench in order to avoid dielectric breakdown caused by the electric field concentration without provision of any electric field relaxing p-type region in the bottom of the trench of the gate electrode. Then, trench MOSFETs in each of which the distance d (μm) between the Schottky trench and the gate trench was changed were produced by way of trial and change of electric characteristics on this occasion was evaluated. On this occasion, the depth of the Schottky trench was set at 5 μm and the depth of the gate trench was set at 3 µm. Consequently, as shown in Table 2, it is found that the initial withstand voltage of the device decreases as the trench distance d (µm) increases.

TABLE 2

| Trench Distance d (µm) | Initial Withstand Voltage (V) | Withstand Voltage (V) After High-Temperature Application Test |
| --- | --- | --- |
| 2.0 | 1258 | 1256 |
| 3.0 | 1255 | 1254 |
| 5.0 | 1250 | 1251 |
| 7.0 | 1240 | 1232 |
| 9.0 | 1231 | 1225 |
| 10.0 | 1218 | 1214 |
| 12.0 | 1207 | 35 |
| 15.0 | 1201 | 25 |
| 19.0 | 1185 | 20 |
| 21.0 | 1180 | 20 |

This is because as the trench distance d (µm) becomes longer, a so-called pinch-off effect of a depletion layer is weakened so that the electric field concentration in the bottom of the gate trench increases when a high voltage is applied between the source and the drain. Similarly to the result shown in Table 1, electric field intensity in the bottom of the gate trench increases so that dielectric breakdown of the gate oxide film occurs easily.

MOSFET devices produced under the condition that the withstand voltage was 1200 V or higher were subjected to a high-temperature application test. This evaluation is a long-term reliability evaluation in which the withstand voltage of the device is evaluated after a voltage of 1200 V is continuously applied between the source and the drain for 3000 hours under the condition of 125° C. Consequently, under the condition that the trench distance d (µm) was 12 µm or 15 µm, the initial withstand voltage was 1200 V or higher but the withstand voltage after the high-temperature application test was considerably lower than 1200 V. As a result of examination of a point of breakdown of the device, it was confirmed that the oxide film in the bottom of the gate trench was broken down. It is found from this respect that sufficient voltage withstanding characteristic can be kept in consideration of not only initial withstand voltage but also long-term reliability if the trench distance d (µm) is not larger than 10 µm.

Figure 36:
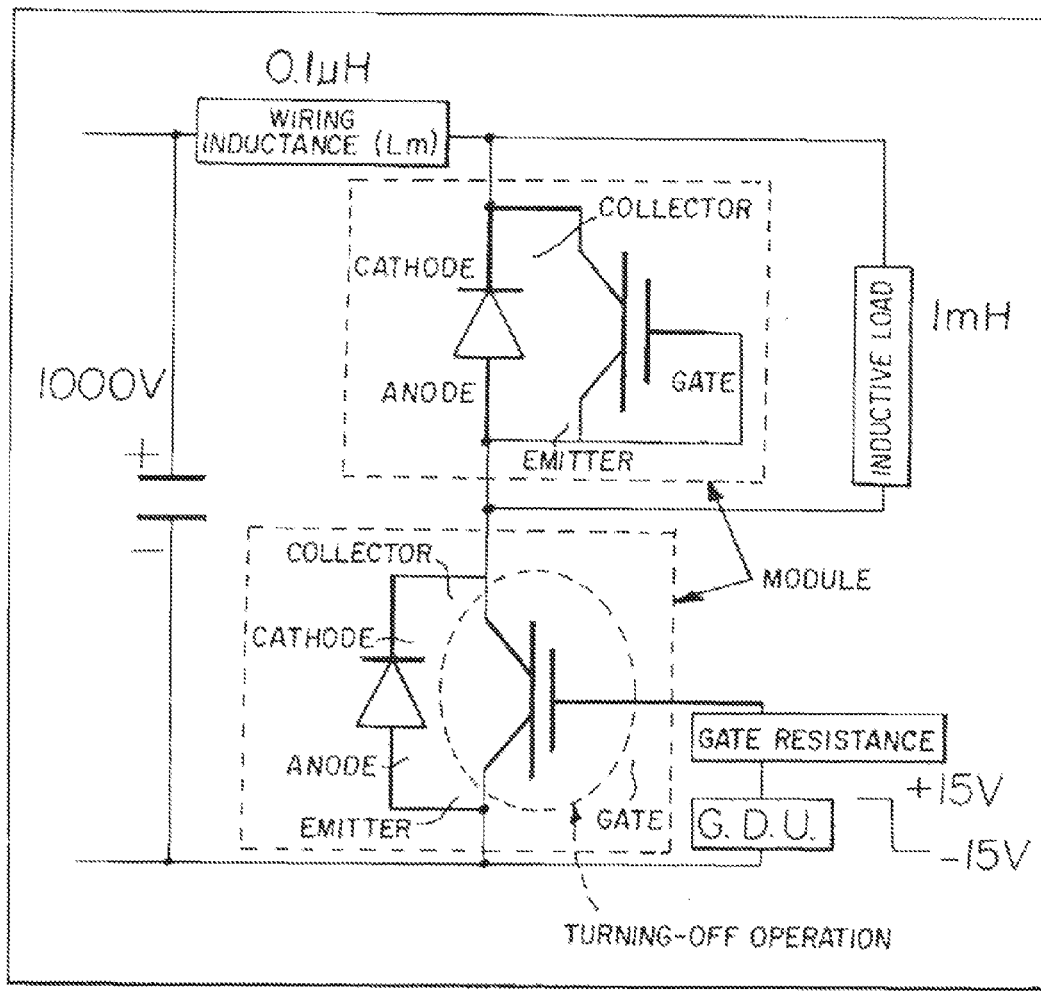
FIG. 36 is a diagram of a circuit for measuring turn-off breakdown tolerance according to an embodiment of the invention.
Figure 37:
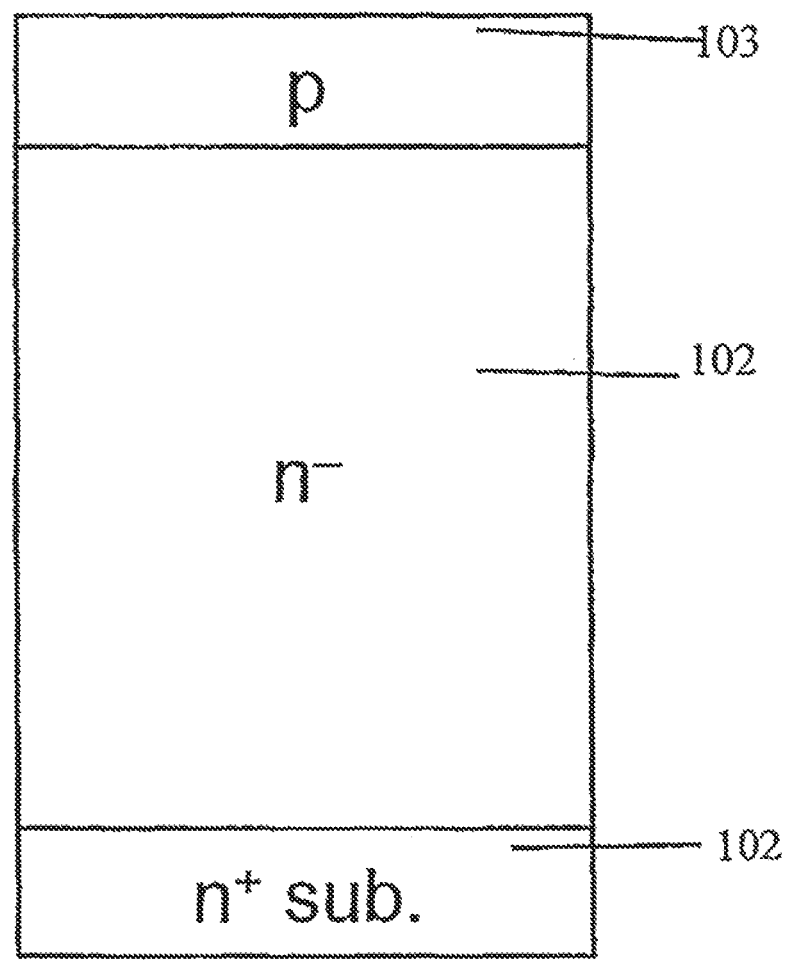
FIG. 37 is a sectional view (Part 1) showing a process of producing an Si trench gate MOSFET according to the background art.
Figure 38:
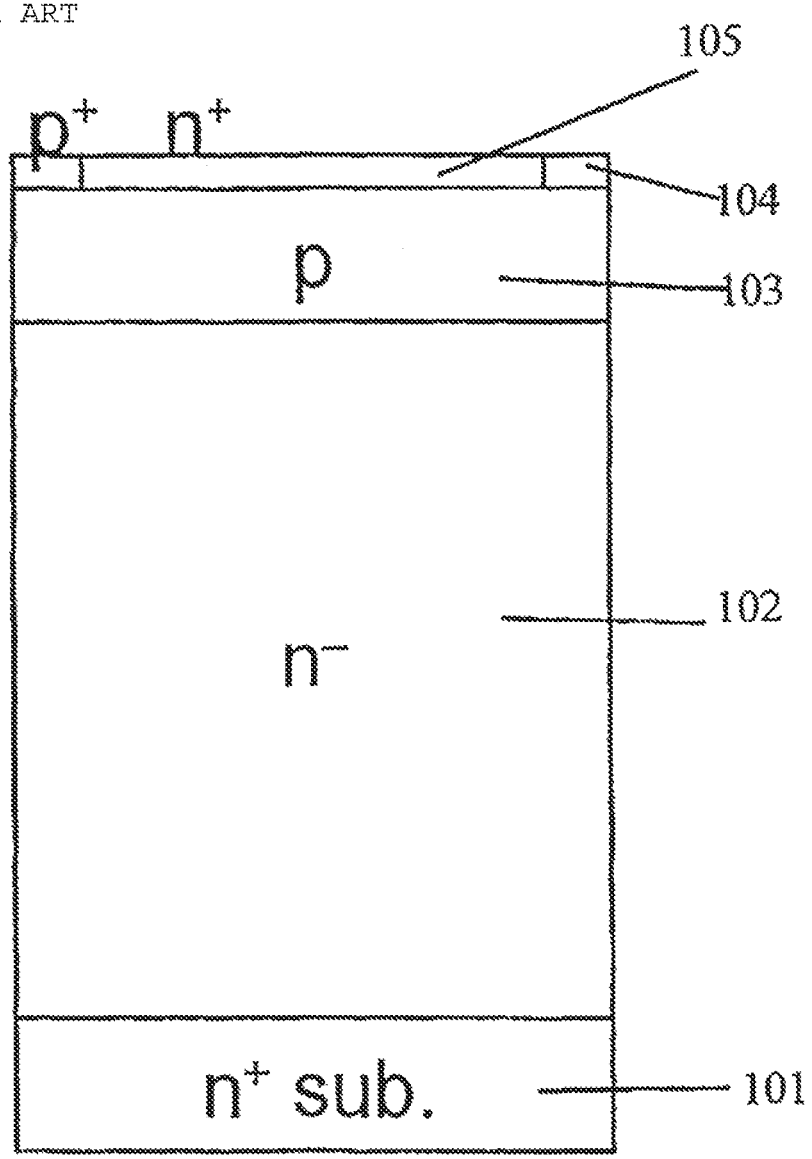
FIG. 38 is a sectional view (Part 2) showing a process of producing an Si trench gate MOSFET according to the background art.
Figure 39:
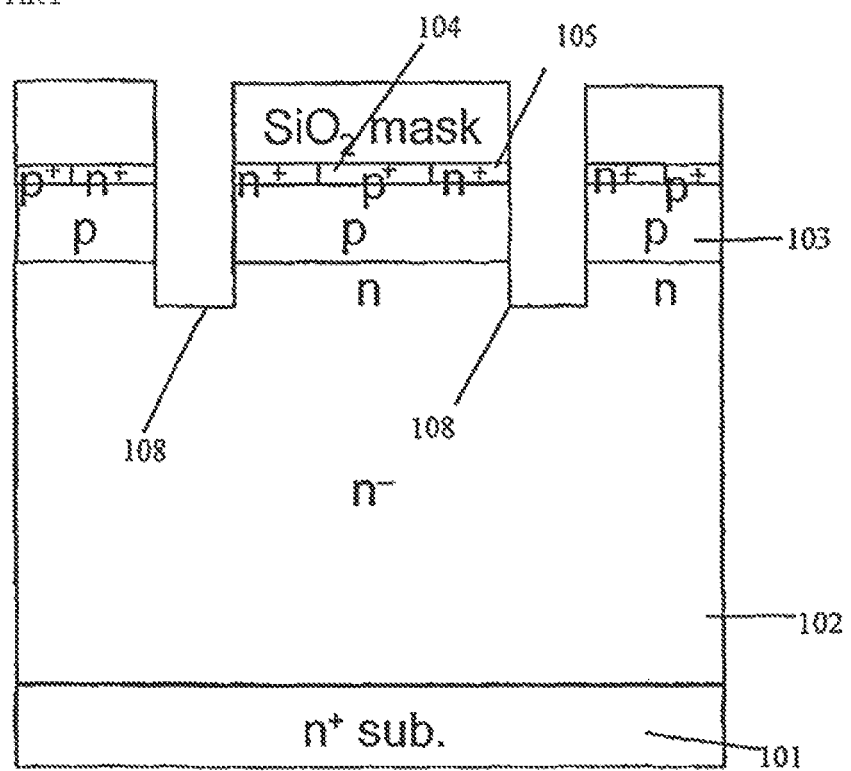
FIG. 39 is a sectional view (Part 3) showing a process of producing an Si trench gate MOSFET according to the background art.

Then, trench MOSFET devices produced under the common condition that the trench distance d (µm) was 3.8 µm were subjected to a turn-off breakdown tolerance test. Incidentally, the depths of the gate trench and the Schottky trench are 3 µm and 5 µm respectively. The breakdown tolerance test was performed by an L load circuit shown in FIG. 36. Evaluation was made at Vcc=1000 V and at room temperature. Consequently, it was confirmed that turning-off could be made without breakdown of the trench MOSFET device at 40 A which was four times as much as the rating current. It was found that the formation of the electric field relaxing $p^+$-type region 300 in the bottom of the Schottky trench contributed to greater improvement of breakdown tolerance compared with a result of breakdown at 25 A which was 2.5 times as much as the rating current when the electric field relaxing $p^+$-type region 300 was not formed. Accordingly, it is preferable that electric field relaxing $p^+$-type region 300 is formed in the bottom of the Schottky trench. It is considerably easy to form electric field relaxing $p^+$-type region 300 in the bottom of the Schottky trench compared with the formation of an electric field relaxing $p^+$-type region in the bottom of the gate trench because more or less positional displacement of electric field relaxing $p^+$-type region 300 can be allowed. In Embodiment 1 of the invention, the $p^+$-type region is not formed in the bottom of the gate trench but the $p^+$-type region is preferably formed in the bottom of the Schottky trench.

Incidentally, trench MOSFETs using gallium nitride (GaN) as a wide band gap semiconductor material were produced by way of trial and subjected to this test. Consequently, it was confirmed that the same voltage withstanding characteristic, breakdown tolerance and long-term reliability characteristic as those of SiC were obtained.

Figure 7:
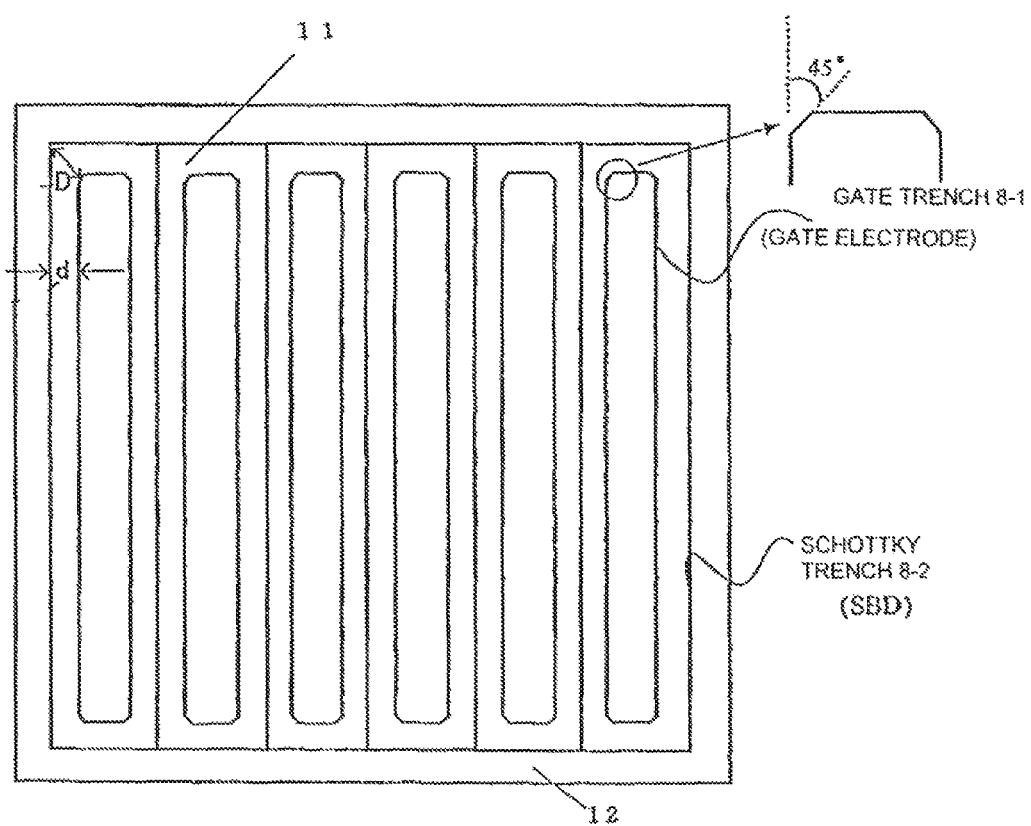
FIG. 7 is a plan view showing the arrangement of gate trenches and Schottky barrier diode trenches in the SiC trench MOSFET according to Embodiment 1 of the invention.

FIG. 7 is a plan view showing a pattern of arrangement of gate trenches 8-1 and Schottky trenches 8-2 for producing the SiC trench MOSFET. It is preferable that each gate trench 8-1 is provided as an endless annular plane pattern. On this occasion, when each trench is formed on a (0001) face (C face: carbon face) of 4H—SiC so that side walls of the trench are directed to a (1-100) face and a (-1100) face and the opposite side wall surfaces are formed at an angle of 45° with respect to striped gate trenches 8-1, gate trenches 8-1 can be preferably formed finely.

Figure 8:
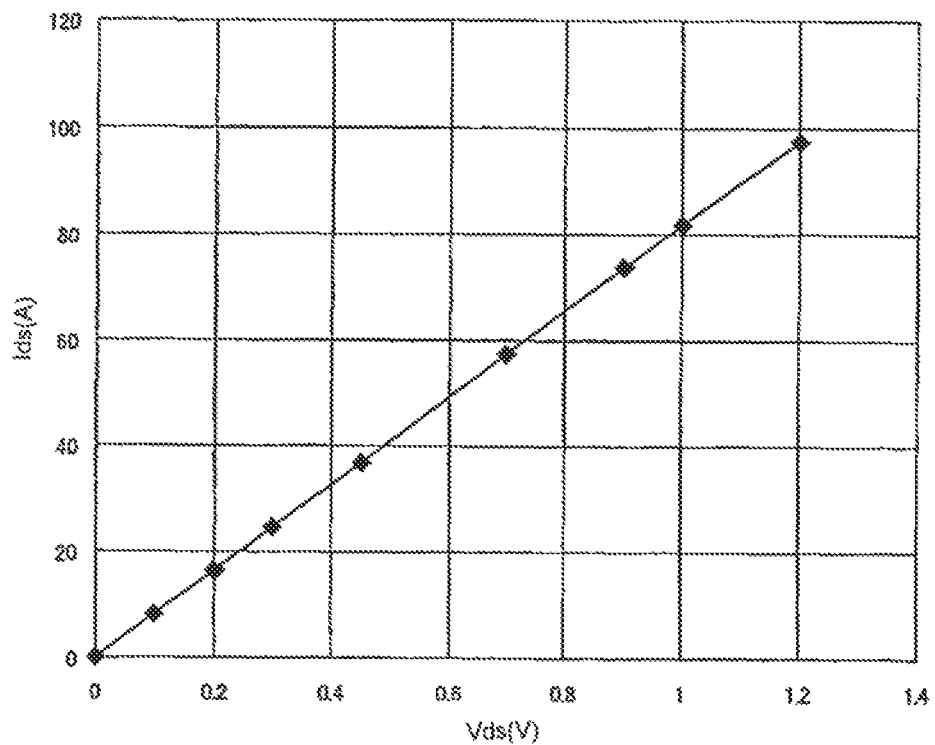
FIG. 8 is an electrical characteristic graph of the SiC trench MOSFET according to Embodiment 1 of the invention.

FIG. 8 shows a measured result of electric characteristic of the SiC trench MOSFET shown in FIG. 7. The chip size is 5 mm square, the area of the active region 11 is 22.10 mm$^2$ and the rating current is 75 A. On-resistance (RonA) is 2.70 mΩcm$^2$ which is a sufficiently low value. The initial device withstand voltage is 1280 V which is sufficiently good characteristic for the 1200 V device. When conventional art-type SiC trench MOSFET having a shallower Schottky trench than the gate trench was formed for the sake of comparison and the withstand voltage of this SiC trench MOSFET was measured, the withstand voltage was 600 V. When a point of breakdown of this SiC trench MOSFET was observed, it was confirmed that the breakdown point was in the bottom of the gate trench. It is concluded from this that voltage withstanding characteristic can be kept stably because the electric field concentration in the bottom of gate trench 8-1 can be relaxed when Schottky trench 8-2 is formed in the source electrode portion so as to be deeper than gate trench 8-1.

Figure 9:
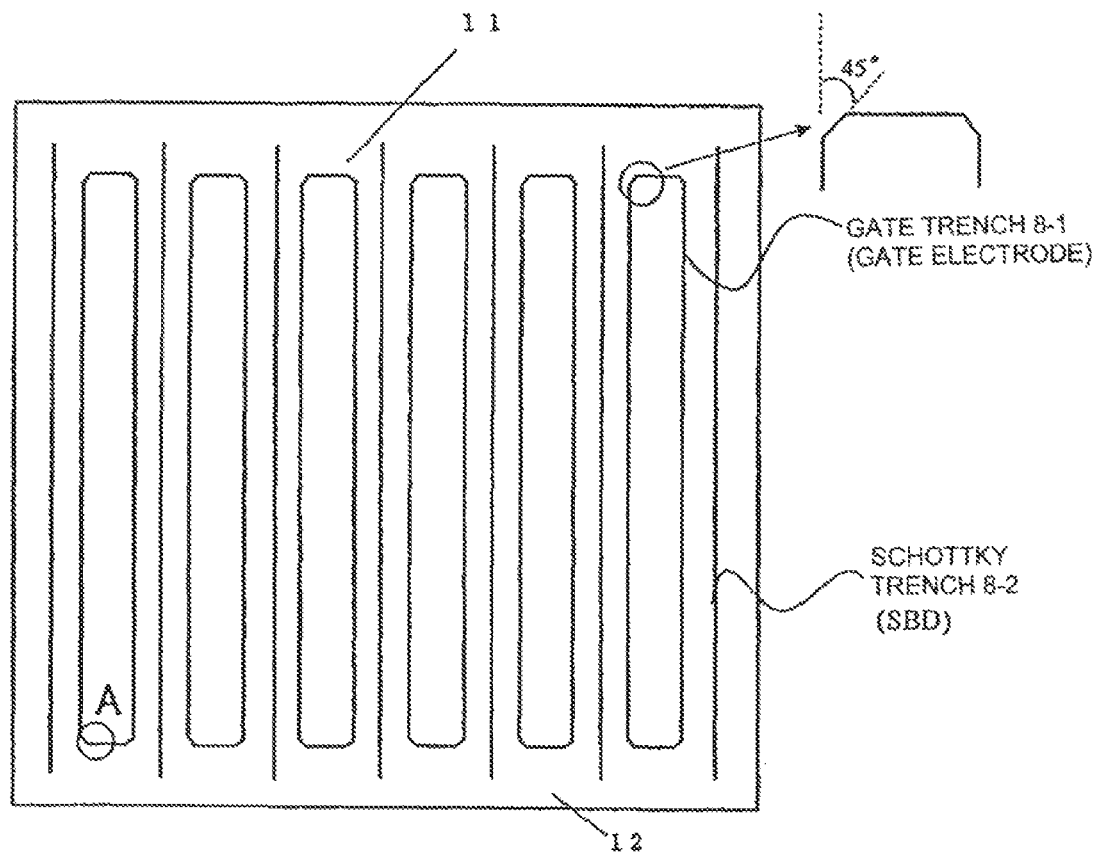
FIG. 9 is a plan view showing the arrangement of gate trenches and Schottky barrier diode trenches in a comparative MOSFET as against the SiC trench MOSFET according to Embodiment 1 of the invention.
Figure 40:
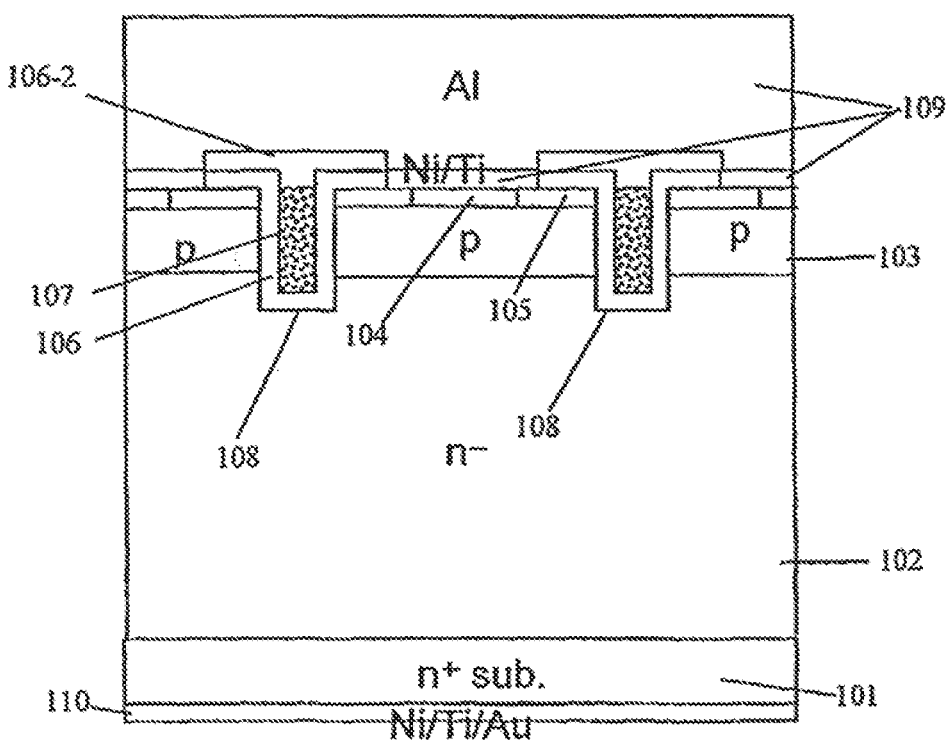
FIG. 40 is a sectional view of the Si trench gate MOSFET according to the background art.
Figure 41:
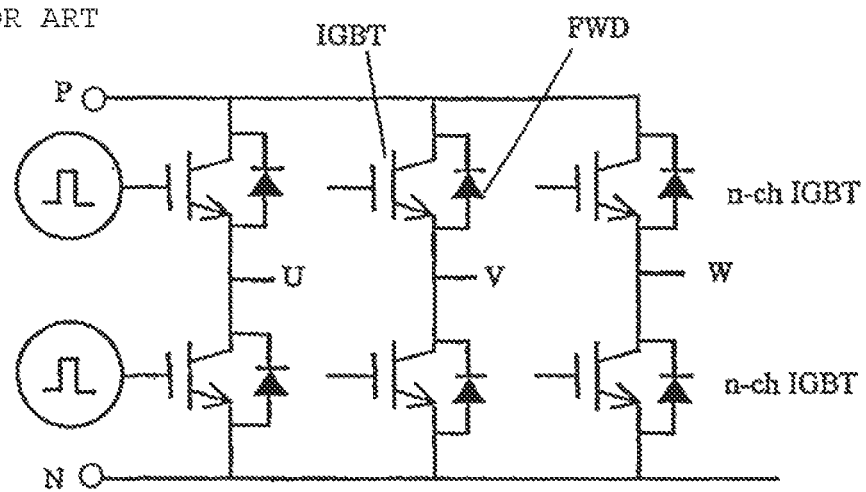
FIG. 41 is a diagram of a three-phase inverter circuit including n-channel IGBTs and FWDs.
Figure 42:
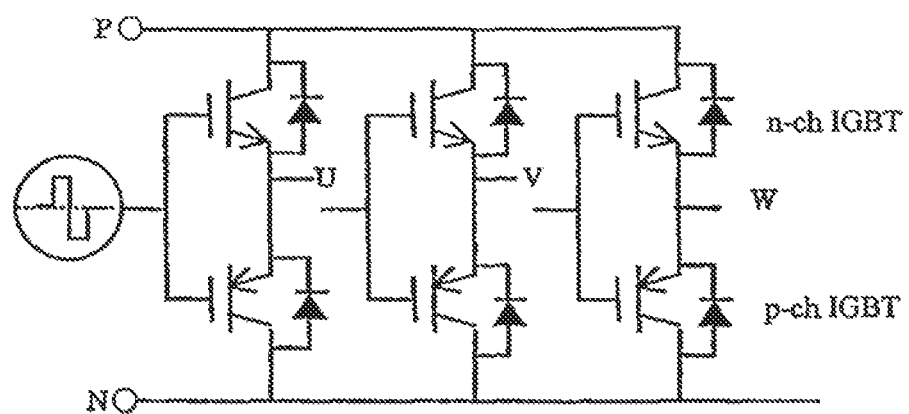
FIG. 42 is a diagram of a three-phase inverter circuit including complementary IGBTs and FWDs.

For the sake of further comparison, a device in which an end portion of gate trench 8-1 was not surrounded by Schottky trench 8-2 was produced by way of trial as shown in FIG. 40. It was consequently found that the device withstand voltage was 1060 V and did not reach 1200 V. When a point of breakdown of the device as a cause of lowering of the device withstand voltage was confirmed on this occasion, the point of breakdown was in the end portion (point A in FIG. 9) of gate trench 8-1. It is found from this respect that the pattern of Schottky trench 8-2 surrounding gate trench 8-1 is effective in relaxing the electric field concentration in the bottom of gate trench 8-1 and improving the voltage withstanding characteristic.

When forward and backward I-V characteristics of the built-in Schottky barrier diode in the SiC trench MOSFET shown in FIG. 7 were measured, good characteristics were obtained. For example, the on-voltage of the built-in Schottky barrier diode at 75 A current conduction was 1.69 V (room temperature) which was a low value almost equal to the on-voltage 1.66 V (room temperature) of the Si PIN diode. When the reverse recovery characteristic of the built-in Schottky barrier diode was measured, the reverse recovery time of the built-in Schottky barrier diode was extremely shorter than the reverse recovery time of the Si PIN diode having the same rating voltage and current. Consequently, the loss incurred in the built-in Schottky barrier diode was about one tenth as large as the loss in the Si PIN diode.

Then, electric characteristics were evaluated while the depth of Schottky trench 8-2 of the SiC trench MOSFET shown in FIG. 7 was changed. Specifically, devices of the six types having Schottky trench depths of 2.7 μm, 2.85 μm, 3 μm, 4 μm, 5 μm and 5.5 μm were formed and characteristics of the devices were examined. Incidentally, the trench distance d between parallel striped trenches both in the gate electrode part and in the Schottky barrier diode part (hereinafter referred to as "parallel trench distance d") was kept at a constant value of 3.8 μm. Table 3 shows a result of the measurement.

TABLE 3

| Second Trench Depth (μm) | Withstand Voltage (V) |
|---|---|
| 0 | 600 |
| 2.70 | 1008 |
| 2.85 | 1088 |
| 3.00 | 1280 |
| 4.00 | 1283 |
| 5.00 | 1290 |
| 5.50 | 1289 |

As a result of the experiment inclusive of the case where no Schottky trench 8-2 was formed, it was found that the device withstand voltage exhibited 1200 V or higher under the condition that the depth of the Schottky trench was not smaller than the depth 3 μm of p-type base layer 3, that is, the trench depth is not smaller than 3 μm. That is, it is to be understood from the viewpoint of voltage withstanding characteristic that Schottky trench 8-2 needs to have a trench depth not smaller than the depth (3 μm) of gate trench 8-1.

Then, SiC trench MOSFETs in which the parallel trench distance d between Schottky trench 8-2 and gate trench 8-1 was changed were produced by way of trial and change of electric characteristics on this condition was evaluated. On this occasion, the depth of Schottky trench 8-2 was set at 5 μm and the depth of gate trench 8-1 was set at 3 μm. On the other hand, the place where the distance between gate trench 8-1 and Schottky trench 8-2 is maximized in the trench pattern in the plan view of the SiC trench MOSFET shown in FIG. 7 is the maximum distance D represented by the double-headed arrow in FIG. 7. As the parallel trench distance d is changed, the maximum distance D is changed. The parallel trench distance d and the maximum distance D substantially have the relationship D=2.12 d. The following Table 4 shows a result of examination about the relationship between the parallel trench distance d, the maximum distance D and the initial withstand voltage.

TABLE 4

| Trench Distance d (μm) | Maximum Distance D (μm) | Initial Withstand Voltage (V) | Withstand Voltage (V) After High-Temperature Application Test |
|---|---|---|---|
| 2.0 | 4.2 | 1289 | 1288 |
| 3.0 | 6.4 | 1289 | 1289 |
| 5.0 | 10.6 | 1256 | 1251 |
| 7.0 | 14.8 | 1242 | 1232 |
| 9.0 | 19.1 | 1201 | 1202 |
| 10.0 | 21.2 | 1175 | 1155 |
| 12.0 | 25.4 | 1120 | 802 |
| 15.0 | 31.8 | 1102 | 25 |
| 19.0 | 40.3 | 1095 | 20 |
| 21.0 | 44.5 | 1088 | 20 |

It is found that the initial withstand voltage of the device decreases as the parallel trench distance d and the maximum distance D increase. This is because as the parallel trench distance d increases, a so-called pinch-off effect of a depletion layer is weakened so that the electric field concentration in the bottom of the gate trench increases when a high voltage is applied between the source and the drain. Similarly to the result shown in the aforementioned Table 3, electric field intensity in the bottom of the gate trench increases so that dielectric breakdown of the gate oxide film occurs easily to reduce the withstand voltage. This can be also found from the confirmation that the point of breakdown in the bottom of the Schottky trench when a high voltage is applied between the source and the drain is the point A of FIG. 9 after removal of part of the Schottky trench equivalent to the case where the parallel trench distance d is infinitely large.

Devices produced under the condition that the withstand voltage of 1200 V or higher was set as the rating voltage were subjected to a high-temperature application test. This evaluation is a long-term reliability evaluation in which the withstand voltage of the device is evaluated after a voltage of 1200 V is continuously applied between the source and the drain for 3000 hours under the condition of 125° C. Consequently, under the condition that the parallel trench distance d was not smaller than 10 μm, both the initial withstand voltage and the withstand voltage after the high-temperature application test were lower than 1200 V. As a result of examination of a point of breakdown of the device, it was confirmed that the oxide film in the bottom of the gate trench was broken down. On the other hand, it was found that sufficient voltage withstanding characteristic could be kept in consideration of not only initial withstand voltage but also long-term reliability if the parallel trench distance d was not larger than 9 μm and the maximum distance D was not larger than 19.1 μm.

Then, devices produced under the condition that the parallel trench distance was 3.8 μm were subjected to a turn-off breakdown tolerance test. Incidentally, the trench depths of the gate trench and the Schottky trench are 3 μm and 5 μm respectively. The turn-off breakdown tolerance test was performed by an L load circuit shown in FIG. 36. Evaluation was made at Vcc=1000 V and at room temperature. Consequently, it was confirmed that turning-off could be made without breakdown of the device at 450 A which was six times as much as the rating current. On the other hand, when p$^+$-type region 300 for relaxing the electric field concentration in the bottom of Schottky trench 8-2 was not formed, the device was broken down at 195 A which was 2.6 times as much as the rating current. It is found from comparison between the results that turn-off tolerance of the SiC trench MOSFET according to the invention is improved greatly.

Incidentally, trench MOSFETs using gallium nitride (GaN) as a WBG (wide band gap) semiconductor material were produced by way of trial and subjected to this test. Consequently, it was confirmed that the same voltage withstanding characteristic, breakdown tolerance and long-term reliability characteristic as those of SiC were obtained.

The aforementioned invention can be summarized as follows. In a WBG semiconductor device according to the invention, an electric field can be relaxed by p$^+$-type region 300 formed in the bottom of Schottky trench 8-2 for forming a Schottky barrier diode, so that avalanche breakdown tolerance in the bottom of Schottky trench 8-2 can be improved. To form p$^+$-type region 300 in the bottom of Schottky trench 8-2 is much easier in terms of process difficulty than to form p$^+$-type region 300 in the bottom of gate trench 8-1 in the gate electrode part. The reason is as follows. When p$^+$-type region 300 is formed in the bottom of gate trench 8-1, there is concern that on-resistance may be affected by deterioration of channel conducting characteristic of the MOSFET if any ion from p$^+$-type region 300 is implanted in a region where an inversion layer (channel) and a storage layer are formed, for example, because of some process variation. However, when p+-type region 300 is formed in the bottom of the Schottky trench, there is no influence on characteristics even if p+-type ions are more or less implanted in a region corresponding to the region where the channel is formed. Accordingly, p+-type region 300 can be formed relatively easily in the bottom of Schottky trench 8-2.

The WBG semiconductor device according to the invention is further characterized in that the distance between Schottky trench 8-2 and gate trench 8-1 is optimized sufficiently from the viewpoint of voltage withstanding characteristic. If the distance is not optimized, large electric field intensity is applied on the bottom of gate trench 8-1. Consequently, when, for example, the distance is too long, there is fear that dielectric breakdown may occur in the oxide film in the bottom of gate trench 8-1 in terms of long-term reliability relating to long-term device operation even when no dielectric breakdown occurs initially in the oxide film in the bottom of the gate trench 8-1. It is therefore necessary to shorten the distance (the distance between parallel portions) between Schottky trench 8-2 and gate trench 8-1 sufficiently without influence on other characteristics. The reason is as follows. If the distance between Schottky trench 8-2 and gate trench 8-1 is sufficiently short, the electric field acting on the bottom of gate trench 8-1 is relaxed rapidly by a so-called pinch-off effect of a depletion layer when a high voltage is applied between the source and the drain. The electric field relaxation permits reduction of load on the gate oxide film during long-term device operation to thereby attain improvement of long-term reliability.

A terminating process in the surface pattern of gate electrode 7 or gate trench 8-1 in the SiC trench MOSFET according to the invention is further characterized as follows. As for gate trench 8-1 provided as a striped surface pattern, it is generally known that when gate trench 8-1 is formed as a striped pattern being not annular but having a terminal portion, there is fear that dielectric breakdown of the gate oxide film may be caused by electric field concentration in the terminal portion at the time of application with the gate voltage or the drain voltage. It is therefore preferable that the surface pattern of gate electrode 7 or gate trench 8-1 in the SiC trench MOSFET according to the invention is provided as an annular pattern without the gate terminal portion. Because it is concluded that this gate terminal processing technique is effective in improving the gate withstand voltage in a WBG semiconductor such as SiC or GaN, it is necessary to form an annular pattern by connecting terminals of the striped gate trench. In the invention, it is further necessary to shorten the distance between parallel portions of Schottky trench 8-2 and gate trench 8-1 as described above to apply the pinch-off effect on the short distance effectively.

Moreover, gate trench 8-1 and Schottky trench 8-2 are formed adjacent to each other while the depth of Schottky trench 8-2 becomes larger than the depth of gate trench 8-1. When a metal electrode is formed in Schottky trench 8-2 to form a Schottky contact with the n⁻ layer (n-type drift layer 2) exposed in Schottky trench 8-2, a built-in Schottky barrier diode having a low on-resistance and a short reverse recovery time can be formed even in the WBG semiconductor trench MOSFET.

When p+-type region 300 is formed in part of the built-in Schottky barrier diode being in contact with the n⁻ layer (n-type drift layer 2), preferably, in the bottom of Schottky trench 8-2, avalanche breakdown tolerance at turning-off time can be improved greatly.

As described above, according to the invention, a Schottky barrier diode can be built in a trench MOSFET using a WBG semiconductor material and good electric characteristic and long-term reliability characteristic can be exhibited without provision of any gate oxide film protecting p+-type region 300 (not easy in terms of process difficulty) in the bottom of gate trench 8-1. Consequently, the size and loss of the semiconductor device can be reduced.

Figure 10:
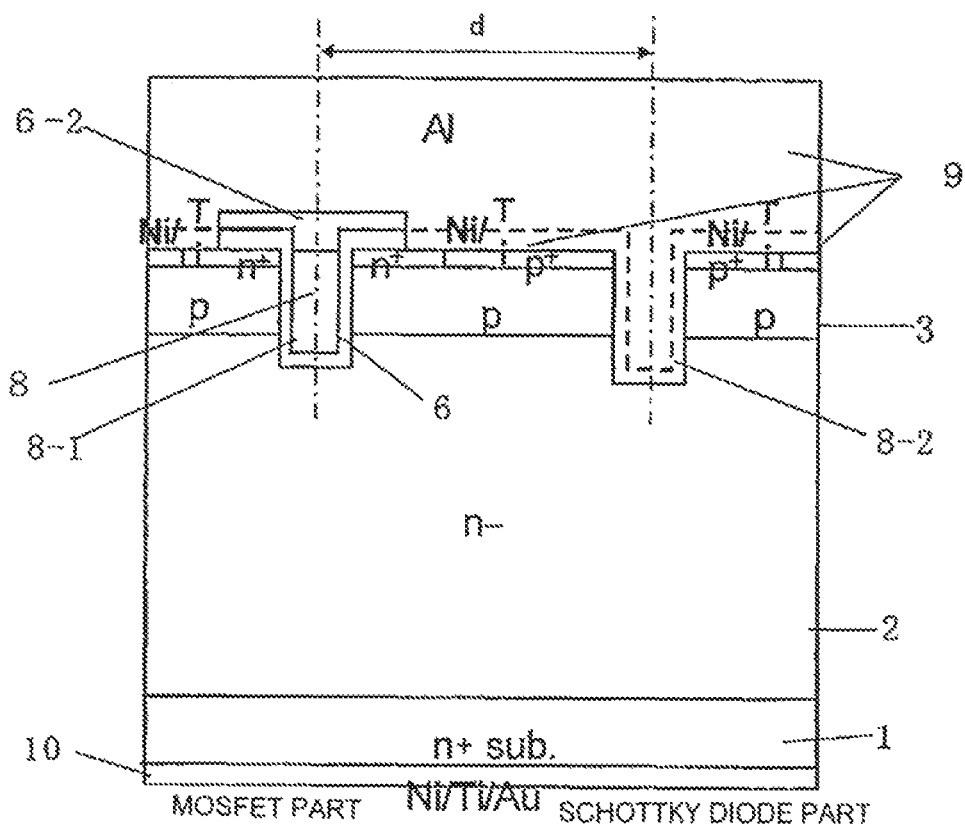
FIG. 10 is a sectional view of important part of an active region of the SiC trench MOSFET according to Embodiment 1 of the invention.
Figure 11:
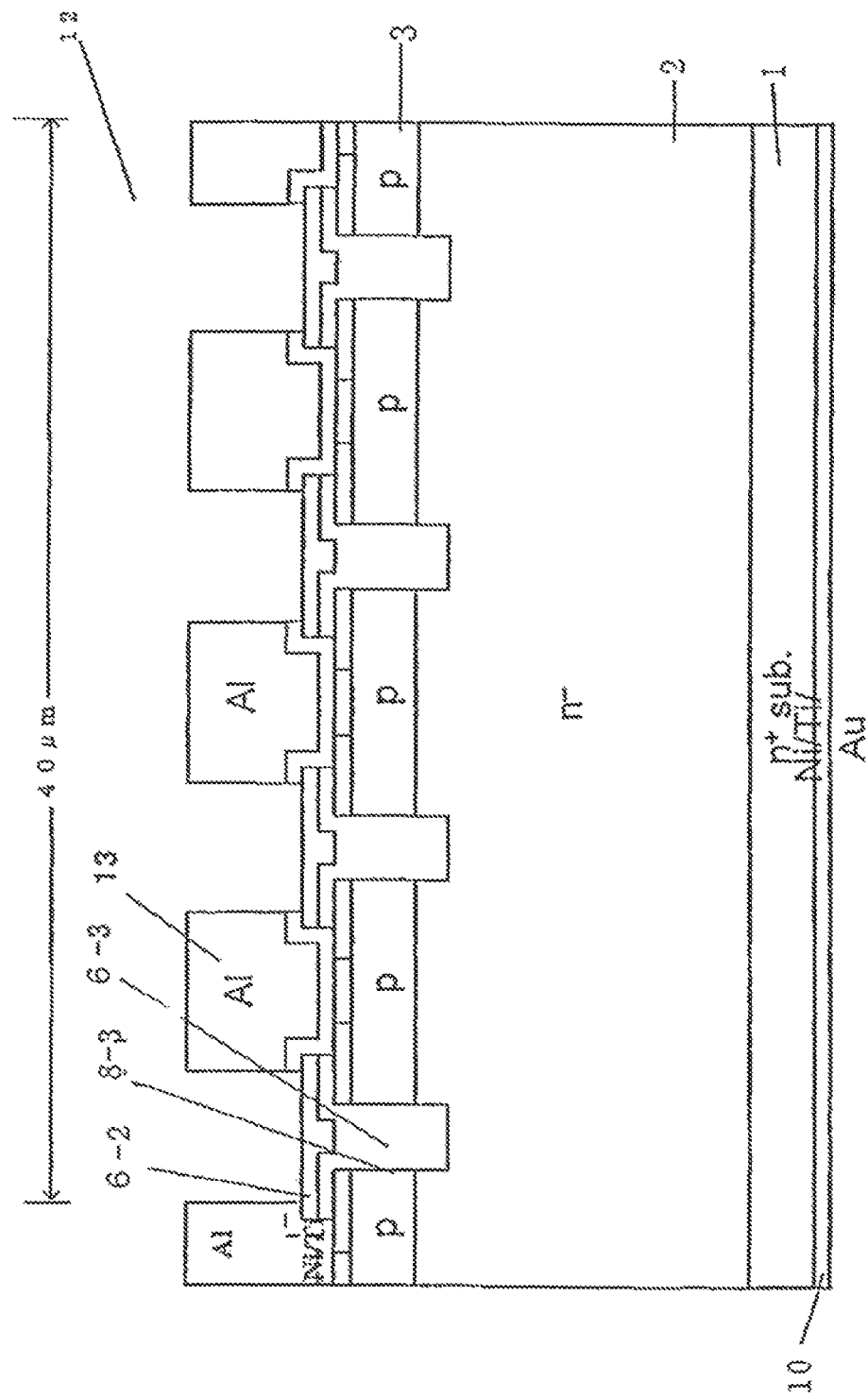
FIG. 11 is a sectional view of important part of a peripheral voltage withstanding structure region of the SiC trench MOSFET according to Embodiment 1 of the invention.

Another embodiment will be described below with reference to FIGS. 10 to 14. Incidentally, in this embodiment, an SiC trench MOSFET which exhibits a withstand voltage of 1200 V and which has an active region located in the center so that a main current flows in the active region, and a peripheral voltage withstanding structure region disposed to surround the active region is provided as a vertical trench gate MOS power semiconductor device. FIG. 10 is a sectional view showing important part of the active region of the SiC trench MOSFET. FIG. 11 is a sectional view showing important part of the peripheral voltage withstanding structure of the SiC trench MOSFET.

First, n-type SiC semiconductor substrate 1 (referred to as "n+ sub." in FIG. 10) with a sufficiently high impurity concentration is prepared. A 4H—SiC substrate having a (0001) face is used as the semiconductor substrate 1. In this embodiment, SiC substrate 1 contains about $2 \times 10^{18}$ cm⁻³ of nitrogen as an impurity. An n-type SiC layer (n-type drift layer 2) containing about $1.0 \times 10^{16}$ cm⁻³ of nitrogen and a p-type SiC layer (p-type base layer 3) containing about $2.1 \times 10^{17}$ cm⁻³ of aluminum are epitaxially grown on SiC substrate 1 so that the thicknesses of layers 2 and 3 are about 10 μm and 2.5 μm, respectively (see FIG. 1). P+-type contact region 4 and n+-type source region 5 are formed by ion implantation and heat treatment on a surface of p-type base layer 3 in the active region. P+-type contact region 4 uses aluminum as an impurity whereas n+-type source region 5 uses phosphorus as an impurity. The temperature and time for the heat treatment are 1700° C. and 1 minute (see FIG. 2). Then, as shown in FIG. 3, a 1.6 μm-thick silicon oxide film (hereinafter abbreviated to as "oxide film" in some cases) is grown on surfaces of regions 4 and 5 and subjected to photolithography and etching to form oxide film mask 6-1 having 1.0 μm-wide opening portions disposed at intervals of 7.6 μm. After the formation of oxide film mask 6-1, gate trench 8-1 is formed vertically from the substrate surface by anisotropic etching. On this occasion, the depth of gate trench 8-1 is set at 3 μm. Then, an oxide film is formed in the inside of gate trench 8-1 and then removed to thereby smoothen the inner surface of the trench. As shown in FIG. 10, after the growth of a 100 nm-thick gate oxide film 6, gate electrode 8 made of polysilicon or the like is embedded in gate trench 8-1 and interlayer insulating film 6-2 is further formed on an upper portion of gate electrode 8.

As shown in FIG. 11, also in peripheral voltage withstanding structure region 12, 3 μm-deep third trenches 8-3 are formed simultaneously with the formation of gate trench 8-1 and then each third trench 8-3 is filled with oxide film 6-3. Then, interlayer insulating film 6-2 is formed on oxide film 6-3 in the same manner as gate trench 8-1 in the active region. Although this embodiment shows the case where each third trench 8-3 is filled with an oxide film, each third trench 8-3 may be filled with any other insulating film such as a silicon nitride film. Incidentally, in this embodiment, as shown in FIG. 11, four third trenches 8-3 are formed in peripheral voltage withstanding structure region 12 while the width of peripheral voltage withstanding structure region 12 (the distance from the center of the chip toward the outer circumference of the chip) is set at 40 μm.

Referring back to FIG. 3, Schottky trench 8-2 is then formed in the same manner as described above. On this occasion, the width of Schottky trench 8-2 is set at 1.0 μm and the depth of Schottky trench 8-2 is set at 5 μm which is 2 μm deeper than gate trench 8-1. In addition, the distance between Schottky trench 8-2 and gate trench 8-1 was set at d=3.8 μm in terms of the distance between central lines of trenches 8-1 and 8-2.

After the formation of Schottky trench 8-2, as shown in FIG. 10, nickel and titanium are laminated successively on the inside of Schottky trench 8-2 and the substrate surface by sputtering and aluminum is further laminated thereon by sputtering to thereby form source electrode 9. At the same time, as shown in FIG. 11, metal electrode film 12 is formed on interlayer insulating film 6-2 between third trenches 8-3. Then, drain electrode 10 made of titanium, nickel and gold is formed on the rear surface of the substrate. Thus, the SiC trench MOSFET is completed (FIG. 10).

The arrangement of gate trenches 8-1 and Schottky trenches 8-2 for producing the SiC trench MOSFET is the same as in the plan view of FIG. 7. Each trench in active region 11 adjacent to peripheral voltage withstanding structure region 12 is disposed as a 5 m-deep Schottky trench 8-2 in which a Schottky barrier diode is formed. In this manner, electric field concentration in the bottom of each third trench 8-3 on a side near active region 11 in peripheral voltage withstanding structure region 12 can be relaxed.

Figure 13:
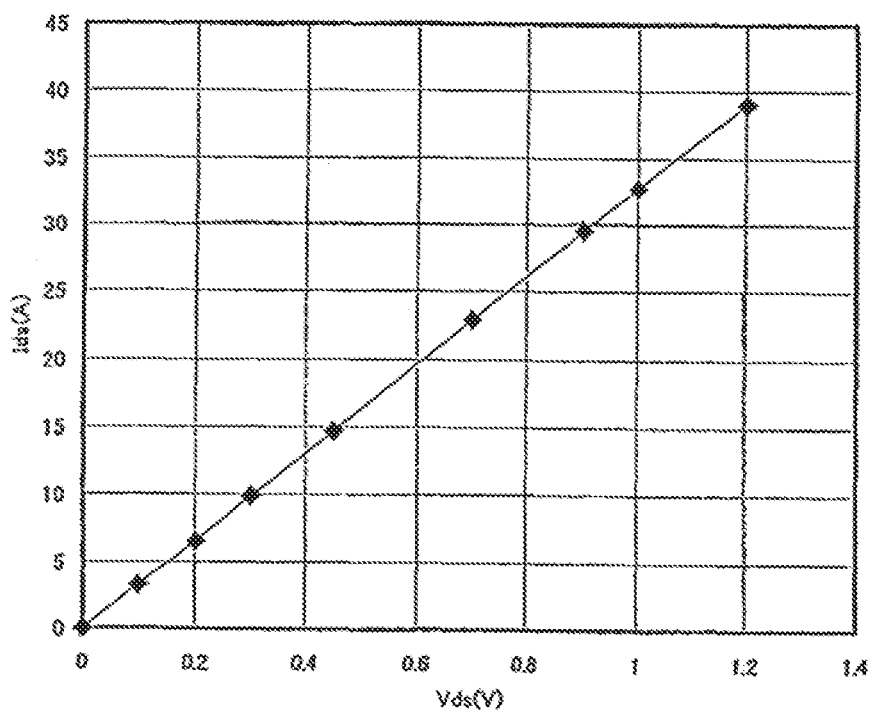
FIG. 13 is an electrical characteristic graph of the SiC trench MOSFET according to Embodiment 1 of the invention.

FIG. 13 shows a measured result of electric characteristic of the SiC trench MOSFET. The chip size is 3 mm square, the active area is 8.41 mm² and the rating current is 30 A. On-resistance (RonA) is 2.65 mΩcm² which is a sufficiently low value. The initial device withstand voltage is 1289 V which is sufficiently good characteristic for the 1200 V device.

For the sake of comparison, first, a device in which Schottky trench 8-2 adjacent to peripheral voltage withstanding structure region 12 was replaced by gate trench 8-1, that is, a device having a surface pattern structure in which gate trench 8-1 was not surrounded by Schottky trench 8-2 was produced and the device withstand voltage was measured. The peripheral voltage withstanding structure on this occasion was the same as described above. It was consequently confirmed that the device withstand voltage was 1060 V and did not reach 1200 V.

For the sake of further comparison, several kinds of devices with a p⁺-type region formed by ion implantation in the bottom of each third trench 8-3 in one or two innermost circumferences of peripheral voltage withstanding structure region 12 were produced and the withstand voltage characteristic of each device on this occasion was measured. Incidentally, the depth of Schottky trench 8-2 in active region 11 adjacent to peripheral voltage withstanding structure region 12 in each of the devices was set at 5 μm. Table 5 shows results of the measurement.

TABLE 5

| Number of Third Trenches | Width (μm) of Peripheral Voltage Withstanding Structure Region | Initial Withstand Voltage (V) | Number of Man-Hour (Percentage) |
|---|---|---|---|
| 4 (No P⁺) | 40.0 | 1289 | 1.00 |
| 5 (P⁺ in One Innermost Circumference) | 55.0 | 1300 | 1.07 |
| 6 (P⁺ in Two Innermost Circumferences) | 72.0 | 1312 | 1.07 |

Although it was confirmed that the device withstand voltage exhibited 1300 V or higher at maximum which was a sufficient value for the 1200 V device when the p⁺-type region was put in the bottom of each third trench 8-3, the required number of p-type guard ring regions in peripheral voltage withstanding structure region 12 and the required number of third trenches at that time increased from four to five and six respectively. Consequently, the chip area as well as the number of steps for forming the p⁺-type region increased because the width of peripheral voltage withstanding structure region 12 (the distance from the center of the chip toward the outer circumference of the chip) increased from 55 μm to 72 μm, so that the cost increased.

Figure 14:
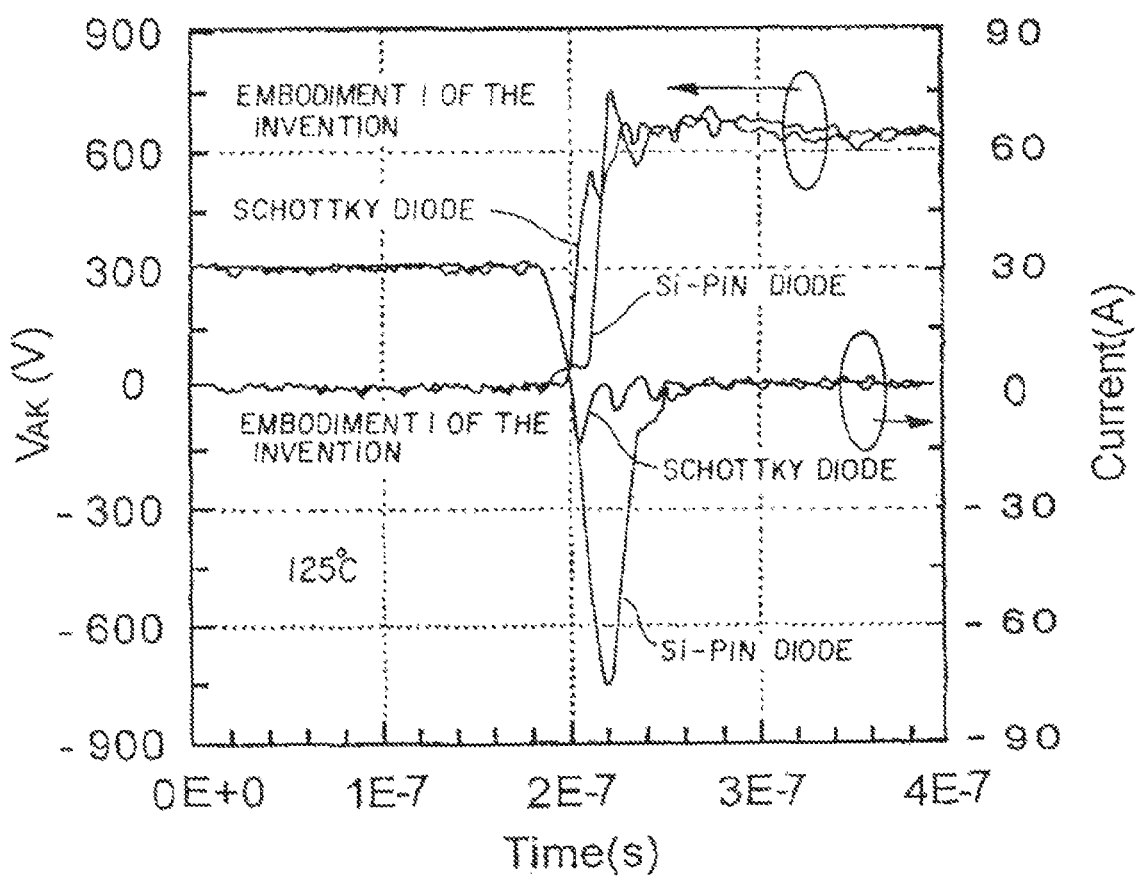
FIG. 14 is a graph for comparison between reverse recovery characteristic of a built-in Schottky barrier diode of the SiC trench MOSFET according to Embodiment 1 of the invention and reverse recovery characteristic of an Si PIN diode the same in withstand voltage and rating current as the Schottky barrier diode.

When the I-V characteristic of the built-in Schottky barrier diode was measured, good characteristic was obtained. For example, the on-voltage of the built-in Schottky barrier diode at 30 A current conduction was 1.65 V (room temperature) which was a low value almost equal to the on-voltage of the Si PIN diode of 1.66 V (room temperature). As shown in FIG. 14, when the reverse recovery characteristic of the built-in Schottky barrier diode was measured, the reverse recovery time of the built-in Schottky barrier diode was much shorter than the reverse recovery time of the Si PIN diode having the same rating voltage and current. Consequently, low loss characteristic could be obtained so that the loss incurred in the built-in Schottky barrier diode was about one tenth as large as the loss in the Si PIN diode. Incidentally, in FIG. 14, the horizontal axis expresses time (unit: second) and 1E-7 expresses $1 \times 10^{-7}$. The same rule applies to other notations than 1 E-7. The vertical axis on the left side expresses anode-cathode withstand voltage (V) and the vertical axis on the right side expresses forward current (A). In FIG. 14, "invention" refers to a Schottky barrier diode and "Si-pin" refers to an Si PIN diode having the same rating voltage and current.

Then, electric characteristics were evaluated while the depth of the Schottky trench 8-2 was changed. Specifically, devices of the six types having Schottky trench depths of 2.7 μm, 2.85 μm, 3 μm, 4 μm, 5 μm and 5.5 μm were formed and characteristics of the devices were examined. Incidentally, the trench distance d between trenches in the gate electrode part and the source electrode part was kept at a constant value of 3.8 μm. Consequently, it was found that the device withstand voltage exhibited 1200 V or higher under the condition that the Schottky trench depth was not smaller than 3 μm as shown in Table 6. That is, it is to be understood that the Schottky trench needs a depth not smaller than the gate trench depth (3 μm).

TABLE 6

| Second Trench Depth (μm) | Withstand Voltage (V) |
|---|---|
| 0 | 600 |
| 2.70 | 1098 |
| 2.85 | 1109 |
| 3.00 | 1215 |
| 4.00 | 1233 |
| 5.00 | 1289 |
| 5.50 | 1291 |

Figure 12:
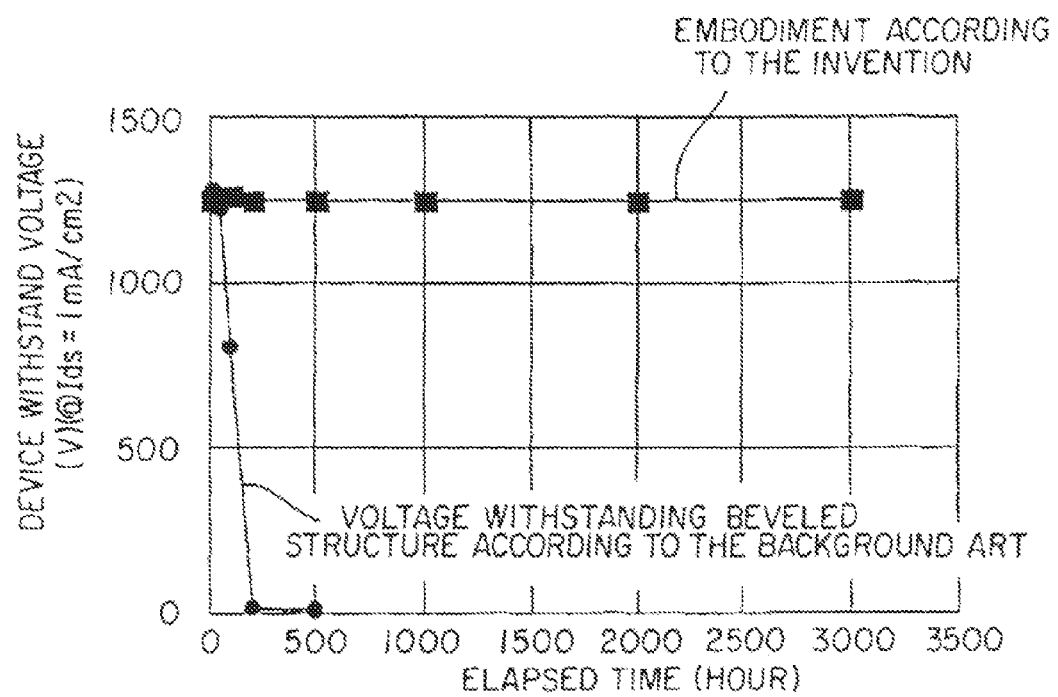
FIG. 12 is a graph showing evaluation of a high-temperature application test of the SiC trench MOSFET according to Embodiment 1 of the invention.

The SiC trench MOSFET according to this embodiment was subjected to a high-temperature application test. This evaluation is a long-term reliability evaluation in which the withstand voltage of the device is evaluated after a voltage of 1200 V is continuously applied between the source and the drain for 3000 hours under the condition of 125° C. FIG. 12 shows a result of the evaluation. It was found that sufficient voltage withstanding characteristic of the device according to this embodiment could be kept in consideration of not only initial withstand voltage but also long-term reliability compared with the background art-type beveled voltage withstanding structure device. Incidentally, trench MOSFETs using gallium nitride (GaN) as a WBG semiconductor material were produced by way of trial and subjected to this device test. Consequently, it was confirmed that the same voltage withstanding characteristic, breakdown tolerance and long-term reliability characteristic as those of SiC were obtained.

As described above, according to the invention, a Schottky barrier diode can be built in a trench MOSFET using a WBG semiconductor material, and good electric characteristic and long-term reliability characteristic can be achieved by a short width of peripheral voltage withstanding structure region 12 (the distance from the center of the chip toward the outer circumference of the chip) without provision of any $p^+$-type region in the bottom of the gate trench and the bottom of each third trench in peripheral voltage withstanding structure region 12. Consequently, the size and loss of the semiconductor device can be reduced more greatly.

Embodiment 2

Figure 15:
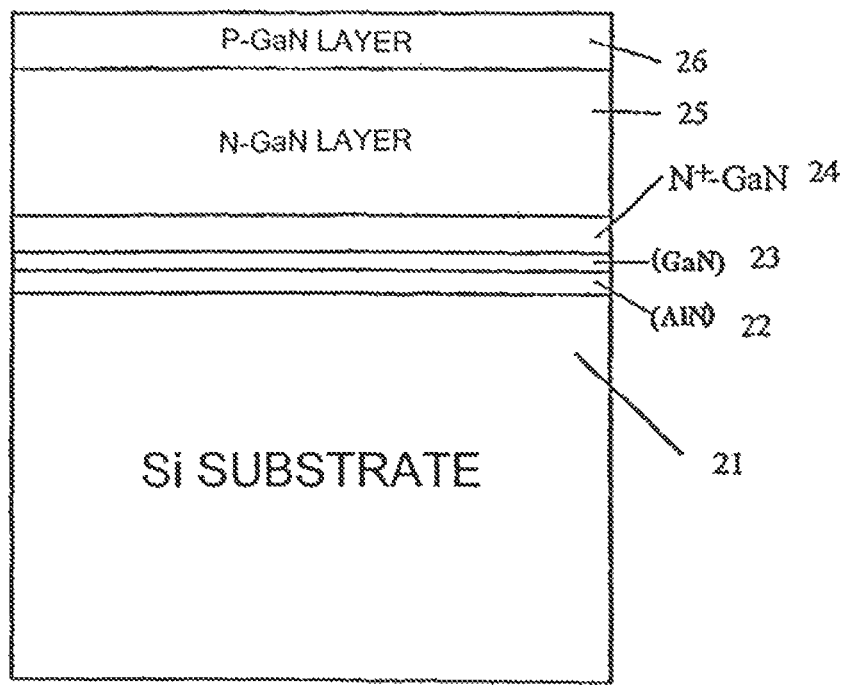
FIG. 15 is a sectional view (Part 1) showing a process of producing a GaN trench MOSFET according to Embodiment 2 of the invention.

A wide band gap semiconductor device according to Embodiment 2 of the invention, especially, a trench MOS device will be described below with reference to FIGS. 15 to 19. In Embodiment 2, a GaN trench MOSFET with a withstand voltage of 600 V is used as a vertical trench gate type MOS power semiconductor device. The point of difference from the GaN trench MOSFET according to Embodiment 1 is that an Si substrate is used as a semiconductor substrate with a high impurity concentration. First, as shown in FIG. 15, Si substrate 21 having (111) face as a principal surface is prepared as the Si substrate so that AlN layer 22 and non-doped GaN layer 23 as buffer layers on which GaN layers 24, 25 and 26 will be further grown are formed on Si substrate 21 by a metal organic chemical vapor deposition method (MOCVD) which is a commonly known technique. Because the grating constant of the Si (111) face is 0.3840 nm and the grating constant of GaN is 0.3819 nm which is a value relatively near the grating constant of the Si (111) face, the Si (111) face is selected as a principal surface. Si substrate 21 has a diameter of 200 mm and a thickness of 500 μm. AlN layer 22 and non-doped GaN layer 23 formed on Si substrate 21 are 15 nm and 200 nm thick, respectively. AlN layer 22 and GaN layer 23 are formed as buffer layers for converting the crystal structure and improving the crystal quality, respectively.

A 3 μm-thick $n^+$-type GaN layer 24 and a 6 μm-thick n-type GaN drift layer 25 are epitaxially grown successively on GaN layer 23. The impurity concentrations of GaN layer 24 and GaN drift layer 25 are set at $5 \times 10^{19}$ cm$^{-3}$ and $2 \times 10^{16}$ cm$^{-3}$, respectively. On this occasion, trimethyl gallium is used as a gallium material and ammonia gas is used as a nitrogen material. Monosilane is used as a dopant material for forming an n-type semiconductor. A 2.5 μm-thick p-type GaN base layer 26 is epitaxially grown on n-type GaN drift layer 25. The impurity concentration of base layer 26 is set at $2 \times 10^{17}$ cm$^{-3}$ and magnesium is used as a dopant material. In this manner, a basic laminated structure can be formed as shown in FIG. 15.

Figure 16:
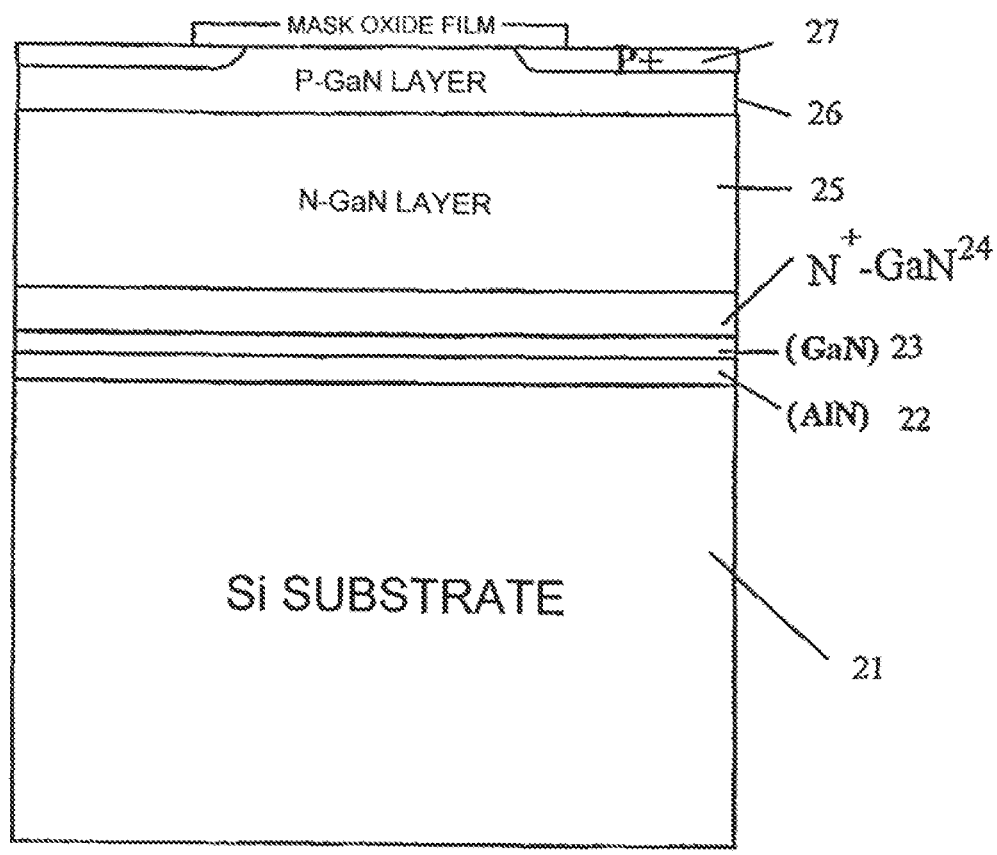
FIG. 16 is a sectional view (Part 2) showing a process of producing a GaN trench MOSFET according to Embodiment 2 of the invention.

Then, as shown in FIG. 16, a silicon oxide film (SiO$_2$ film) is formed on a surface of p-type GaN base layer 26 and patterned. While the oxide film is used as a mask, $p^+$ GaN contact region 27 is formed on the surface of p-type GaN base layer 26 exposed in an opening portion of the mask. The ion implantation condition for forming p+GaN contact region 27 is a magnesium acceleration voltage of 45 keV and an impurity concentration of $3 \times 10^{18}$ cm$^{-3}$. Then, the mask SiO$_2$ film is removed.

Figure 17:
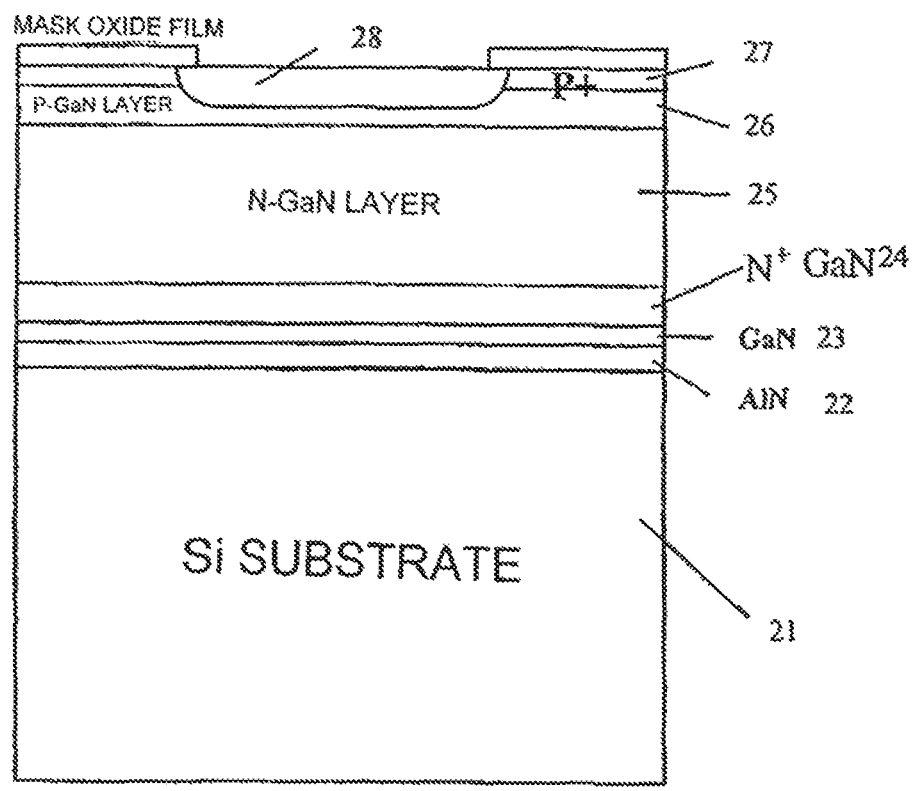
FIG. 17 is a sectional view (Part 3) showing a process of producing a GaN trench MOSFET according to Embodiment 2 of the invention.
Figure 18:
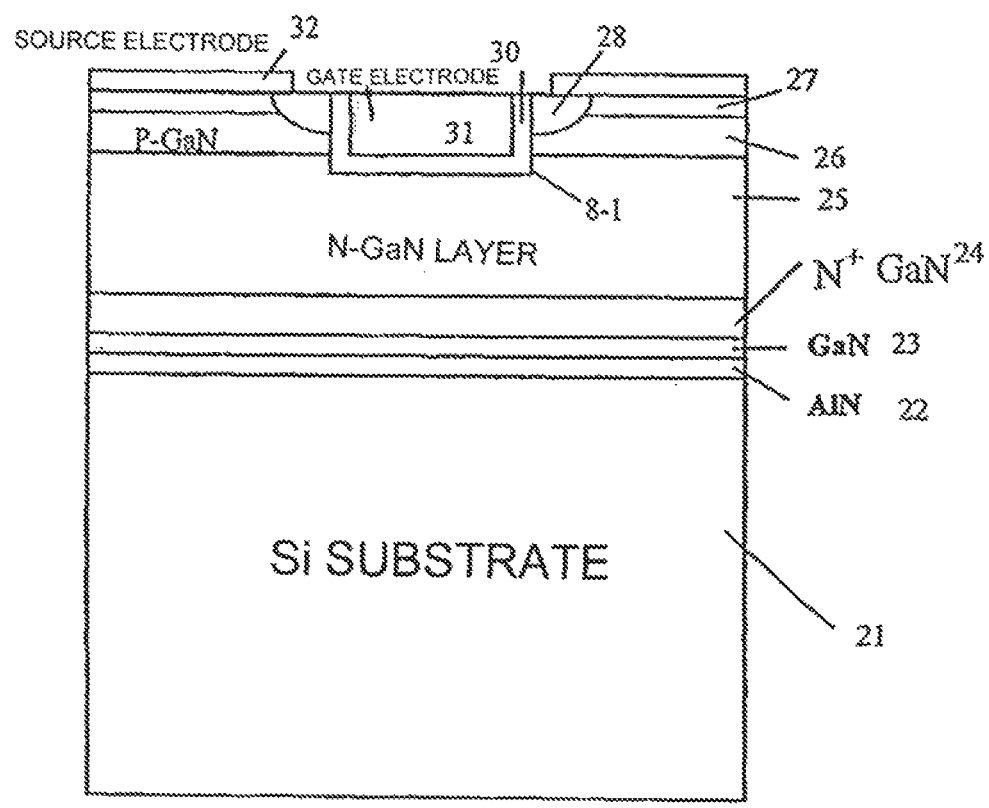
FIG. 18 is a sectional view (Part 4) showing a process of producing a GaN trench MOSFET according to Embodiment 2 of the invention.
Figure 19:
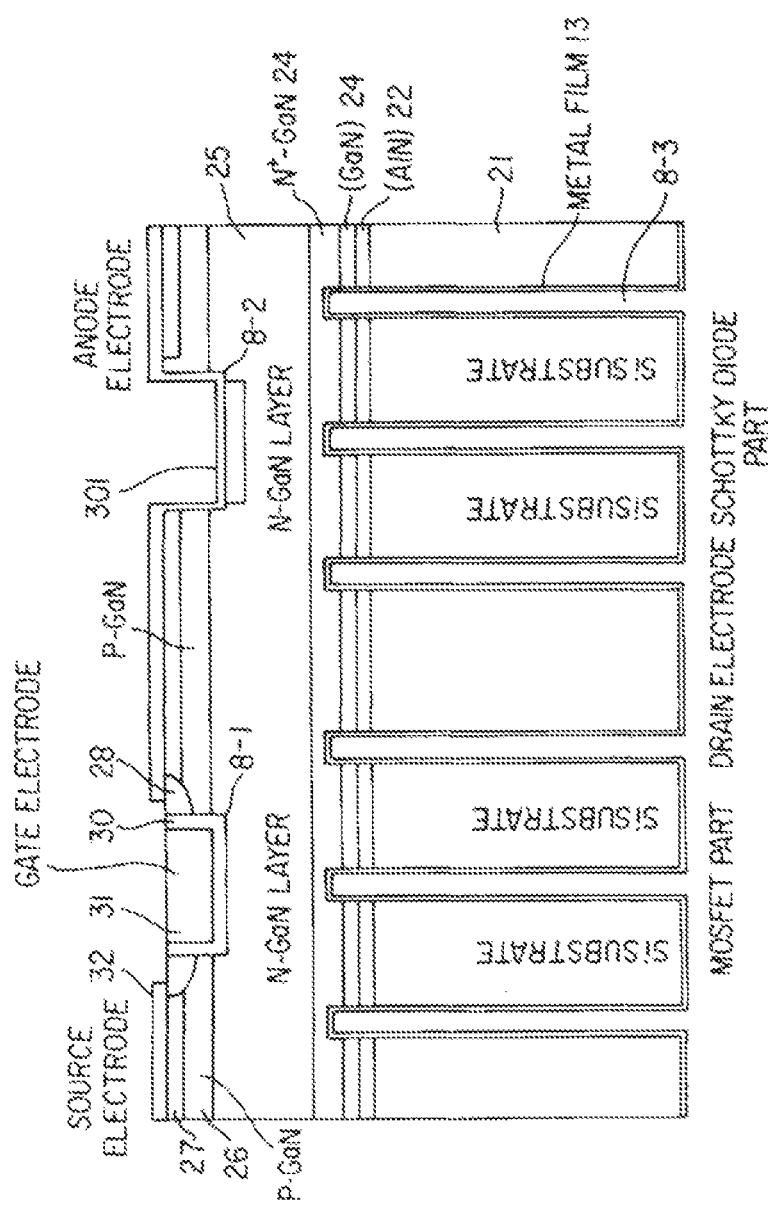
FIG. 19 is a sectional view of the GaN trench MOSFET according to Embodiment 2 of the invention.

As shown in FIG. 17, an SiO$_2$ film is formed again and then patterned so that $n^+$ GaN source region 28 is formed in an opening portion of the SiO$_2$ film. N+GaN source region 28 is selectively formed by ion implantation using silicon and aluminum as impurities. On this occasion, the impurity concentration is set at $3 \times 10^{18}$ cm$^{-3}$. Then, as shown in FIG. 18, gate trench 8-1 having a depth of 3 μm extending from the surface of $n^+$ GaN source region 28 to reach n-type GaN drift layer 25 is formed. Then, a 100 nm-thick gate oxide film 30 is formed on the inner surface of gate trench 8-1. Then, low-resistance polysilicon doped with an impurity is embedded in gate trench 8-1 to form gate electrode 31. In the Schottky barrier diode part, as shown in FIG. 19, Schottky trench 8-2 is formed in the same manner as described above. On this occasion, the width of Schottky trench 8-2 is set at 1.0 μm and the depth of Schottky trench 8-2 is set at 5 μm which is 2 μm deeper than the gate electrode portion. The distance between gate trench 8-1 and Schottky trench 8-2 is set at d=3.8 μm in terms of distance between central lines of trenches 8-1 and 8-2. Magnesium ions are implanted in the bottom of Schottky trench 8-2 in the Schottky barrier diode part at an acceleration voltage of 45 keV and an impurity concentration of $3 \times 10^{18}$ cm$^{-3}$ to form p-type region 301 for electric field relaxation. Further, as shown in FIG. 19, a nickel film and a titanium film are sputtered and an aluminum film is then sputtered as source electrode 32 so that source electrode 32 is formed as a common layer in ohmic contact with surfaces of $n^+$ GaN source region 28 and $p^+$ GaN contact region 27. At the same time, an anode electrode of the Schottky barrier diode is formed in Schottky trench 8-2 so that the anode electrode is used as an electrode film in common with source electrode 32.

Then, as shown in FIG. 19, Si substrate 21 which is 500 μm thick is back-ground from its rear surface so that the total thickness becomes 80 μm. Although Embodiment 2 shows the case where back-grinding is used for simplifying a trench etching process as an after-process because Si substrate 21 is generally as thick as about 500 μm, the back-grinding process may be removed if Si substrate 21 is originally sufficiently thin. Then, a 1.6 μm-thick oxide film is grown on the rear surface of Si substrate 21 and subjected to photolithography and etching to form an oxide film mask having 6 μm-wide openings at intervals of 6 μm. Trenches 8-3 each having a depth extending from the rear surface of Si substrate 21 to reach $n^+$ GaN layer 24 through the buffer layers of AlN layer 22 and GaN layer 23 are formed by trench etching using the oxide film mask. Ti/Ni/Au metal film 13 is formed by lamination so that high impurity concentration $n^+$ GaN layer 24 surface exposed in the front end (bottom) of each trench 8-3, side surfaces of each trench 8-3 and the whole rear surface of Si substrate 21 are covered with Ti/Ni/Au metal film 13. Ti/Ni/Au metal film 13 is formed as a metal film used in common with the drain electrode of the MOSFET and the cathode electrode of the Schottky barrier diode.

The voltage withstanding characteristic and I-V characteristic of the MOSFET produced according to Embodiment 2 as described above were measured in the same manner as in Embodiment 1. It was found that the device withstand voltage was 670 V which exhibited sufficient device characteristic for the 600 V withstand voltage device. The chip size of the device used in this measurement was 5 mm×5 mm and the rating current of the device was 50 A (active area: 0.2 cm$^2$, current density: 250.0 A/cm$^2$). The MOSFET device according to Embodiment 2 exhibited RonA=1.2 mΩcm$^2$ and on-voltage of 0.3 V which was sufficiently lower than that of an Si IGBT or an Si MOSFET. Though not shown, low loss characteristic was exhibited so that the loss measured as reverse recovery characteristic at 50 A current conduction in the same manner as in Embodiment 1 was about one tenth as much as that of the Si PIN diode.

Then, devices of the six types having Schottky trench 8-2 depths of 2.7 µm, 2.85 µm, 3 µm, 4 µm, 5 µm and 5.5 µm larger than the thickness (2.5 µm) of p-type GaN base layer 26 were formed and characteristics of the devices were examined in the same manner as in Embodiment 1. Incidentally, the distance d between respective central lines of the trenches in the gate electrode part and the Schottky barrier diode part was kept at a constant value of 3.8 µm. Consequently, as shown in Table 7, it was found that the device withstand voltage exhibited 600 V or higher under the condition that the trench depth was not smaller than 3 µm, inclusive of the case where no Schottky trench 8-2 was formed (as represented by trench depth 0).

TABLE 7

| Trench Depth (µm) | Withstand Voltage (V) |
|---|---|
| 0 | 330 |
| 2.70 | 504 |
| 2.85 | 525 |
| 3.00 | 615 |
| 4.00 | 633 |
| 5.00 | 670 |
| 5.50 | 688 |

That is, it is found that the Schottky trench needs to have a trench depth not smaller than the depth (3 µm) of the gate trench in order to avoid dielectric breakdown caused by the electric field concentration without provision of any electric field relaxing p-type region in the bottom of the trench of the gate electrode. Then, a trench MOSFET in which the distance d (µm) between the trench in the Schottky barrier diode part and the trench in the gate electrode part was changed was produced by way of trial and change of electric characteristic on this occasion was evaluated. On this occasion, the depth of Schottky trench 8-2 was set at 5 µm and the depth of the gate trench was set at 3 µm. Consequently, as shown in Table 8, it is found that the withstand voltage and on-resistance of the device deteriorate as the trench distance d (µm) increases.

TABLE 8

| Trench Distance d (µm) | Initial Withstand Voltage (V) | Withstand Voltage (V) After High-Temperature Application Test |
|---|---|---|
| 2.0 | 685 | 688 |
| 3.0 | 677 | 669 |
| 5.0 | 670 | 674 |
| 7.0 | 658 | 660 |
| 9.0 | 644 | 640 |
| 10.0 | 635 | 622 |
| 12.0 | 625 | 40 |
| 15.0 | 600 | 25 |
| 19.0 | 568 | 18 |
| 21.0 | 540 | 18 |

The reason why the deterioration of the withstand voltage and on-resistance of the device is caused by the increase of the trench distance d (µm) shown in Table 8 is that electric field intensity applied on the bottom of the gate trench increases as the trench distance d (µm) increases as described in Embodiment 1. Consequently, electric field intensity in the bottom of the gate trench 8-1 increases so that dielectric breakdown of gate oxide film 30 occurs easily, similarly to the result shown in Table 7. Devices produced under the condition that the withstand voltage was 600 V or higher were subjected to a high-temperature application test. This evaluation was performed in the condition that the withstand voltage of the device was evaluated after a voltage of 600 V was continuously applied between the source and the drain for 3000 hours at 125° C. Consequently, under the condition that the trench distance d (µm) was 12 µm or 15 µm, the initial withstand voltage was 600 V or higher but the withstand voltage after the high-temperature application test was considerably lower than 600 V. When a point of breakdown of the device was examined, it was confirmed that the oxide film in the bottom of the gate trench was broken down. It was found from this respect that sufficient voltage withstanding characteristic could be kept in consideration of not only initial withstand voltage but also long-term reliability if the trench distance d (µm) was not larger than 10 µm. Then, devices produced under the condition that the trench distance was 3.8 µm were subjected to a turn-off breakdown tolerance test in the same manner as in Embodiment 1. Incidentally, the depths of the gate trench and the Schottky trench are 3 µm and 5 µm respectively. The test was performed by an L load circuit shown in FIG. 36. Evaluation was made at Vcc=500 V and at room temperature. Consequently, it was confirmed that turning-off could be made without breakdown of the device at 200 A which was four times as much as the rating current. It is concluded that turn-off breakdown tolerance is improved greatly because the GaN trench MOSFET with a withstand voltage of 600 V shown in Embodiment 2 has a p-type region 301 in the bottom of the Schottky trench. The turn-off breakdown tolerance in the case where the p-type region 301 was not formed was 135 A which was 2.7 times as much as the rating current.

As described above, the trench MOSFET using a wide band gap semiconductor material according to Embodiment 2 can include a built-in Schottky barrier diode and good electric characteristic and long-term reliability characteristic can be obtained without provision of any gate oxide film protecting p-type region (not easy to produce) in the bottom of the gate trench. Consequently, the size and loss of the semiconductor device can be reduced more greatly.

Embodiment 3

Figure 20:
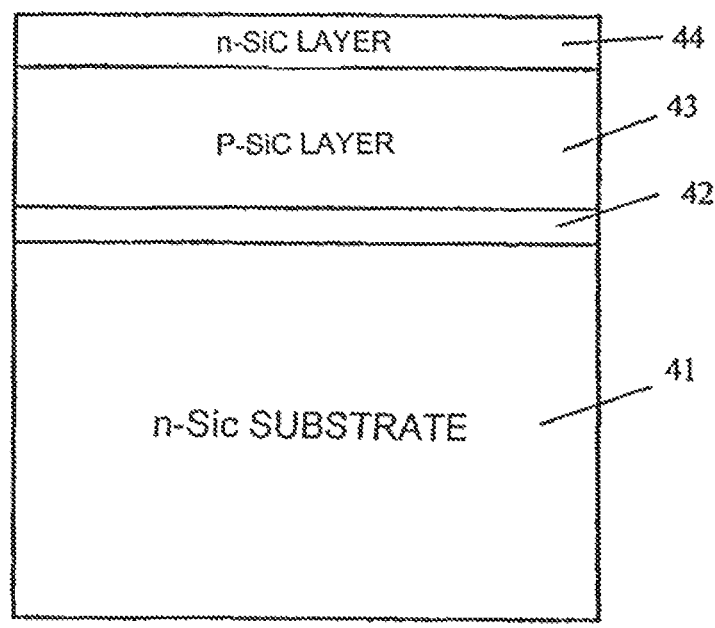
FIG. 20 is a sectional view (Part 1) showing a process of producing a p-channel SiC trench MOSFET according to Embodiment 3 of the invention.
Figure 21:
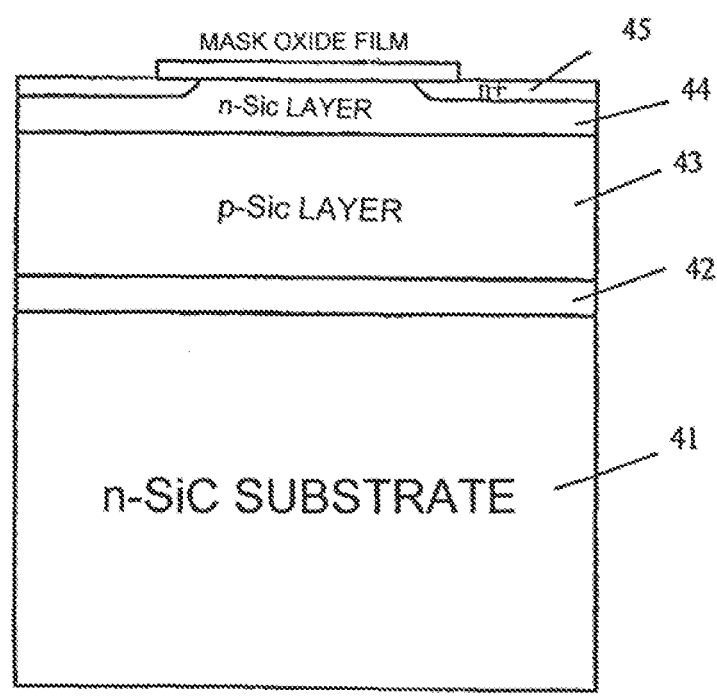
FIG. 21 is a sectional view (Part 2) showing a process of producing a p-channel SiC trench MOSFET according to Embodiment 3 of the invention.
Figure 22:
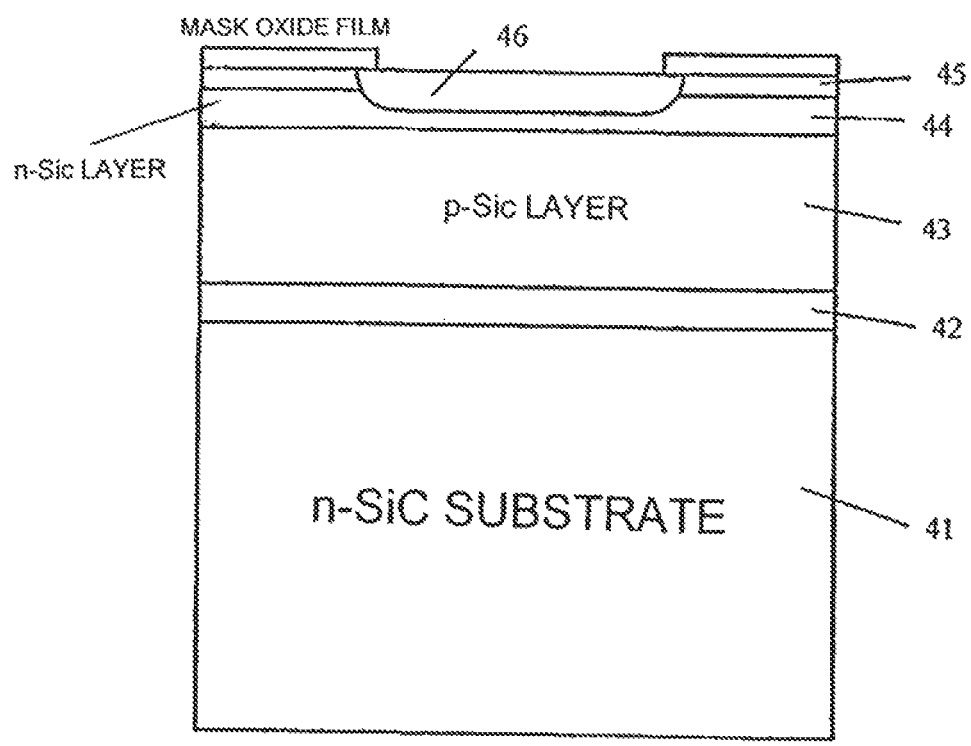
FIG. 22 is a sectional view (Part 3) showing a process of producing a p-channel SiC trench MOSFET according to Embodiment 3 of the invention.

Embodiment 3 of the invention will be described below with reference to FIGS. 20 to 24. Incidentally, in Embodiment 3, an SiC p-channel type trench MOSFET with a withstand voltage of 1200 V is provided as a vertical trench gate MOS power semiconductor device. First, n-type SiC substrate 41 is prepared. In this embodiment, SiC substrate 41 is provided as a high-resistance n-type SiC substrate containing about $2 \times 10^{14}$ cm$^{-3}$ of nitrogen as an impurity. P-type SiC layer 42 containing about $1.0 \times 10^{19}$ cm$^{-3}$ of nitrogen and p-type SiC drift layer 43 containing about $1.0 \times 10^{16}$ cm$^{-3}$ of nitrogen are epitaxially grown on SiC substrate 41 so that the thicknesses of layers 42 and 43 are about 2 µm and 10 µm respectively. N-type SiC base layer 44 containing about $2.1 \times 10^{17}$ cm$^{-3}$ of nitrogen is epitaxially grown on p-type SiC drift layer 43 so that the thickness of layer 44 is 2.5 µm (FIG. 20). N$^+$ contact region 45 (FIG. 21) and p$^+$ source region 46 (FIG. 22) are formed by selective ion implantation and heat treatment, respectively, on a front surface of n-type SiC base layer 44 in the active region in which a main current will flow. N$^+$ contact region 45 uses phosphorus as an impurity whereas p$^+$ source region 46 uses aluminum as an impurity. The temperature and time for the heat treatment are 1700° C. and 1 minute (FIGS. 21 and 22).

Figure 23:
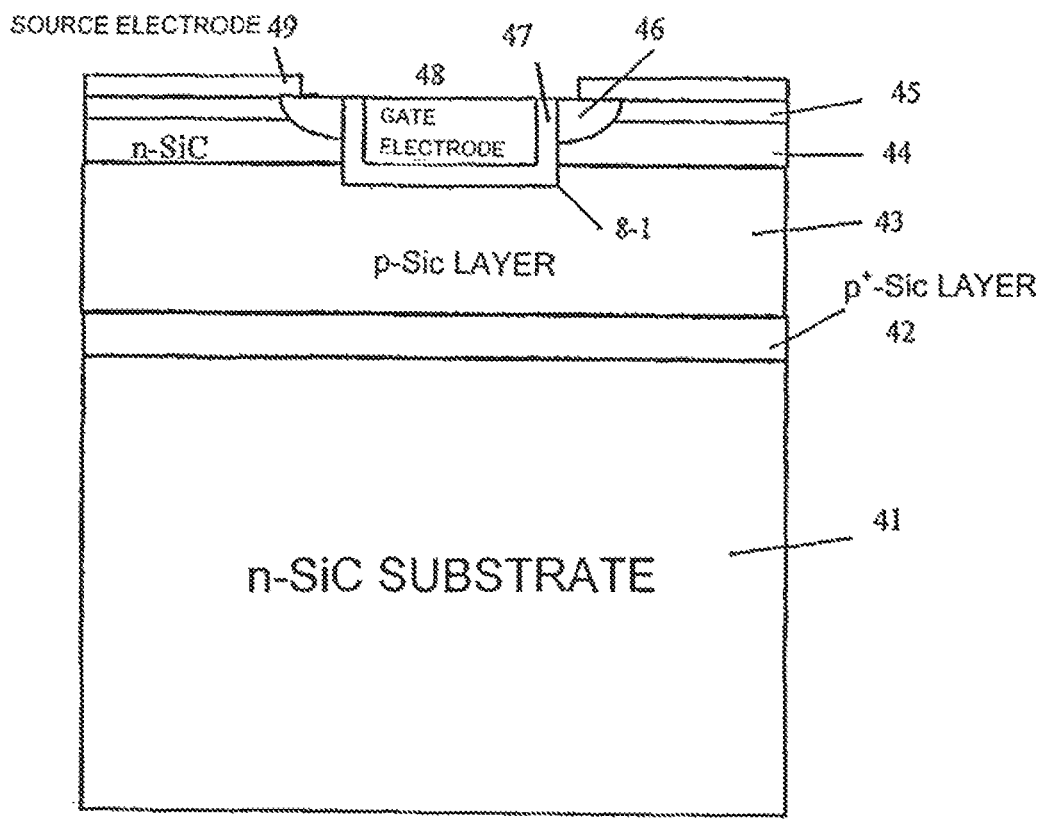
FIG. 23 is a sectional view (Part 4) showing a process of producing a p-channel SiC trench MOSFET according to Embodiment 3 of the invention.

Then, a 1.6 µm-thick silicon oxide film (hereinafter abbreviated to as "oxide film") is grown on the surface of the active region and subjected to photolithography and etching to form an oxide film mask having 1.0 µm-wide openings disposed at intervals of 7.6 µm. After the formation of the oxide film mask, gate trench 8-1 having a depth extending from the front surface to reach p-type SiC drift layer 43 through n-type SiC base layer 44 is formed by trench etching. On this occasion, the depth of the gate trench is set at 3 µm. Then, a sacrificial oxide film is formed in the inside of gate trench 8-1 and then removed to thereby flatten the inner surface of gate trench 8-1. After the growth of a 100 nm-thick gate oxide film 47, gate electrode 48 is embedded in gate trench 8-1 and source electrode 49 is formed through an interlayer insulating film (not shown) with which gate electrode 48 is covered (FIG. 23).

Figure 24:
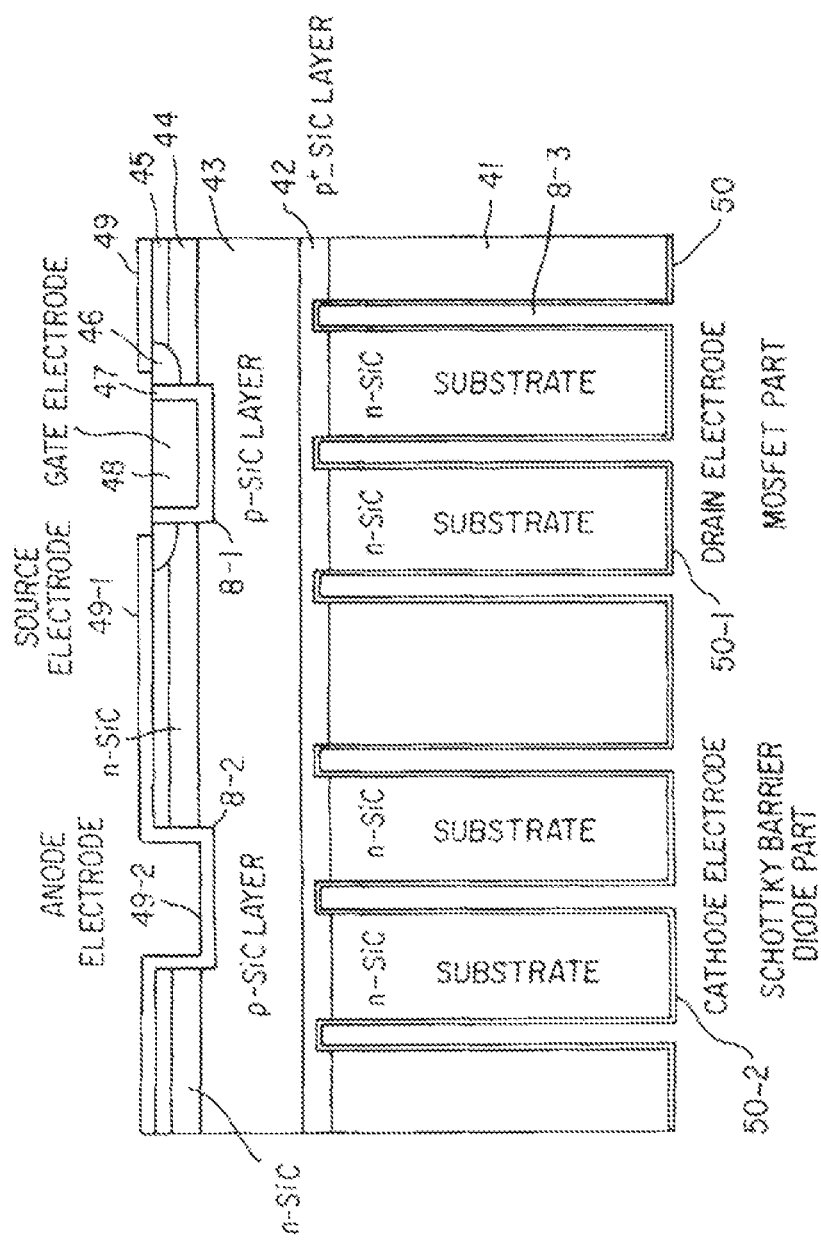
FIG. 24 is a sectional view of the p-channel SiC trench MOSFET according to Embodiment 3 of the invention.

Similarly, an oxide film mask having 1.0 µm-wide openings disposed at intervals of 7.6 µm is formed and then, as shown in FIG. 24, Schottky trench 8-2 is formed in the Schottky barrier diode part in the same manner as described above. The width of Schottky trench 8-2 is set at 1.0 µm and the depth of Schottky trench 8-2 is set at 5 µm which is 2 µm deeper than gate trench 8-1. The distance between gate trench 8-1 and Schottky trench 8-2 is set at d=3.8 µm in terms of distance between respective central lines of the trenches. Then, nickel and titanium are sputtered successively on the inside of Schottky trench 8-2 and the device surface and then aluminum is sputtered thereon to form electrode film 49 which is used in common to source electrode 49-1 and anode electrode 49-2 of a Schottky barrier diode.

Then, the 400 µm-thick n-type SiC substrate 41 is background from its rear surface so that the total thickness becomes 80 µm. Although Embodiment 3 shows the case where back-grinding is used for simplifying a trench etching process as an after-process because n-type SiC substrate 41 is generally as thick as about 400 µm, the back-grinding process may be removed if the SiC substrate is originally sufficiently thin. Then, a 5.0 µm-thick nickel film is formed on the rear surface of n-type SiC substrate 41 and subjected to photolithography and etching to form a mask having 6 µm-wide openings at intervals of 6 µm. Then, trenches 8-3 each having a depth to reach p$^+$ SiC layer 42 through n-type SiC substrate 41 are formed by trench etching using the mask. A Ti/Ni/Au metal film 50 is laminated so that the bottom and side surfaces of each trench 8-3 and the whole rear surface of n-type SiC substrate 41 are covered with Ti/Ni/Au metal film 50. Ti/Ni/Au metal film 50 is formed as an electrode which is used in common to drain electrode 50-1 and cathode electrode 50-2 of the Schottky barrier diode. Thus, the process of producing the wafer of the p-channel type trench MOSFET is completed.

Figure 25:
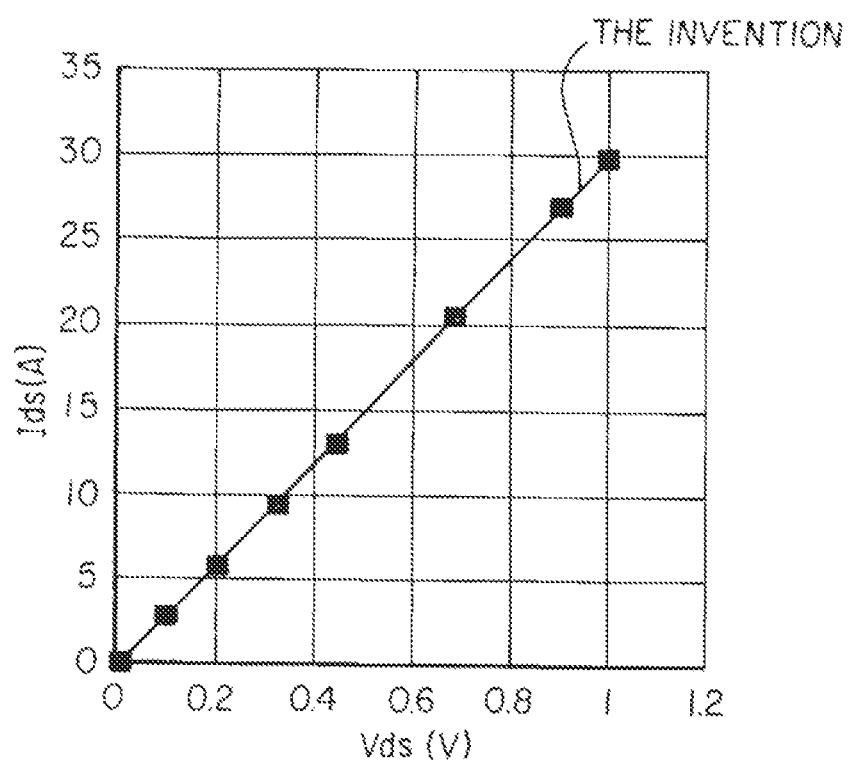
FIG. 25 is an I-V characteristic graph of the p-channel SiC trench MOSFET according to Embodiment 3 of the invention.

FIG. 25 shows a measured result of current-voltage characteristic of the SiC trench MOSFET in an on-state. The chip size is 3 mm square, the active area is 7.85 mm$^2$ and the rating current is 10 A. Although the device withstand voltage and drain current of the p-channel type MOSFET exhibit negative values, the values are written here as absolute values to facilitate understanding. On-resistance (RonA) is 2.50 mΩcm$^2$ which is a sufficiently low value. The initial device withstand voltage is 1250 V (not shown) which is sufficiently good characteristic for the 1200 V device. When a trench MOSFET having no Schottky trench 8-2 was formed for the sake of comparison and the withstand voltage of the trench MOSFET was measured, the device withstand voltage was 610 V. When a point of breakdown of the trench MOSFET was observed, it was confirmed that the breakdown point was in the bottom of gate trench 8-1. It is conceived from this viewpoint that voltage withstanding characteristic can be kept stably because the electric field concentration in the bottom of gate trench 8-1 can be relaxed when a deep trench is formed in the Schottky barrier diode part. When forward and backward I-V characteristics of the built-in Schottky barrier diode were measured, good voltage withstanding characteristic and on-voltage were obtained. For example, the on-voltage of the built-in Schottky barrier diode at 10 A current conduction was 1.58 V (room temperature) which was lower than 1.62 V (room temperature) of the Si PIN diode. When the reverse recovery characteristic of the built-in Schottky barrier diode was measured, the reverse recovery time of the built-in Schottky barrier diode was much shorter than the reverse recovery time of the Si PIN diode having the same rating voltage and current. Consequently, low loss characteristic could be obtained so that the loss incurred in the built-in Schottky barrier diode was about one tenth as large as the loss in the Si PIN diode.

Then, electric characteristics were evaluated while the depth of Schottky trench 8-2 was changed under a common condition that the depth of Schottky trench 8-2 was larger than the thickness of n-type SiC base layer 44. Specifically, trench MOSFET devices of the six types having trench depths of 2.7 µm, 2.85 µm, 3 µm, 4 µm, 5 µm and 5.5 µm were formed and characteristics of the trench MOSFET devices were examined. Incidentally, the distance d between respective central lines of the trenches in the gate electrode part and the Schottky barrier diode part was kept at a constant value of 3.8 µm. Consequently, as shown in Table 9, it was found that the device withstand voltage exhibited 1200 V or higher under the condition that the trench depth was not smaller than 3 µm, inclusive of the aforementioned case where no Schottky trench 8-2 was formed.

TABLE 9

| Trench Depth (µm) | Withstand Voltage (V) |
|---|---|
| 0 | 608 |
| 2.70 | 1081 |
| 2.85 | 1100 |
| 3.00 | 1209 |
| 4.00 | 1230 |
| 5.00 | 1240 |
| 5.50 | 1242 |

That is, it is found that the Schottky trench needs to have a trench depth not smaller than the depth (3 µm) of the gate trench in order to avoid dielectric breakdown caused by the electric field concentration without provision of any electric field relaxing p-type region in the bottom of the trench of the gate electrode. Then, a trench MOSFET in which the distance d (µm) between the trench in the Schottky barrier diode part and the trench in the gate electrode part was changed was produced by way of trial and change of electric characteristic on this occasion was evaluated. On this occasion, the depth of the trench in the Schottky barrier diode part was set at 5 µm and the depth of the trench in the gate electrode part was set at 3 µm. Consequently, as shown in Table 10, it is found that the initial withstand voltage of the device decreases as the trench distance d (µm) increases.

TABLE 10

| Trench Distance d (µm) | Initial Withstand Voltage (V) | Withstand Voltage (V) After High-Temperature Application Test |
|---|---|---|
| 2.0 | 1255 | 1254 |
| 3.0 | 1254 | 1251 |
| 5.0 | 1251 | 1251 |
| 7.0 | 1238 | 1236 |
| 9.0 | 1230 | 1228 |
| 10.0 | 1220 | 1218 |
| 12.0 | 1206 | 30 |
| 15.0 | 1199 | 21 |

TABLE 10-continued

| Trench Distance d (μm) | Initial Withstand Voltage (V) | Withstand Voltage (V) After High-Temperature Application Test |
|---|---|---|
| 19.0 | 1181 | 20 |
| 21.0 | 1180 | 20 |

This is because as the trench distance d (μm) becomes longer, a so-called pinch-off effect of a depletion layer is weakened so that the electric field concentration in the bottom of the gate trench increases when a high voltage is applied between the source and the drain. Similarly to the result shown in Table 9, electric field intensity in the bottom of the gate electrode increases so that dielectric breakdown of the gate oxide film occurs easily. Devices produced under the condition that the withstand voltage was 1200 V or higher were subjected to a high-temperature application test. This evaluation is a long-term reliability evaluation in which the withstand voltage of the device is evaluated after a voltage of 1200 V is continuously applied between the source and the drain for 3000 hours under the condition of 125° C. Consequently, under the condition that the trench distance d (μm) was 12 μm or 15 μm, the initial withstand voltage was 1200 V or higher but the withstand voltage after the high-temperature application test was considerably lower than 1200 V. When a point of breakdown of the device was examined, it was confirmed that the oxide film in the bottom of gate trench 8-1 was broken down. It is found from this respect that sufficient voltage withstanding characteristic can be kept in consideration of not only initial withstand voltage but also long-term reliability if the trench distance d (μm) is not larger than 10 μm. Incidentally, when the experiment having the result shown in Table 6 was applied to a trench MOSFET having the same configuration except n-type SiC substrate 41 was replaced by a substrate containing a higher concentration of about $2 \times 10^{18}$ cm$^{-3}$, it was found that the MOSFET was provided as a p-channel type MOSFET having almost the same electric characteristic as the aforementioned characteristic. When the same experiment was applied to a GaN wafer having GaN layers epitaxially grown on an n-type GaN substrate used in place of n-type SiC substrate 41, it was confirmed that the GaN wafer exhibited the same characteristic as that of the SiC p-channel type MOSFET. Incidentally, in the aforementioned SiC p-channel type MOSFET, an n-type region effective in improving avalanche breakdown tolerance may be preferably provided in the bottom of the Schottky trench. An SiC n-channel trench MOSFET described in Embodiment 1 without any third trench formed from the rear surface of the SiC substrate may be provided as an SiC p-channel type MOSFET.

Embodiment 4

Embodiment 4 is described on an SiC p-channel trench MOSFET (not shown) with a withstand voltage of 1200 V in the case where a p-type SiC substrate is used in place of n-type SiC substrate 41 in Embodiment 3 as a semiconductor substrate. Embodiment 4 is the same as Embodiment 3 except the polarity and specific resistance of the semiconductor substrate. First, a p-type SiC substrate doped with aluminum is prepared. In this embodiment, a p-type SiC substrate containing an impurity concentration of about $2 \times 10^{18}$ cm$^{-3}$ is used. The specific resistance is 7 Ωcm which is considerably lower than that of the high-resistance n-type SiC substrate containing about $2 \times 10^{14}$ cm$^{-3}$ of nitrogen as an impurity used in Embodiment 3. The device producing process after that is the same as in Embodiment 3. Embodiment 4 will be described without reference to the drawings. The chip size is 3 mm square, the active area is 7.85 mm$^2$ and the rating current is 10 A. On-resistance (RonA) is 2.59 mΩcm$^2$ which is a sufficiently low value. The initial device withstand voltage is 1258 V which is sufficiently good characteristic for the 1200 V device. When forward and backward I-V characteristics of the built-in Schottky barrier diode were measured, good voltage withstanding characteristic and on-voltage were obtained. For example, the on-voltage of the built-in Schottky barrier diode at 10 A current conduction was 1.58 V (room temperature) which was lower than 1.62 V (room temperature) of the Si PIN diode. When the reverse recovery characteristic of the built-in Schottky barrier diode was measured, the reverse recovery time of the built-in Schottky barrier diode was extremely shorter than the reverse recovery time of the Si PIN diode having the same rating voltage and current. Consequently, low loss characteristic was obtained so that the loss incurred in the built-in Schottky barrier diode was about one tenth as large as the loss in the Si PIN diode. This characteristic is the same as that in Embodiment 3. A high-temperature application test was further performed in the same manner as in Embodiment 3. Consequently, the withstand voltage was not changed even when a voltage of 1200 V was continuously applied between the source and the drain for 3000 hours under the condition of 125° C. It was found that sufficient voltage withstanding characteristic can be kept in consideration of not only initial withstand voltage but also long-term reliability.

According to Embodiments 3 and 4 as described above, a high withstand voltage p-channel type MOSFET using a wide band gap semiconductor material such as SiC or GaN can include a built-in Schottky barrier diode and good electric characteristic and long-term reliability characteristic can be obtained without provision of any gate oxide film protecting p-type region in the bottom of the gate trench. Consequently, the size and loss of the semiconductor device can be reduced more greatly. In addition, an n-channel type MOSFET and a complementary MOSFET module can be formed.

Embodiment 5

Figure 26:
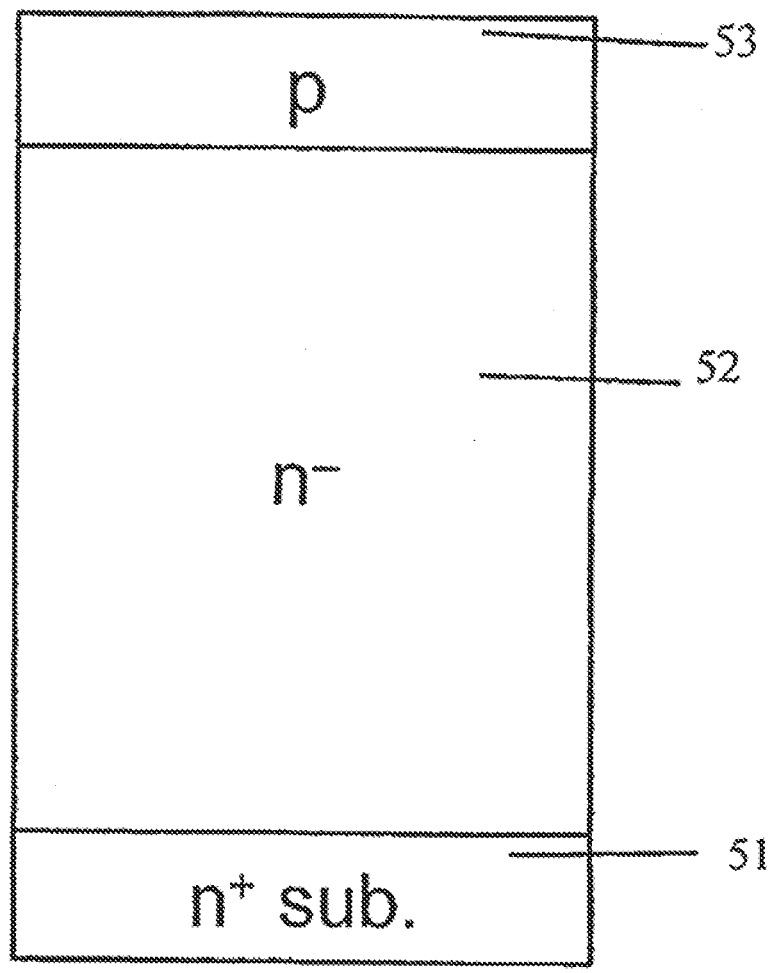
FIG. 26 is a sectional view (Part 1) showing a process of producing an SiC trench MOSFET according to Embodiment 5 of the invention.
Figure 27:
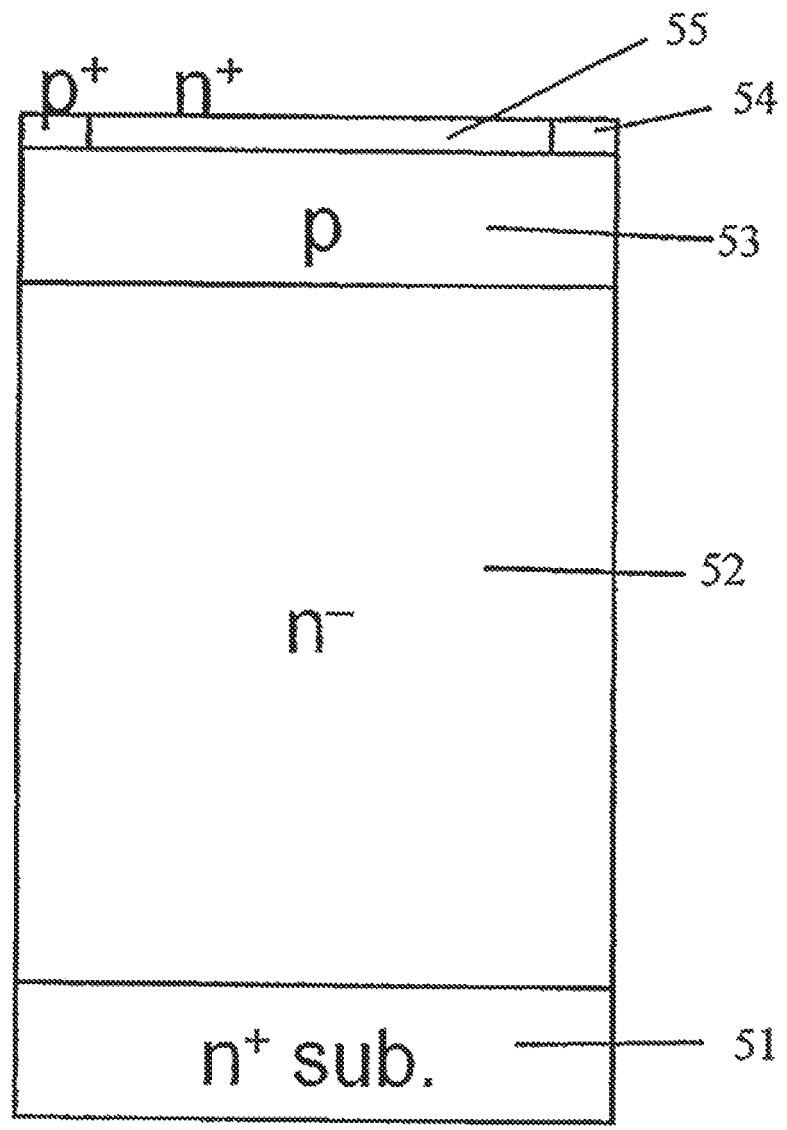
FIG. 27 is a sectional view (Part 2) showing a process of producing an SiC trench MOSFET according to Embodiment 5 of the invention.

Embodiment 5 of the invention will be described below with reference to FIGS. 26 to 30. Incidentally, in Embodiment 5, an SiC trench MOSFET with a withstand voltage of 1200 V is provided as a vertical trench gate MOS power semiconductor device. First, an n-type SiC substrate 51 having a sufficiently high concentration is prepared. In this embodiment, an SiC substrate containing about $2 \times 10^{18}$ cm$^{-3}$ of nitrogen as an impurity is prepared. N-type SiC drift layer 52 containing about $1.0 \times 10^{16}$ cm$^{-3}$ of nitrogen and p-type SiC base layer 53 containing about $2.1 \times 10^{17}$ cm$^{-3}$ of aluminum are epitaxially grown on a principal surface of n-type SiC substrate 51 so that the thicknesses of layers 52 and 53 are about 10 μm and 2.5 μm respectively (FIG. 26). P$^+$ contact region 54 and n$^+$ source region 55 are formed by ion implantation and heat treatment in the active region in which a main current will flow. P$^+$ contact region 54 uses aluminum as an impurity whereas n$^+$ source region 55 uses phosphorus as an impurity. The temperature and time for the heat treatment are 1700° C. and 1 minute (FIG. 27).

Figure 28:
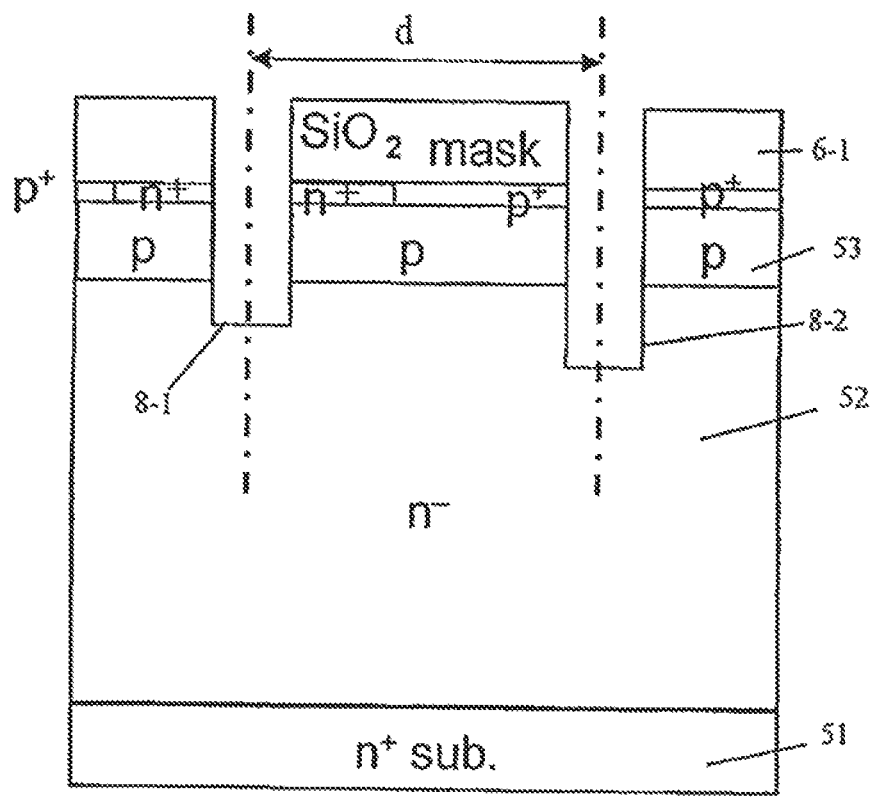
FIG. 28 is a sectional view (Part 3) showing a process of producing an SiC trench MOSFET according to Embodiment 5 of the invention.
Figure 29:
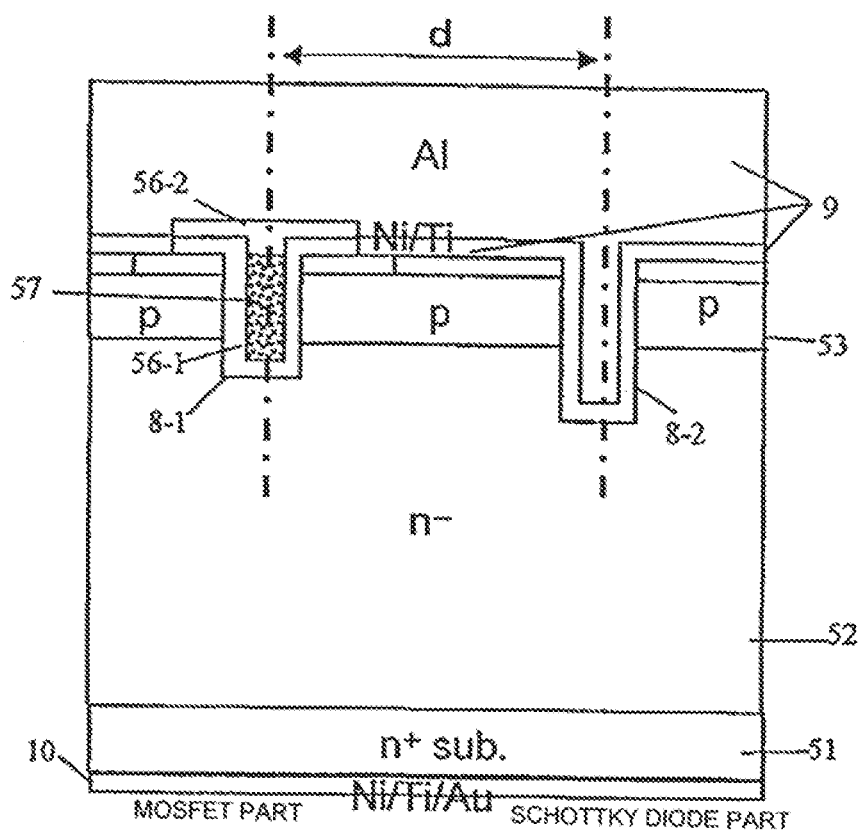
FIG. 29 is a sectional view of the SiC trench MOSFET according to Embodiment 5 of the invention.

Then, as shown in FIG. 28, a 1.6 μm-thick silicon oxide film (hereinafter abbreviated to as "oxide film") 6-1 is grown on a front surface of p-type SiC base layer 53 and subjected to photolithography and etching to form an oxide film mask having a width of 1.0 μm at intervals of 7.6 μm. After the formation of the oxide film mask, gate trench 8-1 having a depth to reach n-type SiC drift layer 52 through p-type SiC base layer 53 is formed by trench etching. On this occasion, the thickness of gate trench 8-1 is set at 3 μm. Then, as shown in FIG. 29, a sacrificial oxide film is formed in the inside of gate trench 8-1 and then removed to thereby flatten the inner surface of gate trench 8-1. In the gate electrode part, after the growth of a 100 nm-thick gate oxide film 56-1, gate electrode 57 is embedded in gate trench 8-1 and interlayer insulating film 56-2 is formed.

In the Schottky barrier diode part, Schottky trench 8-2 is formed in the same manner as described above. On this occasion, the width of Schottky trench 8-2 is set at 1.0 μm and the depth of Schottky trench 8-2 is set at 5 μm which is 2 μm deeper than gate trench 8-1. The distance between gate trench 8-1 and Schottky trench 8-2 is set at d=3.8 μm in terms of distance between respective central lines of the trenches. Then, nickel and titanium are sputtered successively on the inside of Schottky trench 8-2 and the device surface and then aluminum is sputtered thereon to form an electrode which is used in common to source electrode 9 and an anode electrode of a built-in Schottky barrier diode. Then, drain electrode 10 made of a laminated film of titanium, nickel and gold is formed on the rear surface of n⁺ SiC substrate 51. Thus, the process of producing the wafer of the trench MOSFET is completed.

Figure 30:
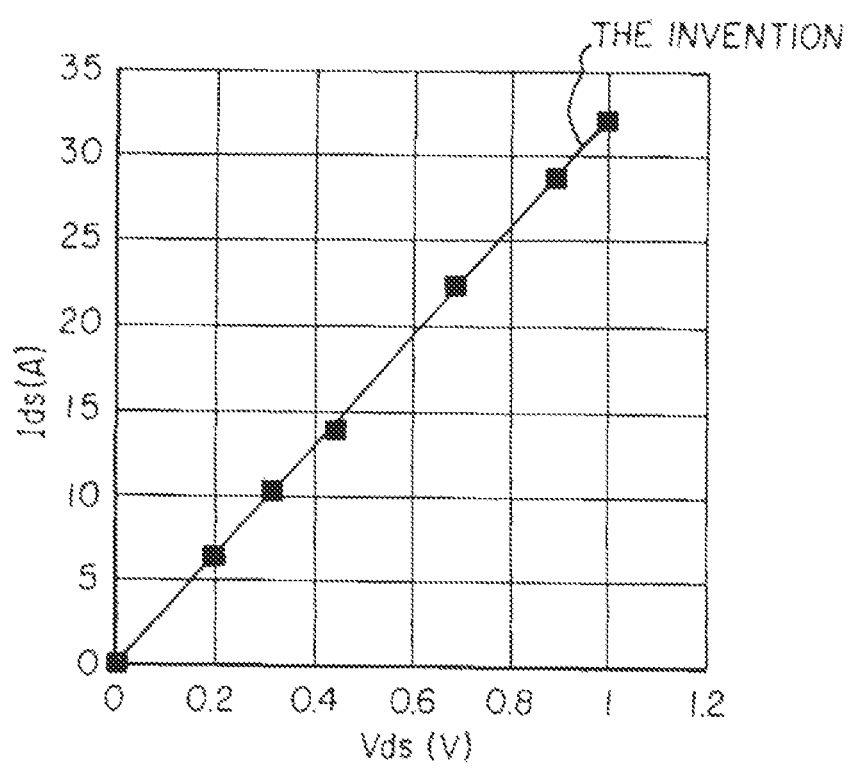
FIG. 30 is an I-V characteristic graph of the SiC trench MOSFET according to Embodiment 5 of the invention.

FIG. 30 shows a measured result (current-voltage characteristic in an on-state) of electric characteristic of the SiC trench MOSFET. The chip size is 3 mm square, the active area is 7.85 mm² and the rating current is 10 A. On-resistance (RonA) is 2.50 mΩcm² which is a sufficiently low value. The initial device withstand voltage is 1250 V which is sufficiently good characteristic for the 1200 V device (voltage withstanding characteristic is not shown). When a conventional art-type trench MOSFET having no Schottky trench 8-2 was formed for the sake of comparison and the withstand voltage of the trench MOSFET was measured, the device withstand voltage was 610 V. When a point of breakdown of the trench MOSFET was observed, it was confirmed that the breakdown point was in the bottom of the gate trench. It is concluded from this that voltage withstanding characteristic can be kept stably because the electric field concentration can be relaxed without formation of any electric field relaxing p-type region in the bottom of the trench gate electrode when Schottky trench 8-2 deeper than gate trench 8-1 is formed in the Schottky barrier diode part. When I-V characteristics of the built-in Schottky barrier diode were measured, good characteristics were obtained. For example, the on-voltage of the built-in Schottky barrier diode at 10 A current conduction was 1.55 V (room temperature) (not shown) which was lower than 1.62 V (room temperature) of the Si PIN diode. When the reverse recovery characteristic of the built-in Schottky barrier diode was measured, the reverse recovery time of the built-in Schottky barrier diode was extremely shorter than the reverse recovery time of the Si PIN diode having the same rating voltage and current. Consequently, low loss characteristic was obtained so that the loss incurred in the built-in Schottky barrier diode was about one tenth as large as the loss in the Si PIN diode.

Then, electric characteristics were evaluated while the depth of Schottky trench 8-2 was changed under a common condition that the depth of Schottky trench 8-2 was larger than the thickness (2.5 μm) of p-type SiC base layer 53. Specifically, devices of the six types having trench depths of 2.7 μm, 2.85 μm, 3 μm, 4 μm, 5 μm and 5.5 μm were formed and characteristics of the devices were examined. Incidentally, the distance d (μm) between the trenches in the gate electrode part and the Schottky barrier diode part was kept at a constant value of 3.8 μm. Consequently, it was found that the device withstand voltage exhibited 1200 V or higher under the condition that the trench depth was not smaller than 3 μm, inclusive of the case where no trench was formed in the Schottky barrier diode part (Table 11).

TABLE 11

| Trench Depth (μm) | Withstand Voltage (V) |
|---|---|
| 0 | 602 |
| 2.70 | 1080 |
| 2.85 | 1100 |
| 3.00 | 1201 |
| 4.00 | 1230 |
| 5.00 | 1240 |
| 5.50 | 1250 |

That is, it is found that the Schottky trench needs to have a trench depth not smaller than the depth of the gate trench in order to avoid dielectric breakdown caused by the electric field concentration without provision of any electric field relaxing p-type region in the bottom of the trench of the gate electrode. Then, a trench MOSFET in which the distance d (μm) between the trench in the Schottky barrier diode part and the trench in the gate electrode part was changed was produced by way of trial and change of electric characteristic on this occasion was evaluated. On this occasion, the depth of Schottky trench 8-2 was set at 5 μm and the depth of gate trench 8-1 was set at 3 μm. Consequently, as shown in Table 12, it is found that the initial withstand voltage of the device decreases as the trench distance d (μm) increases.

TABLE 12

| Trench Distance d (μm) | Initial Withstand Voltage (V) | Withstand Voltage (V) After High-Temperature Application Test |
|---|---|---|
| 2.0 | 1251 | 1248 |
| 3.0 | 1246 | 1242 |
| 5.0 | 1242 | 1238 |
| 7.0 | 1236 | 1230 |
| 9.0 | 1228 | 1220 |
| 10.0 | 1215 | 1211 |
| 12.0 | 1201 | 29 |
| 15.0 | 1200 | 21 |
| 19.0 | 1182 | 20 |
| 21.0 | 1176 | 18 |

This is conceivable because as the trench distance d (μm) becomes longer, a so-called pinch-off effect of a depletion layer is weakened so that the electric field concentration in the bottom of the gate trench increases when a high voltage is applied between the source and the drain. Similarly to the result shown in Table 11, it is conceived that electric field intensity in the bottom of the gate electrode increases to thereby result in occurrence of dielectric breakdown of the gate oxide film. Devices having the withstand voltage of 1200 V or higher were subjected to a high-temperature application test. This evaluation is a long-term reliability evaluation in which the withstand voltage of the device is evaluated after a voltage of 1200 V is continuously applied between the source and the drain for 3000 hours under the condition of joint temperature 125° C. Consequently, under the condition that the trench distance d (μm) was 12 μm or 15 μm, the initial withstand voltage was 1200 V or higher but the withstand voltage after the high-temperature application test was considerably lower than 1200 V. When a point of breakdown of the device was examined, it was confirmed that the oxide film in the bottom of the gate trench was broken down. It is found from this respect that sufficient voltage withstanding characteristic can be kept in consideration of not only initial withstand voltage but also long-term reliability if the trench distance d (μm) is not larger than 10 μm. Incidentally, this test was applied also to a trench MOSFET produced by way of trial by using gallium nitride (GaN) as a wide band gap semiconductor material. Consequently, it was confirmed that the same voltage withstanding characteristic and long-term reliability characteristic as those of SiC were obtained.

Embodiment 6

Figure 31:
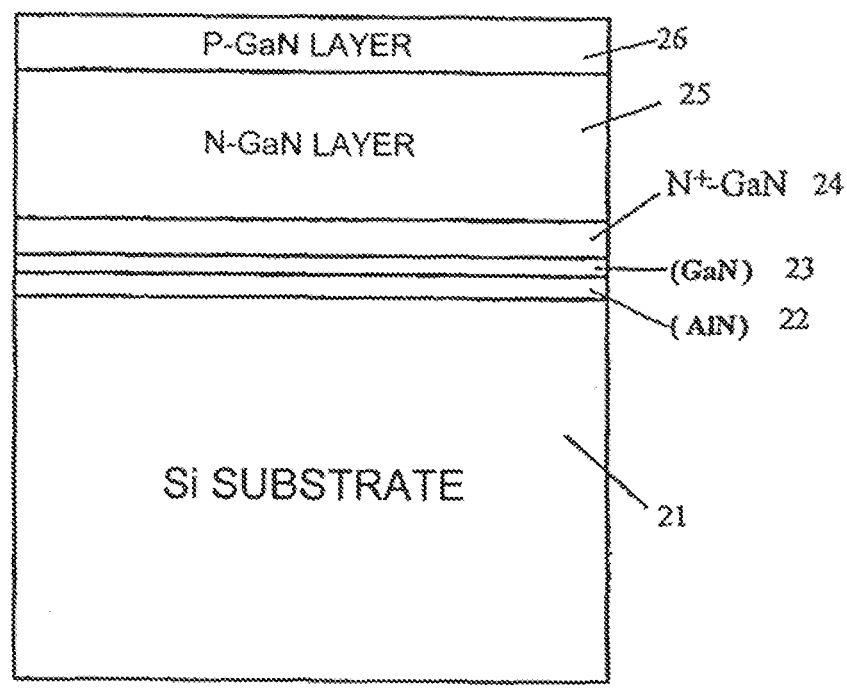
FIG. 31 is a sectional view (Part 1) showing a process of producing a GaN trench MOSFET according to Embodiment 6 of the invention.

Embodiment 6 of the invention will be described with reference to FIGS. 31 to 35. In Embodiment 6, a GaN trench MOSFET with a withstand voltage of 600 V is used as a vertical trench gate MOS power semiconductor device. The point of difference from the GaN trench MOSFET according to Embodiment 5 is that Si substrate 21 is used as the substrate. First, as shown in FIG. 31, a substrate having a (111) face as a principal surface is prepared as Si substrate 21 so that AlN layer 22 and non-doped GaN layer 23 are formed on Si substrate 21 by a metal organic chemical vapor deposition method (MOCVD) which is a commonly known technique. Because the grating constant of the Si (111) face is 0.3840 nm and the grating constant of GaN is 0.3819 nm which is relatively near the grating constant of the Si (111) face, the Si (111) face is selected as a principal surface. Si substrate 21 has a diameter of 200 mm and a thickness of 500 μm. AlN layer 22 and non-doped GaN layer 23 formed on Si substrate 21 are 15 nm and 200 nm thick, respectively. AlN layer 22 and GaN layer 23 are formed as layers for converting the crystal structure and improving the crystal quality, respectively. A 3 μm-thick n$^+$-type GaN layer 24 and a 6 μm-thick n-type GaN drift layer 25 are epitaxially grown successively on GaN layer 23. The impurity concentrations of GaN layer 24 and GaN drift layer 25 are $5 \times 10^{19}$ cm$^{-3}$ and $2 \times 10^{16}$ cm$^{-3}$, respectively. On this occasion, trimethyl gallium is used as a gallium material and ammonia gas is used as a nitrogen material. Monosilane is used as a dopant material for forming an n-type semiconductor. A 2.5 μm-thick p-type GaN base layer 26 is epitaxially grown on n-type GaN drift layer 25. The impurity concentration of base layer 26 is $2 \times 10^{17}$ cm$^{-3}$ and magnesium is used as a dopant material. In this manner, a basic laminated structure is completed as shown in FIG. 31.

Figure 32:
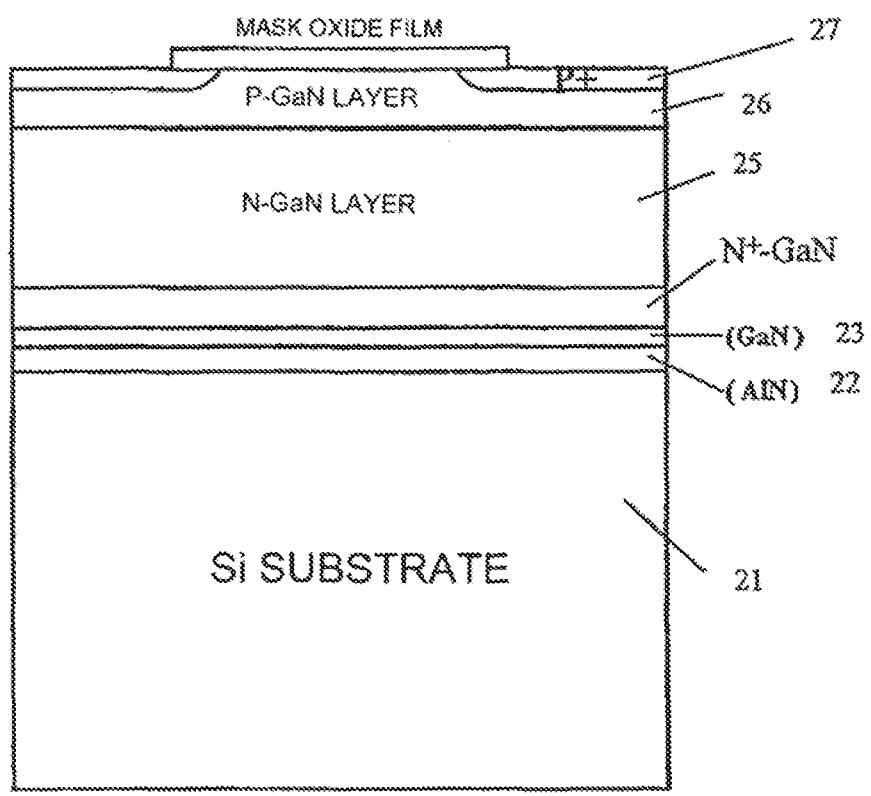
FIG. 32 is a sectional view (Part 2) showing a process of producing a GaN trench MOSFET according to Embodiment 6 of the invention.
Figure 33:
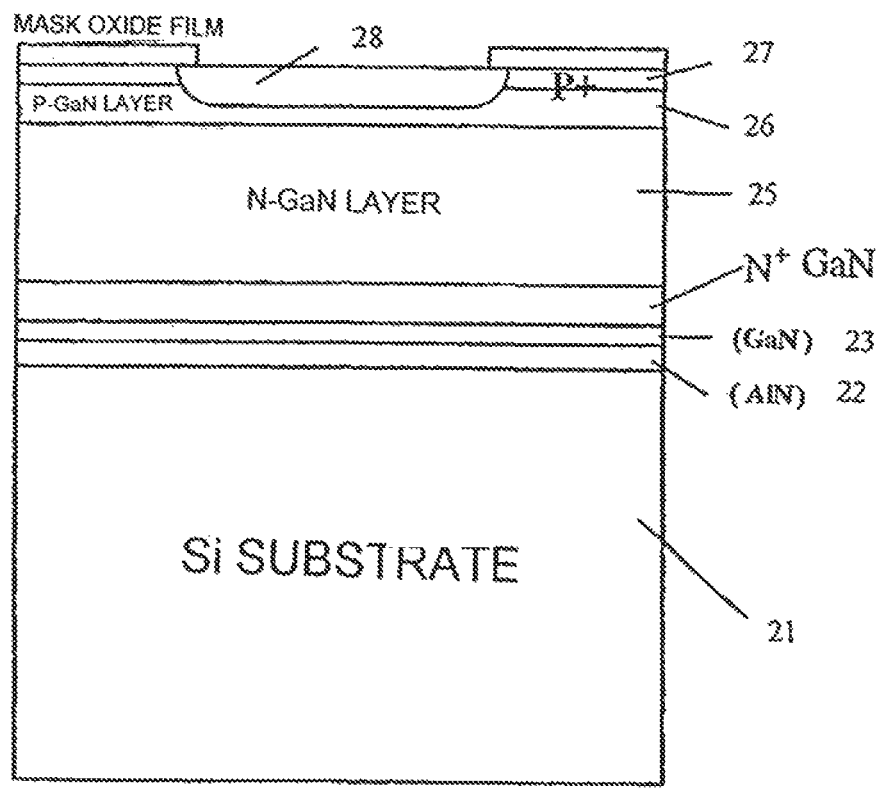
FIG. 33 is a sectional view (Part 3) showing a process of producing a GaN trench MOSFET according to Embodiment 6 of the invention.
Figure 34:
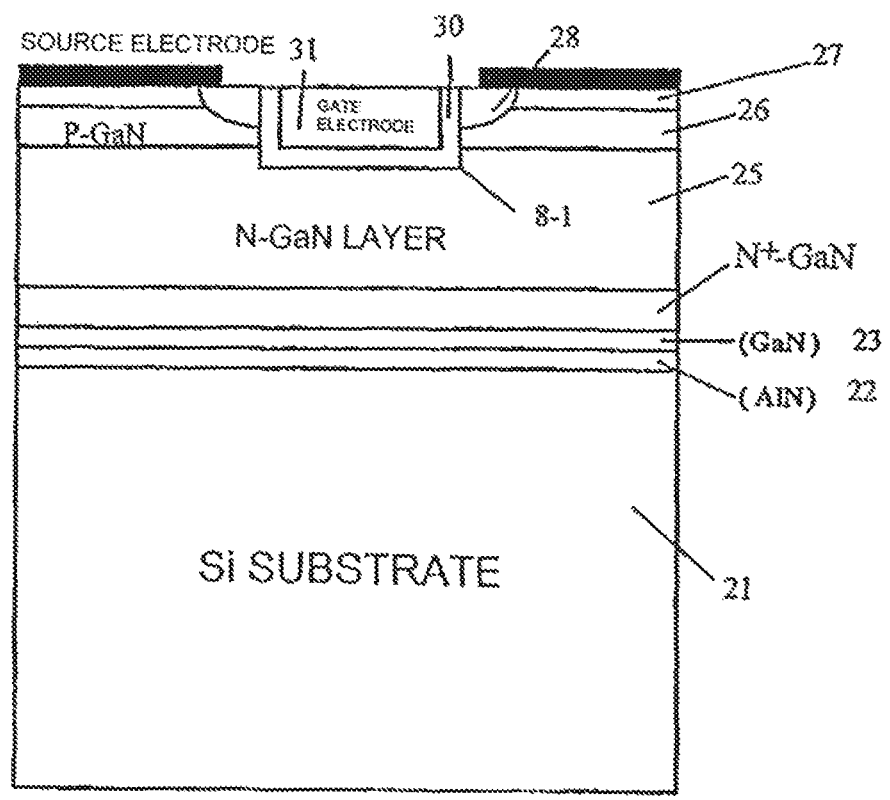
FIG. 34 is a sectional view (Part 4) showing a process of producing a GaN trench MOSFET according to Embodiment 6 of the invention.

Then, a silicon oxide film (SiO$_2$ film) is formed on a surface of p-type GaN base layer 26 and patterned and then p$^+$ GaN contact region 27 is formed (FIG. 32). The ion implantation condition for forming p+GaN contact region 27 is a magnesium acceleration voltage of 45 keV and an impurity concentration of $3 \times 10^{18}$ cm$^{-3}$. Then, the mask oxide film SiO$_2$ is removed. An SiO$_2$ film is selectively formed again and then n$^+$ GaN source region 28 is formed (FIG. 33). N$^+$ GaN source region 28 is formed by ion implantation using silicon and aluminum as impurities. On this occasion, the impurity concentration is $3 \times 10^{18}$ cm$^{-3}$. Then, as shown in FIG. 34, gate trench 8-1 having a depth of 3 μm extending from the front surface is formed and then a 100 nm-thick gate oxide film 30 is formed. Then, low-resistance polysilicon doped with an impurity is embedded in gate trench 8-1 to form gate electrode 31.

Figure 35:
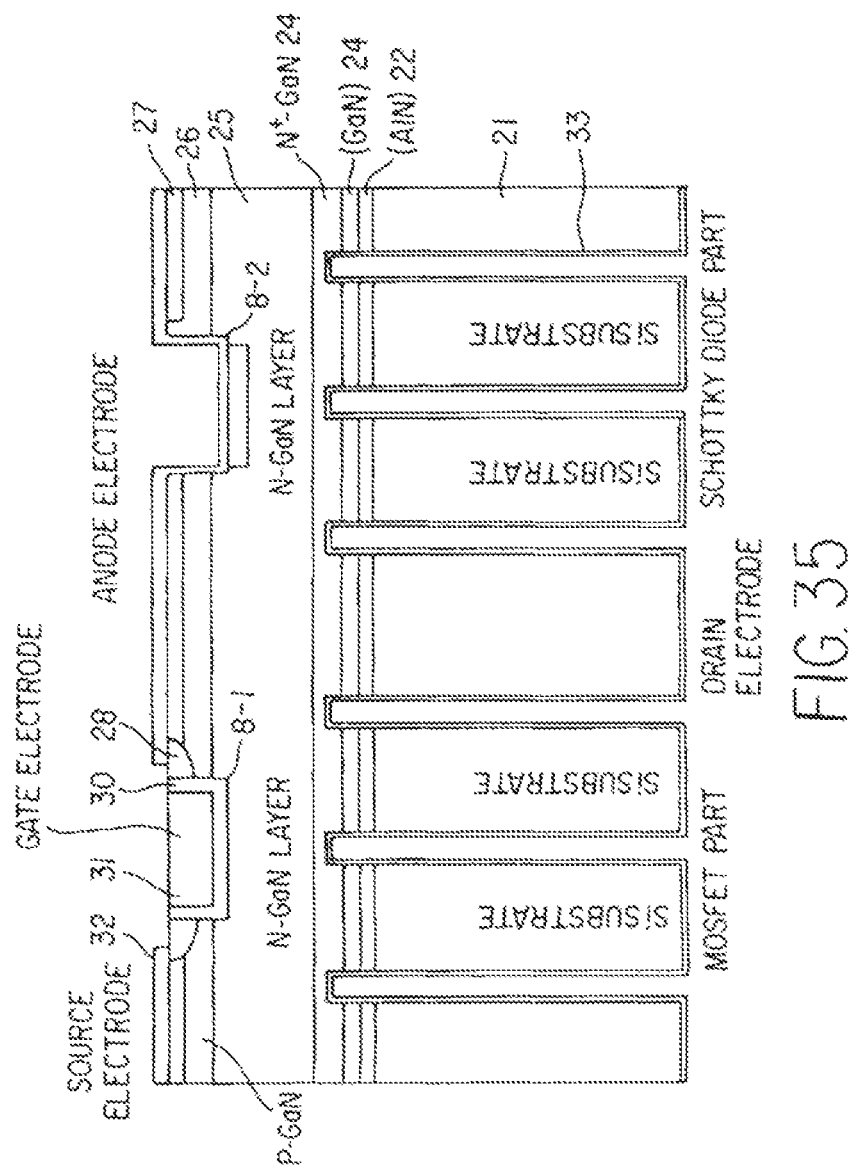
FIG. 35 is a sectional view of the GaN trench MOSFET according to Embodiment 6 of the invention.

In the Schottky barrier diode part, as shown in FIG. 35, Schottky trench 8-2 is formed in the same manner as described above. On this occasion, the trench width of Schottky trench 8-2 is set at 1.0 μm and the depth of Schottky trench 8-2 is set at 5 μm which is 2 μm deeper than the gate electrode portion. The distance between gate trench 8-1 and Schottky trench 8-2 is set at d=3.8 μm in terms of distance between central lines of trenches 8-1 and 8-2. Then, nickel and titanium are sputtered and aluminum is further sputtered to form ohmic contact with principal surfaces of n$^+$ GaN source region 28 and p$^+$ GaN contact region 27 and Schottky contact with the surface of n-type GaN drift layer 25 exposed in the bottom of the Schottky trench.

Then, Si substrate 21 which is 500 μm thick is back-ground from its rear surface so that the total thickness becomes 80 μm. Although Embodiment 6 shows the case where back-grinding is used for simplifying a trench etching process as an after-process because the Si substrate is generally as thick as about 500 μm, the back-grinding process may be dispensed with if the substrate is originally sufficiently thin. Then, a 1.6 μm-thick oxide film is grown on the rear surface of Si substrate 21 and subjected to photolithography and etching to form an oxide film mask having a width of 6 μm at intervals of 6 μm. Then, drain trenches 8-4 are formed by etching. On this occasion, each drain trench is formed to have a depth to reach n$^+$ GaN layer 24, so that high-concentration n$^+$ GaN layer 24 appears in the bottom of drain trench 8-4. Then, a Ti/Ni/Au metal film is formed by lamination so that the bottom and side surfaces of each drain trench 8-4 and the whole rear surface of Si substrate 21 are covered with the Ti/Ni/Au metal film. In this manner, drain electrodes 33 are formed (FIG. 35).

The voltage withstanding characteristic and I-V characteristic of the MOSFET produced according to Embodiment 6 as described above were measured in the same manner as in Embodiment 5. It was found that the device withstand voltage was 670 V which exhibited sufficient device characteristic for the 600 V withstand voltage device. The chip size of the device used in this measurement was 5 mm×5 mm and the rating current of the device was 50 A (active area: 0.2 cm$^2$, current density: 250.0 A/cm$^2$). The GaN trench MOSFET according to Embodiment 6 exhibited RonA=1.2 mΩcm$^2$ and on-voltage of 0.3 V which was sufficiently lower than that of an Si IGBT or an Si MOSFET. In addition, low loss characteristic was exhibited so that the loss measured as reverse recovery characteristic at 50 A current conduction in the same manner as in Embodiment 5 was about one tenth as much as that of the Si PIN diode.

Then, devices of the six types having trench depths of 2.7 μm, 2.85 μm, 3 μm, 4 μm, 5 μm and 5.5 μm in the Schottky barrier diode part larger than the thickness of p-type layer 3 were formed and characteristics of the devices were examined in the same manner as in Embodiment 5. Incidentally, the distance d (μm) between the trenches in the gate electrode part and the Schottky barrier diode part was kept at a constant value of 3.8 μm. Consequently, it was found that the device withstand voltage exhibited 600 V or higher under the condition that the trench depth was not smaller than 3 μm, inclusive of the case where no trench was formed in the Schottky barrier diode part (Table 13).

TABLE 13

| Trench Depth (μm) | Withstand Voltage (V) |
|---|---|
| 0 | 330 |
| 2.70 | 504 |
| 2.85 | 525 |
| 3.00 | 615 |
| 4.00 | 633 |
| 5.00 | 670 |
| 5.50 | 688 |

That is, it is found that the Schottky trench needs to have a trench depth not smaller than the depth of the gate trench in order to avoid dielectric breakdown caused by the electric field concentration without provision of any electric field relaxing p-type region in the bottom of the trench of the gate electrode. Further, a trench MOSFET in which the distance d (μm) between the trench in the Schottky barrier diode part and the trench in the gate electrode part was changed was produced by way of trial and change of electric characteristic on this occasion was evaluated. On this occasion, the depth of the trench in the Schottky barrier diode part was set at 5 μm and the depth of the trench in the gate electrode part was set at 3 μm. Consequently, it is found that the withstand voltage and on-resistance of the device deteriorate as the trench distance d (μm) increases (Table 14).

TABLE 14

| Trench Distance d (μm) | Initial Withstand Voltage (V) | Withstand Voltage (V) After High-Temperature Application Test |
|---|---|---|
| 2.0 | 685 | 688 |
| 3.0 | 677 | 669 |
| 5.0 | 670 | 674 |
| 7.0 | 658 | 660 |
| 9.0 | 644 | 640 |
| 10.0 | 635 | 622 |
| 12.0 | 625 | 40 |
| 15.0 | 600 | 25 |
| 19.0 | 568 | 18 |
| 21.0 | 540 | 18 |

This is because electric field intensity applied on the bottom of the gate trench increases as the trench distance d (μm) increases as described above. For this reason, electric field intensity on the bottom of the gate electrode increases to thereby result in occurrence of dielectric breakdown of the gate oxide film, similarly to the result shown in Table 13. Devices produced under the condition that the withstand voltage was 600 V or higher were subjected to a high-temperature application test. This evaluation was performed in the condition that the withstand voltage of the device was evaluated after a voltage of 600 V was continuously applied between the source and the drain for 3000 hours at 125° C. Consequently, under the condition that the trench distance d (μm) was 12 μm or 15 μm, the initial withstand voltage was 600 V or higher but the withstand voltage after the high-temperature application test was greatly lower than 600 V. When a point of breakdown of the device was examined, it was confirmed that the oxide film in the bottom of the gate trench was broken down. It was found from this respect that sufficient voltage withstanding characteristic could be kept in consideration of not only initial withstand voltage but also long-term reliability if the trench distance d (μm) was not larger than 10 μm.

It can be said that Embodiment 6 has the same configuration as Embodiment 2 except that no p-type region 301 is provided in the bottom of the Schottky trench in the GaN trench MOSFET with a withstand voltage of 600 V described in Embodiment 2. The trench MOSFET in this configuration can include a built-in Schottky barrier diode and good electric characteristic and long-term reliability characteristic can be exhibited without provision of any gate oxide film protecting p-type region in the bottom of the gate trench. Consequently, the size and loss of the semiconductor device can be reduced more greatly.

Thus, a wide band gap semiconductor device and method for producing the same has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

This application is based on and claims priority to Japanese Patent Application 2008-107405, filed on Apr. 17, 2008. The disclosure of the priority application in its entirety, including the drawings, claims, and the specification thereof, is incorporated herein by reference.

What is claimed is:

1. A wide band gap semiconductor device comprising:
a silicon carbide semiconductor substrate;
a second conductivity type silicon carbide semiconductor layer having a high impurity concentration and disposed on one principal surface of the semiconductor substrate;
a second conductivity type silicon carbide drift layer having a low impurity concentration and disposed on the second conductivity type silicon carbide semiconductor layer;
a first conductivity type silicon carbide base layer disposed on the drift layer;
a second conductivity type silicon carbide source region selectively disposed on a principal surface of the base layer;
a first trench having a depth extending from a principal surface of the source region to reach the drift layer;
a gate insulating film lining the first trench;
a control electrode which is filled in the first trench, inside the gate insulating film, so as to be located in a position facing the source region, the base layer and the drift layer;
a second trench provided near the first trench and having a depth extending from the principal surface of the base layer to reach the drift layer so as to be deeper than the first trench;
a first main electrode which is disposed in the second trench to form a Schottky junction between the first main electrode and a surface of the drift layer located in the second trench so that the first main electrode covers the principal surface of the source region and the principal surface of the base layer in common;
third trenches each of which has a depth extending from the other principal surface of the silicon carbide semiconductor substrate to reach the second conductivity type silicon carbide semiconductor layer having the high impurity concentration; and
a second main electrode which is electrically connected to inner surfaces of the third trenches and the other principal surface of the silicon carbide semiconductor substrate.

2. A wide band gap semiconductor device according to claim 1, further comprising a first conductivity type region being in contact with a bottom of the second trench.

3. A wide band gap semiconductor device according to claim 1, wherein the distance between central lines of the first and second trenches is not longer than 10 μm.

4. A method of producing a wide band gap semiconductor device as defined in claim 1, comprising the steps of:
grinding the other principal surface of the semiconductor substrate to provide the semiconductor substrate as a thin layer before forming the second main electrode;
forming the third trenches on the other principal surface of the ground semiconductor substrate; and
forming the second main electrode.

* * * * *